US009953695B2

(12) United States Patent
Ikeda et al.

(10) Patent No.: US 9,953,695 B2
(45) Date of Patent: Apr. 24, 2018

(54) SEMICONDUCTOR DEVICE, ELECTRONIC DEVICE, AND SEMICONDUCTOR WAFER

(71) Applicant: SEMICONDUCTOR ENERGY LABORATORY CO., LTD., Atsugi-shi, Kanagawa-ken (JP)

(72) Inventors: Takayuki Ikeda, Kanagawa (JP); Yutaka Shionoiri, Kanagawa (JP); Kiyoshi Kato, Kanagawa (JP); Tomoaki Atsumi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/390,920

(22) Filed: Dec. 27, 2016

(65) Prior Publication Data

US 2017/0186473 A1 Jun. 29, 2017

(30) Foreign Application Priority Data

Dec. 29, 2015 (JP) ................................ 2015-257590
Oct. 11, 2016 (JP) ................................ 2016-200053

(51) Int. Cl.

| | |
|---|---|
| ***G11C 5/14*** | (2006.01) |
| ***G11C 11/4074*** | (2006.01) |
| ***G11C 11/4096*** | (2006.01) |
| ***G11C 11/4094*** | (2006.01) |
| ***H01L 29/786*** | (2006.01) |
| ***H01L 27/115*** | (2017.01) |
| ***H01L 27/108*** | (2006.01) |

(52) U.S. Cl.

CPC .......... *G11C 11/4074* (2013.01); *G11C 5/147* (2013.01); *G11C 11/4094* (2013.01); *G11C 11/4096* (2013.01); *H01L 27/10805* (2013.01); *H01L 27/115* (2013.01); *H01L 29/7869* (2013.01); *H01L 29/78648* (2013.01)

(58) Field of Classification Search

CPC ..................................................... G11C 5/147
USPC .................................................... 365/189.09
See application file for complete search history.

(56) References Cited

U.S. PATENT DOCUMENTS 6,335,895 B1 * 1/2002 Sugibayashi .......... G11C 5/147 365/226
6,377,508 B1 * 4/2002 Tomishima ........... G11C 11/407 365/189.11
7,200,051 B2 * 4/2007 Takeuchi ................ G11C 5/14 365/189.09
7,456,680 B2 * 11/2008 Gyohten ................ G05F 1/465 327/541

(Continued)

FOREIGN PATENT DOCUMENTS

JP 2012-069932 A 4/2012
JP 2012-146965 A 8/2012
JP 2013-168631 A 8/2013

*Primary Examiner* — Son Mai
(74) *Attorney, Agent, or Firm* — Nixon Peabody LLP; Jeffrey L. Costellia

(57) ABSTRACT

A semiconductor device capable of stably holding data for a long time is provided. A transistor including a back gate is used as a writing transistor of a memory element. In the case where the transistor is an n-channel transistor, a negative potential is supplied to a back gate in holding memory. The supply of the negative potential is stopped while the negative potential is held in the back gate. In the case where an increase in the potential of the back gate is detected, the negative potential is supplied to the back gate.

19 Claims, 56 Drawing Sheets

(56) References Cited

U.S. PATENT DOCUMENTS

| | | | | |
|---|---|---|---|---|
| 7,852,704 | B2 * | 12/2010 | Takahashi | G11C 5/145 365/226 |
| 9,024,317 | B2 | 5/2015 | Endo et al. | |
| 9,558,807 | B2 * | 1/2017 | Lu | G11C 11/4078 |
| 9,735,179 | B2 | 8/2017 | Endo et al. | |
| 2012/0051118 | A1 | 3/2012 | Yamazaki et al. | |
| 2012/0161139 | A1 | 6/2012 | Endo et al. | |
| 2013/0148411 | A1 | 6/2013 | Atsumi et al. | |
| 2014/0021474 | A1 | 1/2014 | Ikeda et al. | |
| 2014/0103958 | A1 | 4/2014 | Ikeda et al. | |
| 2014/0225644 | A1 | 8/2014 | Aoki et al. | |
| 2017/0179160 | A1 | 6/2017 | Takahashi | |
| 2017/0179294 | A1 | 6/2017 | Kato et al. | |
| 2017/0186749 | A1 | 6/2017 | Ohshima et al. | |
| 2017/0186751 | A1 | 6/2017 | Akasawa et al. | |
| 2017/0230041 | A1 | 8/2017 | Kato et al. | |

* cited by examiner

FIG. 10A1
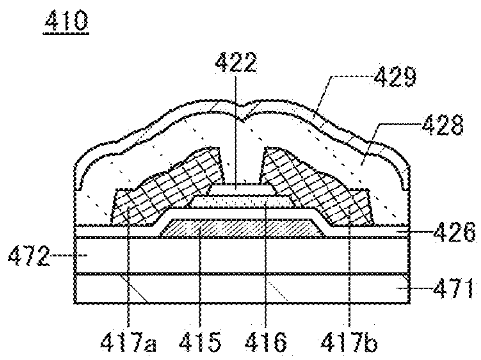
FIG. 10A2
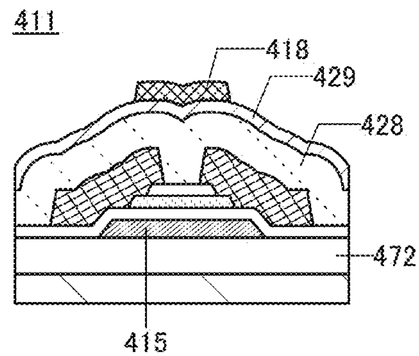
FIG. 10B1
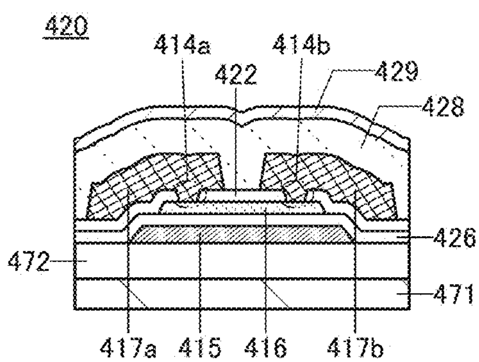
FIG. 10B2
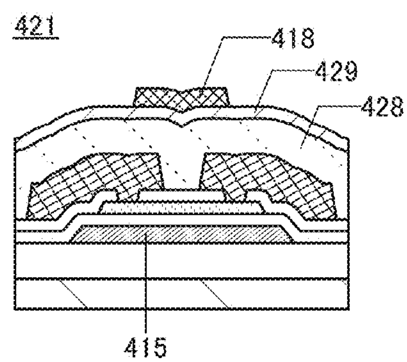
FIG. 10C1
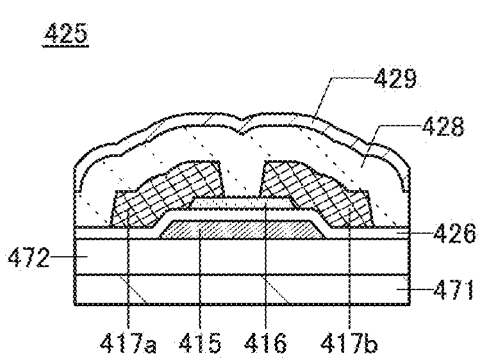
FIG. 10C2
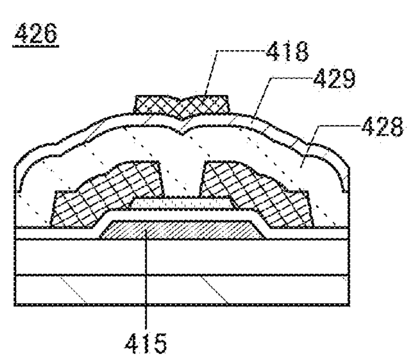

FIG. 12A1
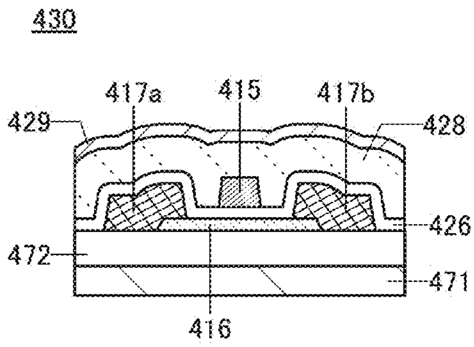
FIG. 12A2
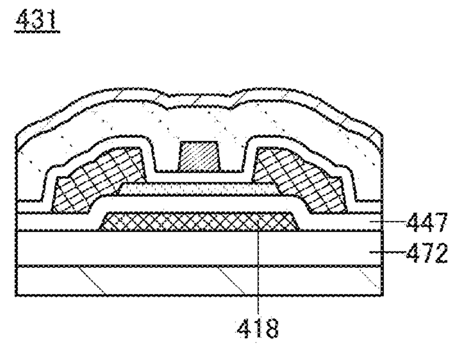
FIG. 12A3
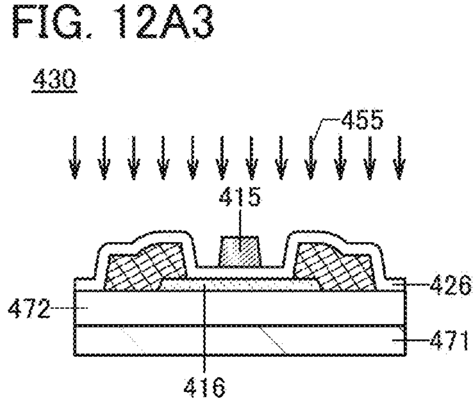
FIG. 12B1
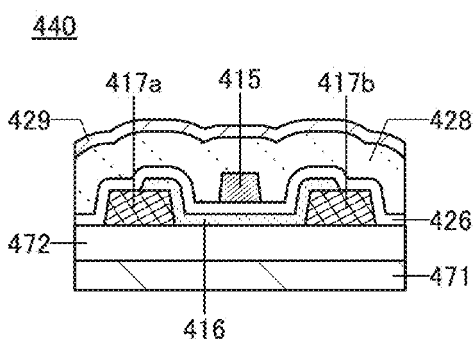
FIG. 12B2
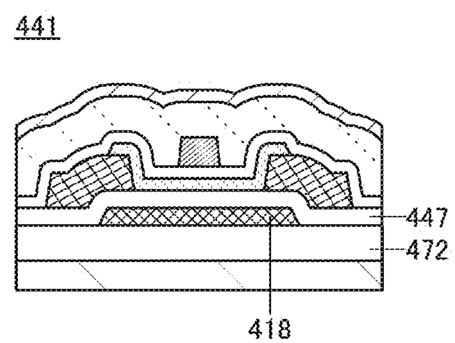

FIG. 13A1
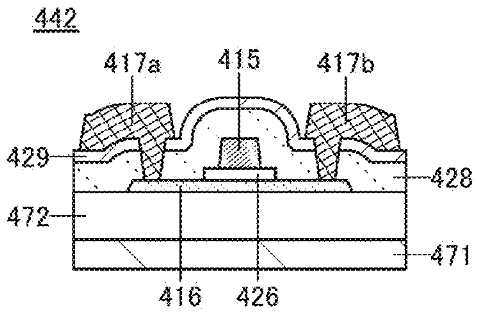
FIG. 13A2
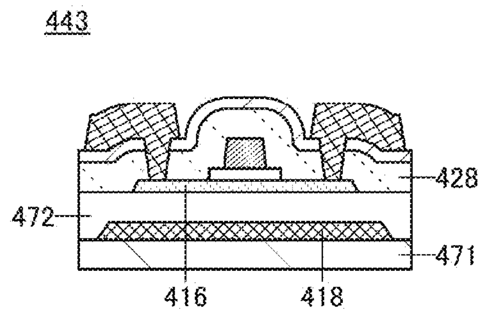
FIG. 13A3
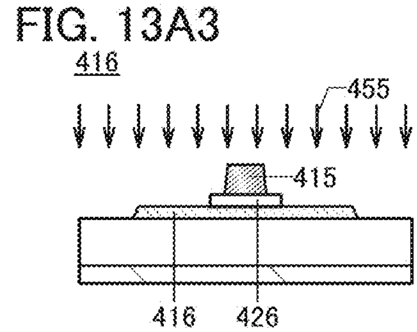
FIG. 13B1
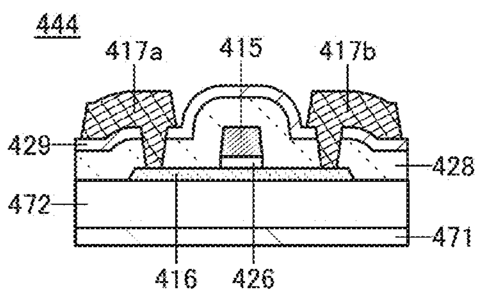
FIG. 13B2
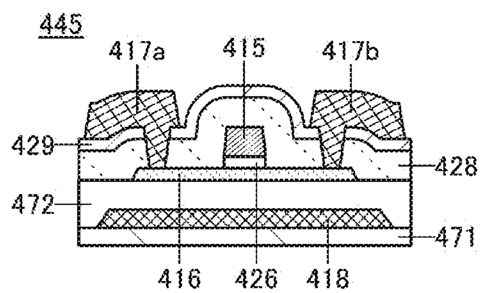
FIG. 13C1
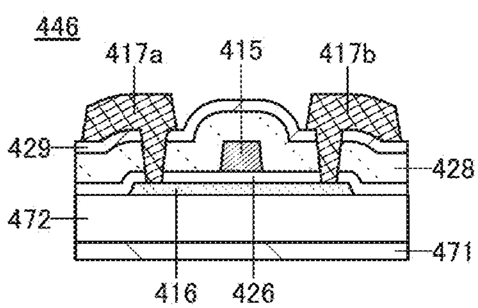
FIG. 13C2
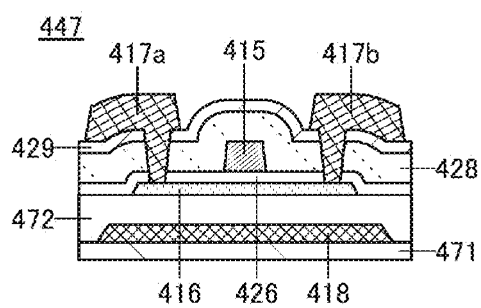

451a

451a

451a

451b

451b

451b

491

492

452

452

452

454

454

454

454a

454a

454a

448

448

448

SEMICONDUCTOR DEVICE, ELECTRONIC DEVICE, AND SEMICONDUCTOR WAFER

BACKGROUND OF THE INVENTION

1. Field of the Invention

One embodiment of the present invention relates to a semiconductor device and a driving method thereof. Another embodiment of the present invention relates to an electronic device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. It can be said that a display device (e.g., a liquid crystal display device and a light-emitting display device), a projection device, a lighting device, an electro-optical device, a power storage device, a memory device, a semiconductor circuit, an imaging device, an electronic device, and the like include a semiconductor device in some cases.

2. Description of the Related Art

A technique in which a transistor is formed using a semiconductor material has attracted attention. The transistor is applied to a wide range of electronic devices such as an integrated circuit (IC) or an image display device (also simply referred to as a display device). As semiconductor materials applicable to the transistor, silicon-based semiconductor materials have been widely used, but oxide semiconductors have been attracting attention as alternative materials.

Patent Document 1 discloses an example in which a transistor including an oxide semiconductor in a channel formation region (hereinafter referred to as an oxide semiconductor transistor) is used in a dynamic random access memory (DRAM). The oxide semiconductor transistor has extremely low current flowing between a source and a drain when the transistor is in an off-state (off-state current); thus, a low-power DRAM having a low refresh frequency can be formed.

Patent Document 2 discloses a nonvolatile memory including an oxide semiconductor transistor. Unlike the flash memory, the nonvolatile memory has unlimited cycling capability, can easily operate at high speed, and consumes less power.

Patent Document 2 discloses an example in which an oxide semiconductor transistor has a second gate electrode to control the threshold voltage of the transistor so that the off-state current of the transistor is lowered.

Patent Documents 2 and 3 each disclose a structure example of a circuit for driving the second gate.

REFERENCE

Patent Document

[Patent Document 1] Japanese Published Patent Application No. 2013-168631

[Patent Document 2] Japanese Published Patent Application No. 2012-069932

[Patent Document 3] Japanese Published Patent Application No. 2012-146965

SUMMARY OF THE INVENTION

It is an object of one embodiment of the present invention to provide a semiconductor device capable of holding data for a long time. Another object of one embodiment of the present invention is to provide a semiconductor device capable of high-speed data writing. It is an object of one embodiment of the present invention to provide a low-power semiconductor device. Another object of one embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

A transistor including a back gate is used as a writing transistor of a memory element. In the case where the transistor is an n-channel transistor, a negative potential is supplied to a back gate in holding memory. The supply of the negative potential is stopped while the negative potential is held in the back gate. In the case where an increase in the potential of the back gate is detected, the negative potential is supplied to the back gate.

One embodiment of the present invention is a semiconductor device including a memory portion, a potential generating portion, a potential comparing portion, and a control portion. The memory portion includes a transistor and a capacitor. The transistor includes a first gate and a second gate. The memory portion is configured to supply a potential to the first gate and control whether to turn on or off the transistor. The memory portion is configured to turn on the transistor and supply charge to the capacitor. The potential generating portion is configured to supply a potential to the second gate. The potential comparing portion is configured to compare the potential of the second gate and a reference potential. The control portion is configured to determine a potential supplied by the potential generating portion in accordance with a signal output from the potential comparing portion.

The semiconductor device is configured to turn off the transistor and hold charge of the capacitor. The first gate can function as a gate of the transistor. The second gate can function as a back gate of the transistor. The first gate overlaps with the second gate with the semiconductor layer positioned therebetween.

The semiconductor layer of the transistor preferably contains an oxide semiconductor.

Another embodiment of the present invention is an electronic device including the semiconductor device and at least one of an antenna, a battery, an operation switch, a microphone, and a speaker.

Another embodiment of the present invention is a semiconductor wafer including a plurality of semiconductor devices and a separation region.

According to one embodiment of the present invention, a semiconductor device capable of holding data for a long time can be provided. According to one embodiment of the present invention, a semiconductor device capable of high-speed data writing can be provided. According to one embodiment of the present invention, a semiconductor device capable of suppressing power consumption can be provided. According to one embodiment of the present invention, a novel semiconductor device can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

FIGS. 10A1, 10A2, 10B1, 10B2, 10C1, and 10C2 each illustrate an example of a transistor.

FIGS. 12A1, 12A2, 12A3, 12B1, and 12B2 each illustrate an example of a transistor.

FIGS. 13A1, 13A2, 13A3, 13B1, 13B2, 13C1, and 13C2 each illustrate an example of a transistor.

DETAILED DESCRIPTION OF THE INVENTION

Figure 1:
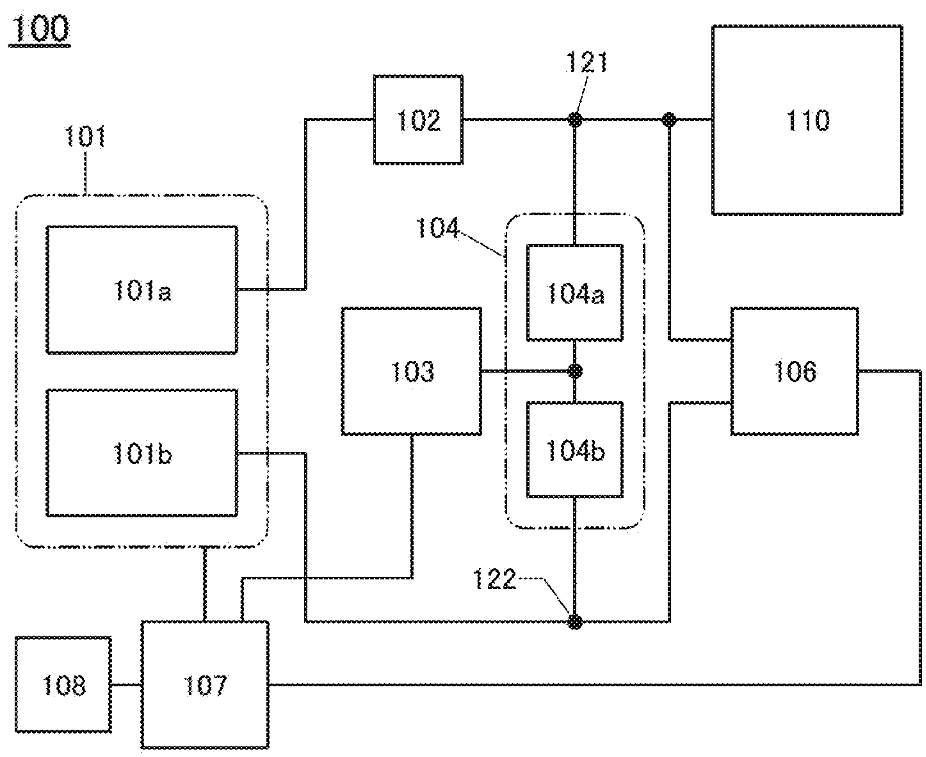
FIG. 1 is a block diagram illustrating a circuit configuration of a semiconductor device.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a layer, a resist mask, or the like might be unintentionally reduced in size by treatment such as etching, which is not illustrated in some cases for easy understanding.

Especially in a top view (also referred to as a "plan view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. A term with an ordinal number in this specification and the like might not be provided with an ordinal number in a claim and the like.

In addition, in this specification and the like, a term such as an "electrode" or a "wiring" does not limit the function of a component. For example, an "electrode" is used as part of a "wiring" in some cases, and vice versa. Further, the term "electrode" or "wiring" can also mean a combination of a plurality of "electrodes" and "wirings" formed in an integrated manner.

Note that the term "over" or "under" in this specification and the like does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, e.g., when a transistor having a different polarity is employed or the direction of current flow is changed in circuit operation. Therefore, it is difficult to define which is the source (or the drain). Thus, the terms "source" and "drain" can be used to denote the drain and the source, respectively.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

In this specification and the like, the term "electrically connected" includes the case where components are connected through an object having any electric function. There is no particular limitation on an "object having any electric function" as long as electric signals can be transmitted and received between components that are connected through the object. Thus, even when the expression "electrically connected" is used, there is a case in which no physical connection is made and a wiring is just extended in an actual circuit.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value, in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value, in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering a side surface of a semiconductor layer, an effective channel width is greater than an apparent channel width, and its influence cannot be ignored in some cases. For example, in a miniaturized transistor having a gate electrode covering a side surface of a semiconductor layer, the proportion of a channel region formed in a side surface of a semiconductor is increased. In that case, an effective channel width is greater than an apparent channel In such a case, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, an apparent channel width is referred to as a "surrounded channel width (SCW)" in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Note that impurities in a semiconductor refer to, for example, elements other than the main components of the semiconductor. For example, an element with a concentration of lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; there are hydrogen, lithium, sodium, silicon, boron, phosphorus, carbon, and nitrogen, for example. In the case of an oxide semiconductor, water also serves as an impurity in some cases. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to −10° and less than or equal to 100, and accordingly also includes the case where the angle is greater than or equal to −5° and less than or equal to 50. In addition, the term "substantially parallel" indicates that the angle formed between two straight lines is greater than or equal to −30° and less than or equal to 30°. In addition, the term "perpendicular" or "orthogonal" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

In the specification and the like, the terms "identical," "the same," "equal," "uniform," and the like (including synonyms thereof) used in describing calculation values and actual measurement values allow for a margin of error of ±20% unless otherwise specified.

In this specification and the like, in the case where an etching step is performed after a resist mask is formed in a photolithography process, the resist mask is removed after the etching step, unless otherwise specified.

In this specification and the like, a high power supply potential $V_{DD}$ (also simply referred to as "$V_{DD}$" or "H potential") is a power supply potential higher than a low power supply potential $V_{SS}$. The low power supply potential $V_{SS}$ (also simply referred to as "$V_{SS}$" or "L potential") is a power supply potential lower than the high power supply potential $V_{DD}$. In addition, a ground potential (also referred to as "GND" or a "GND potential") can be used as $V_{DD}$ or $V_{SS}$. For example, in the case where a ground potential is used as $V_{DD}$, $V_{SS}$ is lower than the ground potential, and in the case where a ground potential is used as $V_{SS}$, $V_{DD}$ is higher than the ground potential.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Furthermore, unless otherwise specified, transistors described in this specification and the like are enhancement-type (normally-off-type) field effect transistors. Unless otherwise specified, a transistor described in this specification and the like refers to an n-channel transistor. Thus, unless otherwise specified, the threshold voltage (also referred to as "Vth") is larger than 0 V.

Embodiment 1

In this embodiment, a semiconductor device 100 of one embodiment of the present invention is described with reference to drawings. FIG. 1 is a block diagram illustrating a circuit configuration of the semiconductor device 100.

<Circuit Configuration of Semiconductor Device 100>

The semiconductor device 100 includes a negative potential generating portion 101 (a negative potential generating portion 101*a* and a negative potential generating portion 101*b*), a potential hold portion 102, a back gate control signal generating portion 103, a level shifter 104 (a level shifter 104*a* and a level shifter 104*b*), a potential comparing portion 106, a control portion 107, a clock generating portion 108, and a memory portion 110.

The negative potential generating portion 101*a* is electrically connected to the potential hold portion 102, the potential hold portion 102 is electrically connected to the memory portion 110 and the potential comparing portion 106 via a node 121. The negative potential generating portion 101*b* is electrically connected to the potential comparing portion 106 via a node 122. The back gate control signal generating portion 103 is electrically connected to the level shifter 104*a* and the level shifter 104*b*. The level shifter 104*a* is electrically connected to the node 121, and the level shifter 104*b* is electrically connected to the node 122. The clock generating portion 108 is electrically connected to the control portion 107. The control portion 107 is electrically connected to the negative potential generating portion 101 and the potential comparing portion 106.

[Memory Portion 110]

Figure 2A:
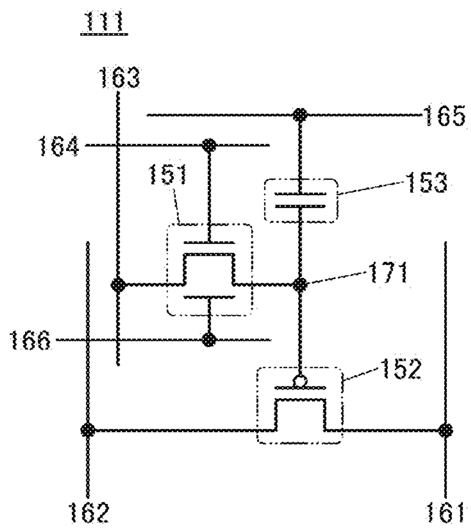
FIGS. 2A and 2B show examples of circuits which are used for a memory element.
Figure 2B:
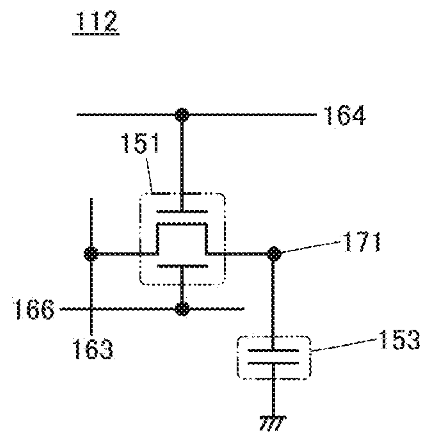

The memory portion 110 includes a plurality of memory elements. FIGS. 2A and 2B each illustrate an example of a circuit that can be used for the memory element.

A memory element 111 illustrated in FIG. 2A includes a transistor 151, a transistor 152, and a capacitor 153. The transistor 151 includes a back gate.

A transistor in which an oxide semiconductor is used for a semiconductor layer where a channel is formed (also referred to as "OS transistor") is preferably used as the transistor 151. Since the off-state current of the OS transistor is extremely low, stored data can be held for a long period at a predetermined node of the memory element 111. In other words, a memory device with low power consumption can be obtained because refresh operation becomes unnecessary or the frequency of refresh operation can be extremely low.

In FIG. 2A, a wiring 161 is electrically connected to one of a source and a drain of the transistor 152, and a wiring 162 is electrically connected to the other of the source and the drain of the transistor 152. A wiring 163 is electrically connected to one of a source and a drain of the transistor 151. A wiring 164 is electrically connected to a gate of the transistor 151. A back gate of the transistor 151 is electrically connected to a wiring 166. The wiring 166 is electrically connected to the node 121 (see FIG. 1).

The other of the source and the drain of the transistor 151, a gate of the transistor 152, and one electrode of the capacitor 153 are electrically connected to a node 171. A wiring 165 is electrically connected to the other electrode of the capacitor 153.

The memory element 111 in FIG. 2A has a feature that the charges supplied to the node 171 can be held, and thus enables writing, holding, and reading of data as follows.

[Writing and Holding Operations]

Writing and holding of data will be described. First, the potential of the wiring 164 is set to a potential at which the transistor 151 is on. Accordingly, the potential of the wiring 163 is supplied to the node 171. That is, a predetermined charge is supplied to the node 171 (writing). Here, a potential higher than a negative potential described later (a potential lower than GND) is supplied to the wiring 166.

When a positive potential (a potential higher than GND) is supplied to the wiring 166, an apparent $V_{th}$ of the transistor 151 can be small, which leads to an increase in the writing speed. Note that a potential difference between GND and a positive potential is referred to as a "positive voltage" using GND as a reference.

Here, one of two kinds of charges providing different potential levels (hereinafter referred to as a "low-level charge" and a "high-level charge") is supplied to the node 171. After that, the potential of the wiring 164 is set to a potential at which the transistor 151 is off. Thus, the charge is held at the node 171. Here, when a negative potential (a potential lower than GND) is supplied to the wiring 166, an apparent $V_{th}$ of the transistor 151 is increased. Thus, charge supplied to the node 171 can be held for a long time even after supply of potential to the wiring 164 is stopped. Note that a potential difference between GND and a negative potential is referred to as a "negative voltage" using GND as a reference.

Note that the high-level charge is a charge for supplying a higher potential to the node 171 than the low-level charge. In the case where the transistor 152 is a p-channel transistor, each of the high-level and low-level charges is a charge for supplying a potential higher than the threshold voltage of the transistor. In the case where the transistor 152 is an n-channel transistor, each of the high-level and low-level charges is a charge for supplying a potential lower than the threshold voltage of the transistor. In other words, each of the high-level and low-level charges is a charge for supplying a potential at which the transistor is off.

[Reading Operation]

Next, reading of data is described. A reading potential $V_R$ is supplied to the wiring 165 while a predetermined potential (a constant potential) different from the potential of the wiring 162 is supplied to the wiring 161, whereby data held at the node 171 can be read.

The reading potential $V_R$ is set to $\{(V_{th}-V_H)+(V_{th}+V_L)\}/2$, where $V_H$ is the potential supplied in the case of the high-level charge and $V_L$ is the potential supplied in the case of the low-level charge. Note that the potential of the wiring 165 in a period during which data is not read is set to a potential higher than $V_H$ in the case where the transistor 152 is a p-channel transistor, and is set to a potential lower than $V_L$ in the case where the transistor 152 is an n-channel transistor.

For example, in the case where the transistor 152 is a p-channel transistor, $V_R$ is −2 V when $V_{th}$ of the transistor 152 is −2 V, $V_H$ is 1 V, and $V_L$ is −1 V. When the potential written to the node 171 is $V_H$ and $V_R$ is applied to the wiring 165, $V_R+V_H$, i.e., −1 V, is applied to the gate of the transistor 152. Since −1 V is higher than $V_{th}$, the transistor 152 is not turned on. Thus, the potential of the wiring 162 is not changed. When the potential written to the node 171 is $V_L$ and $V_R$ is applied to the wiring 165, $V_R+V_L$, i.e., −3 V, is applied to the gate of the transistor 152. Since −3 V is lower than $V_{th}$, the transistor 152 is turned on. Thus, the potential of the wiring 162 is changed.

In the case where the transistor 152 is an n-channel transistor, $V_R$ is 2 V when $V_{th}$ of the transistor 152 is 2 V, $V_H$ is 1 V, and $V_L$ is −1 V. When the potential written to the node 171 is $V_H$ and $V_R$ is applied to the wiring 165, $V_R+V_H$, i.e., 3 V, is applied to the gate of the transistor 152. Since 3 V is higher than $V_{th}$, the transistor 152 is turned on. Thus, the potential of the wiring 162 is changed. When the potential written to the node 171 is $V_L$ and $V_R$ is applied to the wiring 165, $V_R+V_L$, i.e., 1 V, is applied to the gate of the transistor 152. Since 1 V is lower than $V_{th}$, the transistor 152 is not turned on. Thus, the potential of the wiring 162 is not changed.

By determining the potential of the wiring 162, data held at the node 171 can be read.

A memory element 112 illustrated in FIG. 2B is different from the memory element 111 in that the transistor 152 is not included.

[Writing and Holding Operations]

Also in the memory element 112, data can be written and held in a manner similar to that of the memory element in FIG. 2A.

[Reading Operation]

Reading of data in the memory element 112 in FIG. 2B is described. When a potential at which the transistor 151 is turned on is supplied to the wiring 164, the wiring 163 which is in a floating state and the capacitor 153 are brought into conduction, and the charge is redistributed between the wiring 163 and the capacitor 153. As a result, the potential of the wiring 163 is changed. The amount of change in the potential of the wiring 163 varies depending on the potential of the node 171 (or the charge accumulated in the node 171).

For example, the potential of the wiring 163 after the charge redistribution is $(C_B \times V_{B0}+C \times V)/(C_B+C)$, where V is the potential of the node 171, C is the capacitance of the capacitor 153, $C_B$ is the capacitance component of the wiring 163, and $V_{B0}$ is the potential of the wiring 163 before the charge redistribution. Thus, it can be found that, assuming that the memory cell is in either of two states in which the potential of the node 171 is $V_1$ and $V_0$ ($V_1>V_0$), the potential of the wiring 163 in the case of holding the potential $V_1$ $(=(C_B \times V_{B0}+C \times V_1)/(C_B+C))$ is higher than the potential of the wiring 163 in the case of holding the potential $V_0$ $(=(C_B \times V_{B0}+C \times V_0)/(C_B+C))$.

Then, by comparing the potential of the wiring 163 with a predetermined potential, data can be read.

In the above-described memory elements, stored data can be held for a long time when an OS transistor is used as the transistor 151. In other words, refresh operation becomes unnecessary or the frequency of the refresh operation can be extremely low, which leads to a sufficient reduction in power consumption. Moreover, stored data can be held for a long time even when power is not supplied (note that a potential is preferably fixed).

The memory elements 111 and 112 are unlikely to be deteriorated because a high voltage is not needed for data writing. Especially in the memory element 111, unlike in a conventional nonvolatile memory, it is not necessary to inject and extract electrons into and from a floating gate; thus, a problem such as deterioration of an insulator is not caused. In other words, a memory device which does not have a limit on the number of times of rewriting data which is a problem in a conventional non-volatile memory and has drastically improved reliability can be obtained. Furthermore, data is written depending on the state of the transistor (on or off), whereby high-speed operation can be easily achieved.

[Negative Potential Generating Portion 101]

Figure 3A:
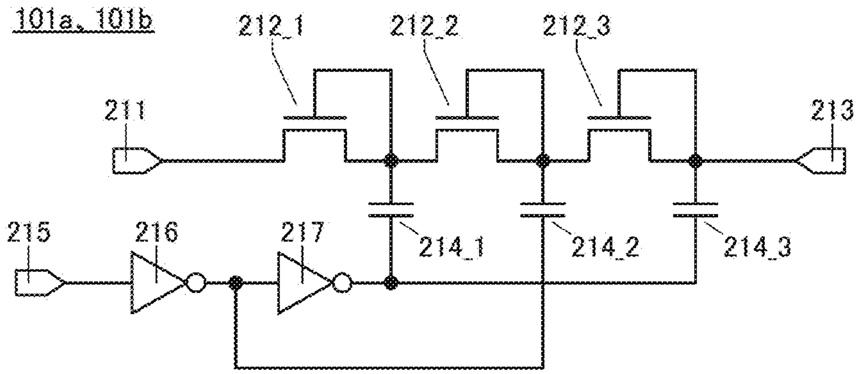
FIGS. 3A to 3C show examples of circuit diagrams of a negative potential generating portion.

FIG. 3A illustrates an example of a circuit diagram which can be used for the negative potential generating portion 101*a* or 101*b*. The circuit illustrated in FIG. 3A is a negative potential generating portion with a charge pump.

The negative potential generating portion 101*a* (the negative potential generating portion 101*b*) illustrated in FIG. 3A includes transistors 212_1 to 212_3, capacitors 214_1 to 214_3, an inverter 216, and an inverter 217.

One of a source and a drain of the transistor 212_1 is electrically connected to a terminal 211. The other of the source and the drain of the transistor 212_1 is electrically connected to a gate of the transistor 212_1 and one of a source and a drain of the transistor 212_2. The other of the source and the drain of the transistor 212_2 is electrically connected to a gate of the transistor 212_2 and one of a source and a drain of the transistor 212_3. The other of the source and the drain of the transistor 212_3 is electrically connected to a gate of the transistor 212_3 and a terminal 213.

One electrode of the capacitor 214_1 is electrically connected to the other of the source and the drain of the transistor 212_1. The other electrode of the capacitor 214_1 is electrically connected to an output terminal of the inverter 217. One electrode of the capacitor 214_2 is electrically connected to the other of the source and the drain of the transistor 212_2. The other electrode of the capacitor 214_2 is electrically connected to an output terminal of the inverter 216. One electrode of the capacitor 214_3 is electrically connected to the other of the source and the drain of the transistor 212_3. The other electrode of the capacitor 214_3 is electrically connected to the output terminal of the inverter 217.

An input terminal of the inverter 216 is electrically connected to a terminal 215, and an output terminal of the inverter 216 is electrically connected to an input terminal of the inverter 217.

An L potential is supplied to the terminal 211 and a clock signal which changes between H and L potentials is supplied to the terminal 215, whereby a potential lower than an L potential (negative potential) can be supplied to the terminal 213. When the number of transistors and capacitors which are used in the negative potential generating portion 101*a* (the negative potential generating portion 101*b*) is increased, an even lower potential can be supplied.

Figure 3B:
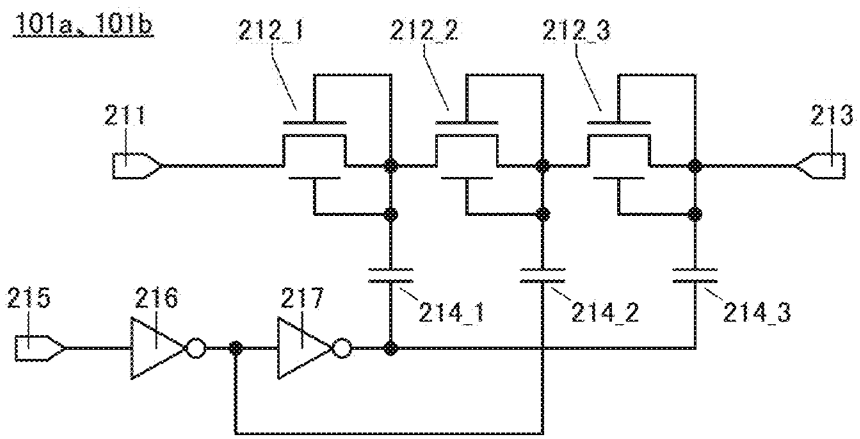

As in the negative potential generating portion 101*a* (negative potential generating portion 101*b*) illustrated in FIG. 3B, transistors including back gates may be used as the transistors 212_1 to 212_3. FIG. 3B illustrates a circuit diagram in which the gate and the back gate of each of the transistors 212_1 to 212_3 have the same potential.

Figure 3C:
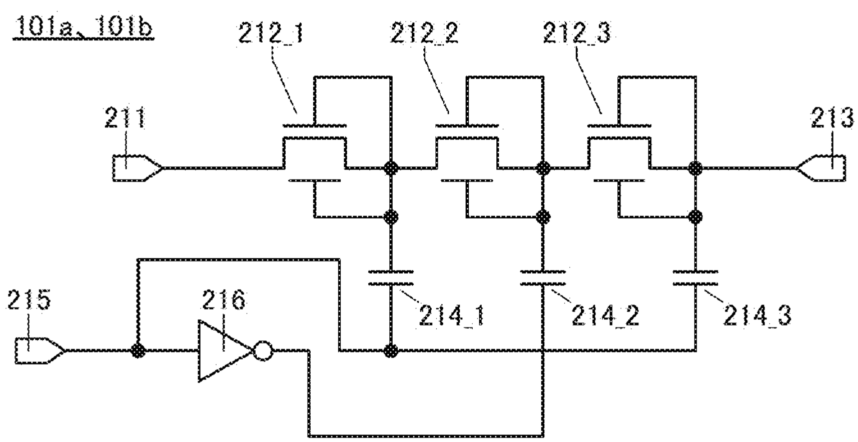

As in the negative potential generating portion 101*a* (the negative potential generating portion 101*b*) illustrated in FIG. 3C, the other electrode of the capacitor 214_1 and the other electrode of the capacitor 214_3 may be electrically connected to the terminal 215 without providing the inverter 217.

Although the case where n-channel transistors are used as the transistors 212_1 to 212_3 is shown in this embodiment, p-channel transistors can also be used. A circuit configuration in which p-channel transistors are used as the transistors 212_1 to 212_3 can be understood by replacing one of the source and the drain with the other. Alternatively, both the n-channel and p-channel transistors may be used as the transistors 212_1 to 212_3.

The negative potential generating portion 101*a* has a function of supplying a negative potential to the node 121 (see FIG. 1). Thus, the negative potential generating portion 101*a* has a function of supplying a negative potential to the wiring 166 (see FIGS. 2A and 2B).

The negative potential generating portion 101*b* has a function of supplying a negative potential to the node 122 (see FIG. 1). The potential supplied from the negative potential generating portion 101*b* is used as a reference potential in the potential comparing portion 106.

Note that a transistor including silicon in a semiconductor layer in which a channel is formed (also referred to as a "Si transistor") has a larger off-state current than an OS transistor. When Si transistors are used as transistors 212_1 to 212_3 and the operation of the negative potential generating portion 101*a* (the negative potential generating portion 101*b*) is stopped while the terminal 211 is set to GND, the potential of the terminal 213 becomes GND. The operation of the negative potential generating portion 101*a* (the negative potential generating portion 101*b*) can be stopped by stopping the supply of the clock signal to the terminal 215 or stopping the supply of power to the inverter 216 or 217.

[Potential Hold Portion 102]

Figure 4A:
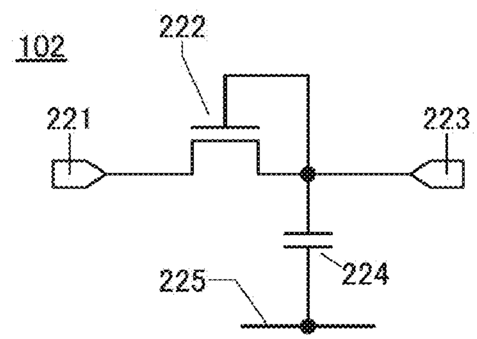
FIGS. 4A to 4C show examples of circuit diagrams of a potential hold portion and a level shifter.

FIG. 4A shows an example of a circuit diagram of the potential hold portion 102. The potential hold portion 102 includes a transistor 222 and a capacitor 224.

One of a source and a drain of the transistor 222 is electrically connected to a terminal 221. The other of the source and the drain of the transistor 222 is electrically connected to a gate of the transistor 222 and a terminal 223.

One electrode of the capacitor 224 is electrically connected to the other of the source and the drain of the transistor 222. The other electrode of the capacitor 224 is electrically connected to a wiring 225. The potential supplied to the wiring 225 may be any potential as long as it is a fixed potential. For example, the wiring 225 may be supplied with GND.

The terminal 221 is electrically connected to the terminal 213 included in the negative potential generating portion 101*a*. When the negative potential is supplied from the negative potential generating portion 101*a* to the terminal 221, the potential of the terminal 223 is higher than that of the terminal 221. Then, the transistor 222 is turned on and the negative potential is supplied to the terminal 223. Thus, the negative potential is supplied to the node 121. Note that in practice, a potential which changes from the negative potential by $V_{th}$ of the transistor 222 is supplied to the node 121. For easy understanding, in this embodiment or the like, a potential which changes from a negative potential by $V_{th}$ is also referred to as a negative potential.

After the negative potential is supplied to the node 121, the operation of the negative potential generating portion 101*a* is stopped. An L potential is supplied to the terminal 221. Then, since the L potential is higher than a negative potential, the transistor 222 is turned off, so that the potential of the node 121 is held.

Figure 4B:
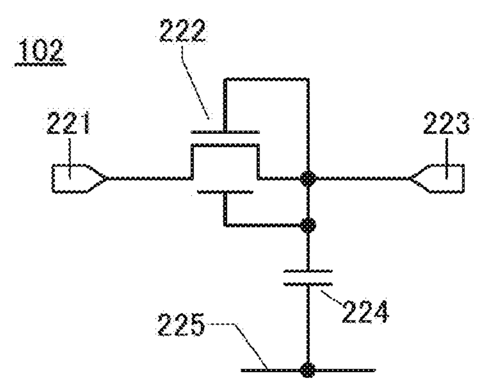

As shown in FIG. 4B, the transistor 222 may be a transistor with a back gate. FIG. 4B illustrates a circuit diagram where the gate and the back gate of the transistor 222 have the same potential.

An OS transistor is preferably used as the transistor 222. Since the off-state current of the OS transistor is extremely small, the potential of the node 121 can be held for a long period. The channel length of the transistor 222 is preferably long.

Alternatively, a p-channel transistor can be used as the transistor 222. A circuit configuration in which a p-channel transistor is used as the transistor 222 can be understood by replacing one of the source and the drain with the other.

[Back Gate Control Signal Generating Portion 103 and Level Shifter 104]

Figure 4C:
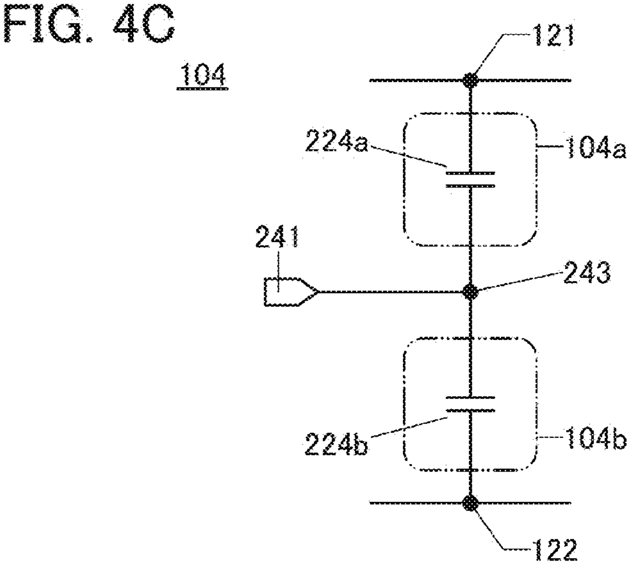

FIG. 4C shows an example of a circuit diagram of the level shifter 104. In this embodiment, a capacitor 224*a* is used as the level shifter 104*a*. A capacitor 224*b* is used as the level shifter 104*b*. One electrode of the capacitor 224*a* is electrically connected to the node 121. The other electrode of the capacitor 224*a* is electrically connected to a terminal 241. One electrode of the capacitor 224*b* is electrically connected to the node 122. The other electrode of the capacitor 224*b* is electrically connected to the terminal 241. A node where the terminal 241, the other electrode of the capacitor 224*a*, and the other electrode of the capacitor 224*b* are electrically connected to each other is a node 243.

The back gate control signal generating portion 103 has a function of supplying a potential to the terminal 241. The potential supplied to the terminal 241 is added to the node 121 by the level shifter 104*a*. The potential supplied to the terminal 241 is added to the node 122 by the level shifter 104*b*.

[Potential Comparing Portion 106]

Figure 5A:
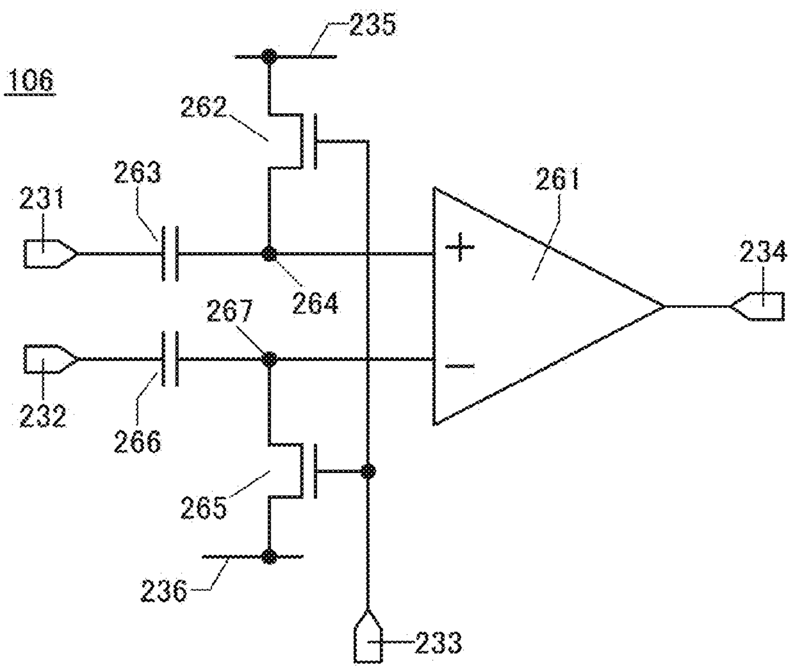
FIGS. 5A and 5B show examples of a circuit diagram of a potential comparing portion.
Figure 5B:
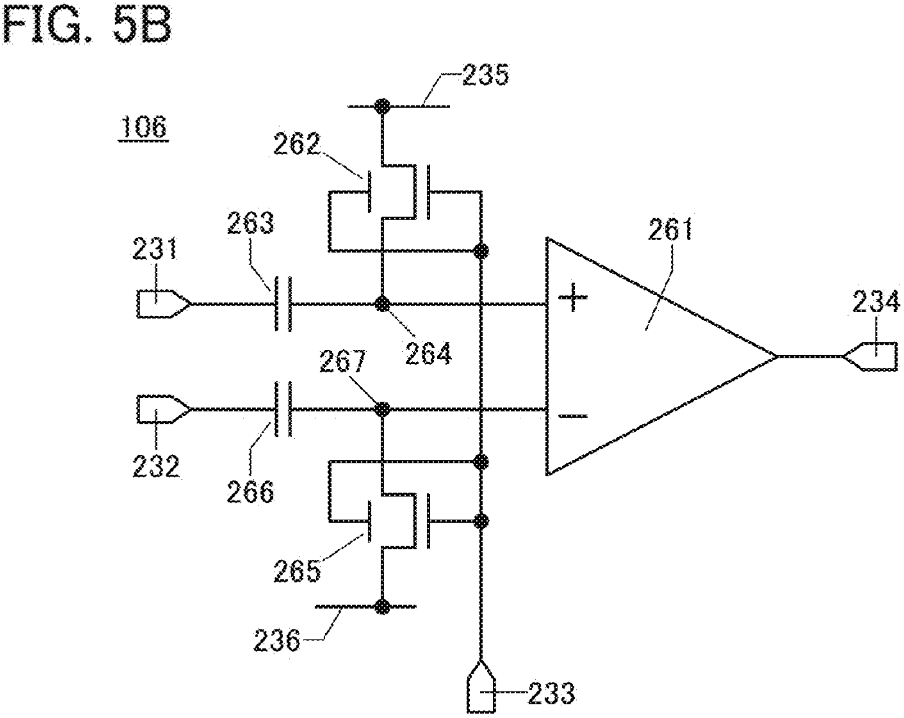

FIGS. 5A and 5B show examples of a circuit diagram of the potential comparing portion 106. The potential comparing portion 106 includes a comparator 261, a transistor 262, a transistor 265, a capacitor 263, and a capacitor 266.

One of a source and a drain of the transistor 262 is electrically connected to a wiring 235, and the other is electrically connected to a node 264. A gate of the transistor 262 is electrically connected to a terminal 233. One of a source and a drain of the transistor 265 is electrically connected to a wiring 236, and the other is electrically connected to a node 267. A gate of the transistor 265 is electrically connected to the terminal 233.

As shown in FIG. 5B, the transistors 262 and 265 may be transistors with back gates. The back gate of the transistor 262 is electrically connected to the terminal 233. The back gate of the transistor 265 is electrically connected to the terminal 233.

One electrode of the capacitor 263 is electrically connected to a terminal 231. The other electrode is electrically connected to the node 264. One electrode of the capacitor 266 is electrically connected to a terminal 232. The other electrode is electrically connected to the node 267.

A non-inverting input terminal of the comparator 261 is electrically connected to the node 264, and an inverting input terminal thereof is electrically connected to the node 267. The output terminal of the comparator 261 is electrically connected to a terminal 234. The terminal 231 is electrically connected to the node 121. The terminal 232 is electrically connected to the node 122.

Next, the operation of the potential comparing portion 106 is described.

[Reset Operation]

After potentials are supplied to the terminals 231 and 232, a potential at which the transistors 262 and 265 are turned on (reset signal) is supplied from the terminal 233. Then, a potential of the wiring 235 is supplied to the node 264, and a potential of the wiring 236 is supplied to the node 267. The wirings 235 and 236 are supplied with the same potential. For example, GND is supplied. The potential supplied to each of the wirings 235 and 236 may be a positive potential or a negative potential.

After that, when a potential at which the transistors 262 and 265 are turned off is supplied to the terminal 233, the nodes 264 and 267 are brought into a floating state, whereby charge (potential) is held in each of the nodes 264 and 267.

As the transistors 262 and 265, OS transistors are preferably used. Since the off-state current of an OS transistor is extremely small, charge of each of the nodes 264 and 267 can be held more reliably. The channel lengths of the transistors 262 and 265 are preferably long.

[Comparison Operation]

The potential of the node 267 is used as a reference potential. The node 267 functions as a reference potential hold portion. The potential of the node 267 changes in conjunction with a potential of the terminal 232. The potential supplied to the terminal 232 can also be referred to as a reference potential. The potential supplied to the terminal 232 is preferably a fixed potential. The potential supplied to the terminal 232 is changed by the level shifter 104*b* in some cases. The potential supplied to the terminal 232 may be a positive potential or a negative potential.

The comparator 261 outputs an H potential to the terminal 234 when a potential of the node 264 becomes higher than that of the node 267. Thus, the comparator 261 outputs an H potential to the terminal 234 when the potential of the terminal 231 is higher than that of the terminal 232.

Modification Example

Figure 6A:
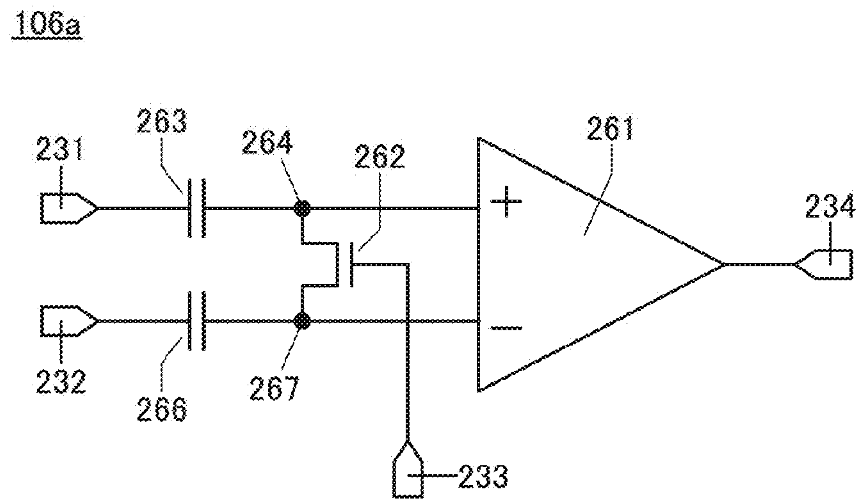
FIGS. 6A and 6B show examples of a circuit diagram of a potential comparing portion.
Figure 6B:
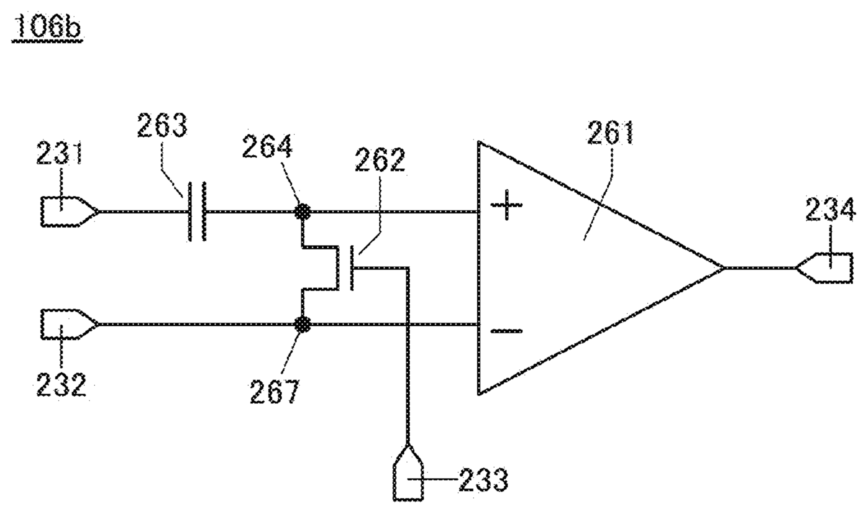

FIGS. 6A and 6B illustrate modification examples of the potential comparing portion 106. The potential comparing portion 106*a* illustrated in FIG. 6A is different from the potential comparing portion 106 in that the transistor 265, the wiring 235, and the wiring 236 are not included, one of the source and the drain of the transistor 262 is electrically connected to the node 264, and the other is electrically connected to the node 267.

The potential comparing portion 106*b* illustrated in FIG. 6B is different from the potential comparing portion 106*a* in that the terminal 232 is electrically connected to the node 267 without the capacitor 266 interposed therebetween.

The potential comparing portions 106*a* and 106*b* can operate in a manner similar to that of the potential comparing portion 106. Since the number of constituent elements of each of the potential comparing portions 106*a* and 106*b* is smaller than that of the potential comparing portion 106, the area occupied by the semiconductor device 100 can be reduced.

[Control Portion 107 and Clock Generating Portion 108]

The control portion 107 operates with a clock signal generated in the clock generating portion 108 as a reference. The control portion 107 is electrically connected to the terminal 234. The output of the comparator 261 is input to the control portion 107 via the terminal 234. The control portion 107 has a function of supplying a reset signal to the terminal 233 of the potential comparing portion 106. The control portion 107 is electrically connected to the negative potential generating portion 101 and the back gate control signal generating portion 103 and has a function of controlling operations of both of them.

<Operation of Semiconductor Device 100>

Figure 7:
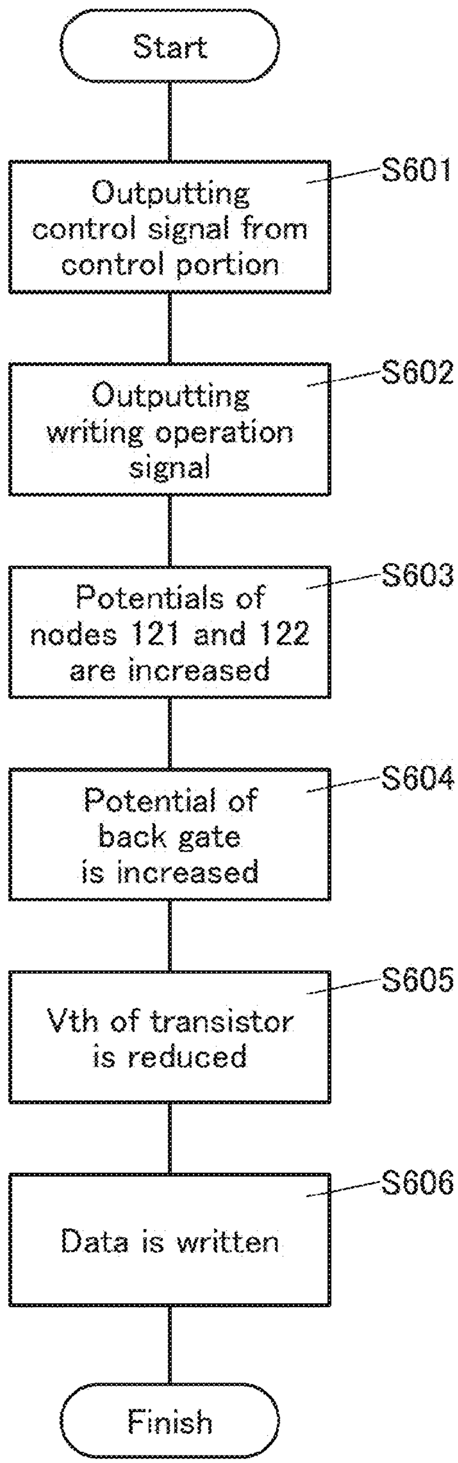
FIG. 7 is a flowchart showing an operation example of a semiconductor device.
Figure 8:
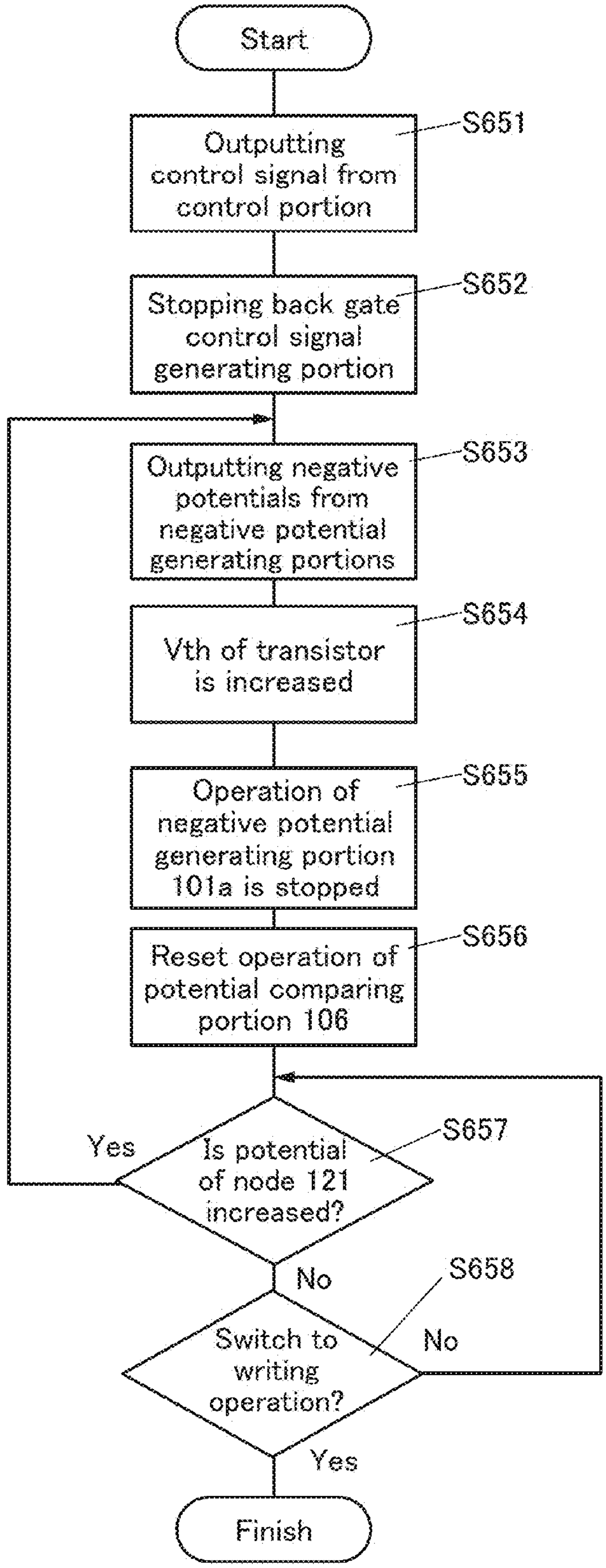
FIG. 8 is a flowchart showing an operation example of a semiconductor device.

Next, operations of the semiconductor device 100 are described with reference to flow charts shown in FIGS. 7 and 8.

[Writing Operation]

The operation of writing data to the memory element 111 included in the memory portion 110 is described. The control portion 107 outputs a control signal for performing a writing operation to the back gate control signal generating portion 103 (Step S601).

When the control signal is input, the back gate control signal generating portion 103 outputs a writing operation signal $V_W$ to the node 243 (Step S602). The writing operation signal $V_W$ is preferably a potential higher than or equal to a positive voltage with the absolute value equal to that of a negative voltage supplied to the node 121 and less than a voltage in which a threshold voltage is added to the positive voltage.

When the writing operation signal $V_W$ is input to the node 243, the writing operation signal $V_W$ is added to a potential of the node 121 by the level shifter 104*a*. In addition, the writing operation signal $V_W$ is added to a potential of the node 122 by the level shifter 104*b*. Each of the potentials of the nodes 121 and 122 is increased by the writing operation signal $V_W$ (Step S603).

Note that in practice, the potential increase of the node 121 can be determined by the ratio between parasitic capacitance generated in the capacitor 224*a* and that generated in the node 121. Similarly, the potential increase of the node 122 is determined by the ratio between the parasitic capacitance generated in the capacitor 224*b* and that generated in the node 122. For easy understanding, the capacitance of the capacitor 224*a* is sufficiently larger than the capacitance of the parasitic capacitance generated in the node 121 in this embodiment or the like. Thus, the potential of the node 121 is increased by the writing operation signal $V_W$. The capacitance of the capacitor 224*b* is sufficiently larger than the capacitance of the parasitic capacitance generated in the node 122. Thus, the potential of the node 122 is increased by the writing operation signal $V_W$.

When the potentials of the nodes 121 and 122 are increased, the potentials of the terminals 231 and 232 of the potential comparing portion 106 are increased. Since each of the potentials of the terminals is increased by the writing operation signal $V_W$, a potential difference between the terminals does not change. Thus, the output potential of the potential comparing portion 106 (the comparator 261) does not change. Note that power supply to the potential comparing portion 106 may be stopped in the writing operation.

When the potential of the node 121 is increased, the potential of the wiring 166 (see FIG. 2A) is increased and the potential of the back gate of the transistor 151 is increased (Step S604). Then, an apparent $V_{th}$ of the transistor 151 can be reduced (Step S605). Thus, the speed of writing data to the memory element 111 can be increased. After that, data is written to the memory element 111 (Step S606).

In the writing operation, potentials of all the back gates of the plurality of memory elements 111 included in the memory portion 110 may be controlled at the same time. The potential of the back gate may be controlled by each word line. In the case where a plurality of memory elements 111 are combined in blocks, the potential hold portion 102, the back gate control signal generating portion 103, the level shifter 104, the potential comparing portion 106, and the like may be provided for each block, and potentials of back gates may be controlled for each block. In the case where the back gate control signal generating portion 103 is provided for each block, the output of the back gate control signal generating portion 103 can be used as a selection signal for selecting a block.

[Holding Operation]

The operation of holding data after the data is written to the memory element 111 is described. First, the control portion 107 outputs a signal which informs the back gate control signal generating portion 103 of performing the holding operation (Step S651).

When the control signal is input to the back gate control signal generating portion 103, the operation of the back gate control signal generating portion 103 is stopped (Step S652). When the operation of the back gate control signal generating portion 103 is stopped, the power consumption of the semiconductor device 100 can be reduced. The holding operation signal $V_H$ may be output from the back gate control signal generating portion 103 to the node 243. The holding operation signal $V_H$ is preferably a potential lower than or equal to the potential GND.

Next, the negative potential generating portions 101*a* and 101*b* are operated to output negative potentials from both of them (Step S653). The negative potential output from the negative potential generating portion 101*a* is supplied to the wiring 166 (see FIG. 2A) via the node 121. Accordingly, the potential of the back gate of the transistor 151 is decreased and an apparent $V_{th}$ of the transistor 151 is increased (Step S654). Thus, data can be held for a long time even after the supply of a potential to the wiring 164 is stopped.

Next, the operation of the negative potential generating portion 101*a* is stopped while GND is supplied to the terminal 211 (Step S655). Accordingly, the potential of the terminal 221 of the potential hold portion 102 becomes GND, whereby the transistor 222 is turned off. Thus, the potential of the node 121 is held.

Next, a reset operation of the potential comparing portion 106 is performed (Step S656).

Then, whether the potential of the node 121 is increased is examined (Step S657). Since the apparent $V_{th}$ of the transistor 151 is decreased when the potential of the node 121 is increased, it becomes difficult to hold the data written to the memory element 111.

When the potential of the node 121 is increased, an H potential is output from the potential comparing portion 106. When the H potential is input from the potential comparing portion 106 to the control portion 107, the control portion 107 operates the negative potential generating portion 101*a* to supply a negative potential to the node 121 (the process returns to Step S653).

Although a negative potential may be constantly output from the negative potential generating portion 101*a* during the holding operation, the power consumption might be increased. When the potential change of the node 121 is detected by the potential comparing portion 106, the negative potential generating portion 101*a* is not required to operate constantly, and thus the power consumption of the semiconductor device 100 can be reduced.

In the case where the operation of the semiconductor device 100 is switched to a writing operation, the holding operation is terminated (Step S658).

[Reading Operation]

In the case where the memory element 111 is used as a memory element, held data is read while the holding operation continues. In the case where the memory element 112 is used as a memory element, the held data is read after the operation is switched to a writing operation.

<Modification Example of Semiconductor Device 100>

Figure 9:
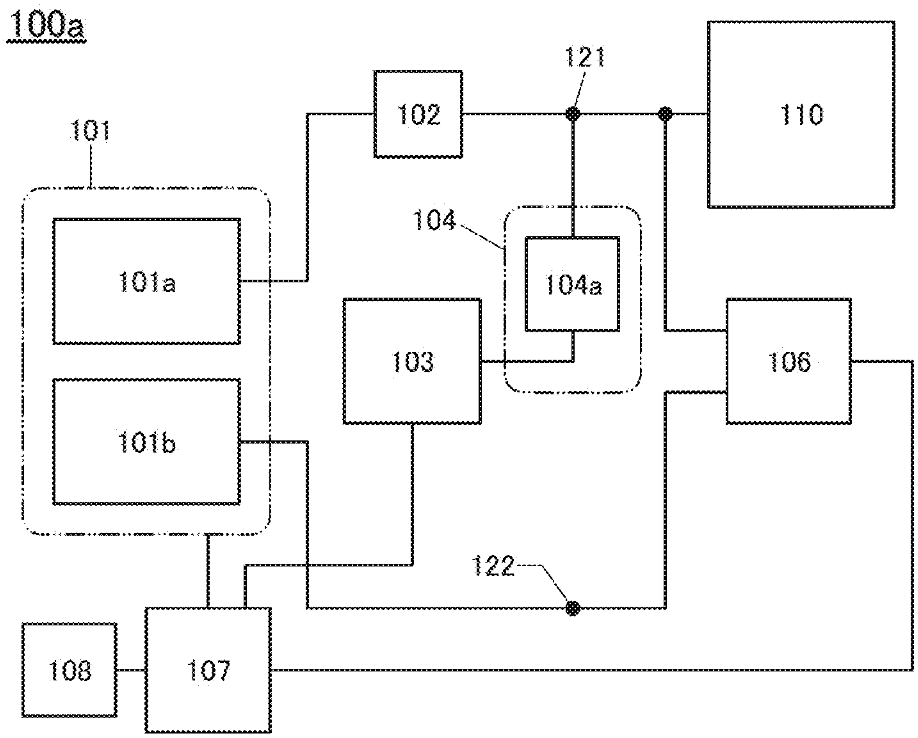
FIG. 9 is a block diagram illustrating a circuit configuration of a semiconductor device.

As a modification example of the semiconductor device 100, a semiconductor device 100*a* is illustrated in FIG. 9. FIG. 9 is a block diagram illustrating a circuit configuration of the semiconductor device 100*a*. The semiconductor device 100*a* has a structure of the semiconductor device 100 without the level shifter 104*b*.

Although an H potential is output from the potential comparing portion 106 in a writing operation in the semiconductor device 100*a*, the control portion 107 can ignore the input from the potential comparing portion 106 in the writing operation. In addition, in the writing operation, the power supply to the potential comparing portion 106 may be stopped.

This embodiment can be implemented in an appropriate combination with any of the structures described in the other embodiments, examples, or the like.

Embodiment 2

In this embodiment, a structure example of a transistor that can be used for the semiconductor device described in the above embodiment will be described.

<Example of Structure of Transistor>

The semiconductor device of one embodiment of the present invention can be fabricated by using a transistor with any of various structures, such as a bottom-gate transistor, a top-gate transistor, or the like. Therefore, a material for a semiconductor layer or the structure of a transistor can be easily changed depending on the existing production line.

[Bottom-Gate Transistor]

FIG. 10A1 is a cross-sectional view of a channel-protective transistor 410 that is a type of bottom-gate transistor. The transistor 410 includes an electrode 415 over a substrate 471 with an insulating layer 472 positioned therebetween. The transistor 410 includes a semiconductor layer 416 over the electrode 415 with an insulating layer 426 provided therebetween. The electrode 415 can function as a gate electrode. The insulating layer 426 can function as a gate insulating layer.

The transistor 410 includes an insulating layer 422 over a channel formation region in the semiconductor layer 416. The transistor 410 includes an electrode 417*a* and an electrode 417*b* which are partly in contact with the semiconductor layer 416 and over the insulating layer 426. Part of the electrode 417*a* and part of the electrode 417*b* are formed over the insulating layer 429.

The insulating layer 422 can function as a channel protective layer. With the insulating layer 422 provided over the channel formation region, the semiconductor layer 416 can be prevented from being exposed at the time of forming the electrodes 417*a* and 417*b*. Thus, the channel formation region in the semiconductor layer 416 can be prevented from being etched at the time of forming the electrodes 417*a* and 417*b*. According to one embodiment of the present invention, a transistor with favorable electrical characteristics can be provided.

The transistor 410 includes an insulating layer 428 over the electrode 417*a*, the electrode 417*b*, and the insulating layer 422 and further includes an insulating layer 429 over the insulating layer 428.

In the case where an oxide semiconductor is used for the semiconductor layer 416, a material that is capable of removing oxygen from part of the semiconductor layer 416 to generate oxygen vacancies is preferably used at least for regions of the electrodes 417*a* and 417*b* that are in contact with the semiconductor layer 416. The carrier concentration of the regions of the semiconductor layer 416 in which oxygen vacancies are generated is increased, so that the regions become n-type regions ($n^+$ layers). Accordingly, the regions can function as a source region and a drain region. Examples of the material which is capable of removing oxygen from the oxide semiconductor to generate oxygen vacancies include tungsten and titanium.

Formation of the source region and the drain region in the semiconductor layer 416 makes it possible to reduce contact resistance between the semiconductor layer 416 and each of the electrodes 417*a* and 417*b*. Accordingly, the electrical characteristics of the transistor, such as the field-effect mobility and the threshold voltage, can be favorable.

In the case where a semiconductor such as silicon is used for the semiconductor layer 416, a layer that functions as an n-type semiconductor or a p-type semiconductor is preferably provided between the semiconductor layer 416 and the electrode 417*a* and between the semiconductor layer 416 and the electrode 417*b*. The layer that functions as an n-type semiconductor or a p-type semiconductor can function as a source region or a drain region in a transistor.

The insulating layer 429 is preferably formed using a material that can prevent or reduce diffusion of impurities into the transistor from the outside. The formation of the insulating layer 429 may also be omitted.

When an oxide semiconductor is used for the semiconductor layer 416, heat treatment may be performed before and/or after the insulating layer 429 is formed. The heat treatment can fill oxygen vacancies in the semiconductor layer 416 by diffusing oxygen contained in the insulating layer 429 or other insulating layers into the semiconductor layer 416. Alternatively, the insulating layer 429 may be formed while the heat treatment is performed, so that oxygen vacancies in the semiconductor layer 416 can be filled.

A transistor 411 illustrated in FIG. 10A2 is different from the transistor 410 in that an electrode 418 that can function as a back gate is provided over the insulating layer 429. The electrode 418 can be formed using a material and a method similar to those of the electrode 415.

[Back Gate]

In general, the back gate is formed using a conductive layer. The gate and the back gate are positioned so that the channel formation region of a semiconductor layer is provided between the gate and the back gate. The back gate can function in a manner similar to that of the gate. The potential of the back gate may be the same as that of the gate electrode or may be a GND potential or a predetermined potential.

Figure 11:
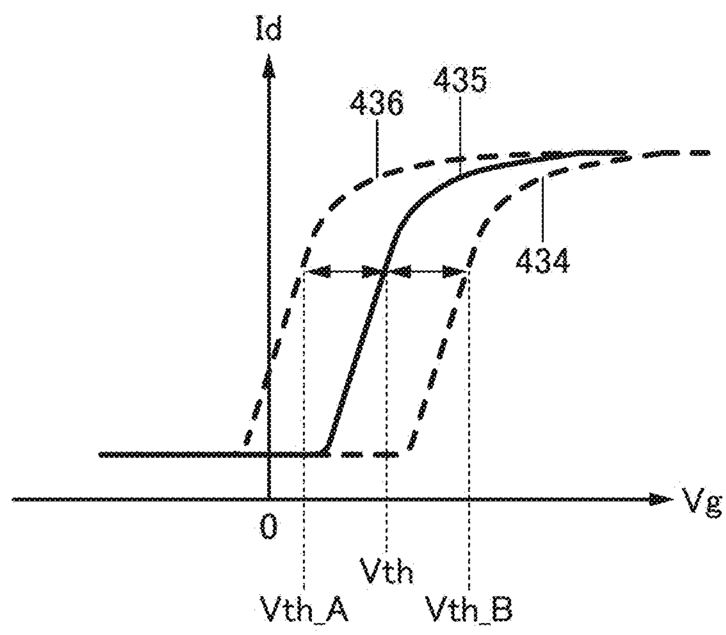
FIG. 11 illustrates an example of transistor characteristics.

By changing the potential of the back gate independently of the potential of the gate, the threshold voltage ($V_{th}$) of the transistor can be changed. FIG. 11 shows $I_d$-$V_g$ characteristics (also referred to as an "$I_d$-$V_g$ curve"), which are the electrical characteristics of a transistor. The horizontal axis of FIG. 11 represents a gate-source voltage ($V_g$) of a transistor. The vertical axis of FIG. 11 represents a current flowing through a drain ($I_d$) of the transistor. A solid line 435 represents an IA-$V_g$ curve at the time of supplying 0 V to a back gate.

A dashed line 436 represents an $I_d$-$V_g$ curve at the time of supplying a voltage higher than 0 V (positive voltage) to the back gate. The threshold voltage in the $I_d$-$V_g$ curve represented by the solid line 435 is denoted by $V_{th}$_A. When the positive voltage is supplied to the back gate, the $I_d$-$V_g$ curve shifts in the negative direction. The $V_{th}$ also shifts in the negative direction to be $V_{th}$_A.

A dashed line 434 represents an $I_d$-$V_g$ curve at the time of supplying a voltage lower than 0 V (negative voltage) to the back gate. The threshold voltage in the $I_d$-$V_g$ curve represented by the solid line 435 is denoted by $V_{th}$_B. When the negative voltage is supplied to the back gate, the $I_d$-$V_g$ curve shifts in the positive direction. The $V_{th}$ also shifts in the positive direction to be $V_{th}$_B.

The electrode 415 and the electrode 418 can each function as a gate. Thus, the insulating layers 426, 428, and 429 can each serve as a gate insulating layer. The electrode 418 may also be provided between the insulating layers 428 and 429.

In the case where one of the electrode 415 and the electrode 418 is simply referred to as a "gate" or a "gate electrode", the other can be referred to as a "back gate" or a "back gate electrode". For example, in the transistor 411, in the case where the electrode 418 is referred to as a "gate electrode", the electrode 415 is referred to as a "back gate electrode". In the case where the electrode 418 is used as a "gate electrode", the transistor 411 can be regarded as a kind of top-gate transistor. Alternatively, one of the electrodes 415 and 418 may be referred to as a "first gate" or a "first gate electrode", and the other may be referred to as a "second gate" or a "second gate electrode". Alternatively, in the case where one of the electrodes 415 and 418 is referred to as a "back gate" or a "back gate electrode", the other may be referred to as a "front gate", a "front gate electrode", a "top gate", or a "top gate electrode", By providing the electrode 415 and the electrode 418 with the semiconductor layer 416 provided therebetween and setting the potentials of the electrode 415 and the electrode 418 to be the same, a region of the semiconductor layer 416 through which carriers flow is enlarged in the film thickness direction; thus, the number of transferred carriers is increased. As a result, the on-state current and field-effect mobility of the transistor 411 are increased.

Therefore, the transistor 411 has large on-state current for the area occupied thereby. That is, the area occupied by the transistor 411 can be small for required on-state current. With one embodiment of the present invention, the area occupied by a transistor can be reduced. Therefore, with one embodiment of the present invention, a semiconductor device having a high degree of integration can be provided.

Furthermore, the gate and the back gate are formed using conductive layers and thus each have a function of preventing an electric field generated outside the transistor from influencing the semiconductor layer in which the channel is formed (in particular, an electric field blocking function against static electricity and the like). When the back gate is formed larger than the semiconductor layer such that the semiconductor layer is covered with the back gate, the electric field blocking function can be enhanced.

Since the electrode 415 (gate) and the electrode 418 (back gate) each have a function of blocking an electric field from the outside, electric charge of charged particles and the like generated on the insulating layer 472 side or above the electrode 418 do not influence the channel formation region in the semiconductor layer 416. Thus, degradation induced by a stress test (e.g., a negative gate bias temperature (NGBT) stress test where negative charge is applied to a gate (this stress test is also referred to as NBT or NBTS)) can be reduced. Furthermore, variation in gate voltage (rising voltage) at which on-state current starts flowing at different drain voltages can be reduced. Note that this effect is obtained when the electrodes 415 and 418 have the same potential or different potentials.

Before and after a positive GBT (PGBT) stress test where positive electric charge is applied to a gate (this stress test is also referred to as PBT or PBTS)), a transistor including a back gate has a smaller change in threshold voltage than a transistor including no back gate.

The BT stress test such as NGBT or PGBT is a kind of accelerated test and can evaluate, in a short time, a change by long-term use (i.e., a change over time) in characteristics of transistors. In particular, the amount of change in threshold voltage of the transistor before and after the BT stress test is an important indicator to examine the reliability of the transistor. As the change in the threshold voltage is smaller, the transistor has higher reliability.

By providing the electrodes 415 and 418 and setting the potentials of the electrodes 415 and 418 to be the same, the amount of change in threshold voltage is reduced. Accordingly, variation in electrical characteristics among a plurality of transistors is also reduced.

When the back gate is formed using a light-blocking conductive film, light can be prevented from entering the semiconductor layer from the back gate side. Therefore, light deterioration of the semiconductor layer can be prevented and deterioration in electrical characteristics of the transistor, such as a shift of the threshold voltage, can be prevented.

With one embodiment of the present invention, a transistor with high reliability can be provided. Moreover, a pulse output circuit, a semiconductor device, or the like with high reliability can be provided.

FIG. 10B1 is a cross-sectional view of a channel-protective transistor 420 that is a kind of bottom-gate transistor. The transistor 420 has substantially the same structure as the transistor 410 but is different from the transistor 410 in that the insulating layer 422 having openings 414*a* and 414*b* covers the semiconductor layer 416. The openings 414*a* and 414*b* are formed by selectively removing part of the insulating layer 422 which overlaps with the semiconductor layer 416.

The semiconductor layer 416 is electrically connected to the electrode 417*a* in the opening 414*a*. Furthermore, the semiconductor layer 416 is electrically connected to the electrode 417*b* in the opening 414*b*. With the insulating layer 422, the semiconductor layer 416 can be prevented from being exposed at the time of forming the electrodes 417*a* and 417*b*. Thus, the semiconductor layer 416 can be prevented from being reduced in thickness at the time of forming the electrode 417*a* and the electrode 417*b*. A region of the insulating layer 422 which overlaps with the channel formation region can function as a channel protective layer.

A transistor 421 in FIG. 10B2 is different from the transistor 420 in that the electrode 418 that can function as a back gate is provided over the insulating layer 429.

The distance between the electrodes 417*a* and 415 and the distance between the electrodes 417*b* and 415 in the transistors 420 and 421 are longer than those in the transistors 410 and 411. Thus, parasitic capacitance generated between the electrodes 417*a* and 415 can be reduced. Furthermore, parasitic capacitance generated between the electrodes 417*b* and 415 can be reduced. According to one embodiment of the present invention, a transistor with favorable electrical characteristics can be provided.

A transistor 425 in FIG. 10C1 is a channel-etched transistor that is a kind of bottom-gate transistor. In the transistor 425, the insulating layer 422 is not provided and the electrodes 417*a* and 417*b* are formed to be in contact with the semiconductor layer 416. Thus, part of the semiconductor layer 416 that is exposed when the electrodes 417*a* and 417*b* are formed is etched in some cases. However, since the insulating layer 422 is not provided, productivity of the transistor can be increased.

A transistor 426 in FIG. 10C2 is different from the transistor 425 in that the electrode 418 that can function as a back gate is provided over the insulating layer 429.

[Top-Gate Transistor]

FIG. 12A1 is a cross-sectional view of a transistor 430 that is a kind of top-gate transistor. The transistor 430 includes the semiconductor layer 416 over the substrate 471 with the insulating layer 472 positioned therebetween, the electrodes 417*a* and 417*b* that are over the semiconductor layer 416 and the insulating layer 472 and in contact with part of the semiconductor layer 416, the insulating layer 426 over the semiconductor layer 416 and the electrodes 417*a* and 417*b*, and the electrode 415 over the insulating layer 426.

Since the electrode 415 overlaps with neither the electrode 417*a* nor the electrode 417*b* in the transistor 430, parasitic capacitance generated between the electrodes 415 and 417*a* and parasitic capacitance generated between the electrodes 415 and 417*b* can be reduced. After the formation of the electrode 415, an impurity 455 is introduced into the semiconductor layer 416 using the electrode 415 as a mask, so that an impurity region can be formed in the semiconductor layer 416 in a self-aligned manner (see FIG. 12A3). According to one embodiment of the present invention, a transistor with favorable electrical characteristics can be provided.

The impurity 455 can be introduced with an ion implantation apparatus, an ion doping apparatus, or a plasma treatment apparatus.

As the impurity 455, for example, at least one kind of element of Group 13 elements and Group 15 elements can be used. In the case where an oxide semiconductor is used for the semiconductor layer 416, it is possible to use at least one kind of element of a rare gas, hydrogen, and nitrogen as the impurity 455.

A transistor 431 in FIG. 12A2 is different from the transistor 430 in that the electrode 418 and an insulating layer 447 are included. The transistor 431 includes the electrode 418 formed over the insulating layer 472 and the insulating layer 447 formed over the electrode 418. The electrode 418 can function as a back gate. Thus, the insulating layer 447 can function as a gate insulating layer. The insulating layer 447 can be formed using a material and a method similar to those of the insulating layer 426.

Like the transistor 411, the transistor 431 has high on-state current for occupation area. That is, the area occupied by the transistor 431 can be small for required on-state current. According to one embodiment of the present invention, the area occupied by a transistor can be reduced. Therefore, according to one embodiment of the present invention, a highly integrated semiconductor device can be provided.

A transistor 440 illustrated in FIG. 12B1 is a kind of top-gate transistor. The transistor 440 is different from the transistor 430 in that the semiconductor layer 416 is formed after the formation of the electrodes 417*a* and 417*b*. A transistor 441 illustrated in FIG. 12B2 is different from the transistor 440 in that the electrode 418 and the insulating layer 447 are included. Thus, in the transistors 440 and 441, part of the semiconductor layer 416 is formed over the electrode 417*a* and another part of the semiconductor layer 416 is formed over the electrode 417*b*.

The transistor 441 as well as the transistor 411 has a high on-state current for its area. That is, the area occupied by the transistor 441 can be small for required on-state current. With one embodiment of the present invention, the area occupied by a transistor can be reduced. Therefore, a semiconductor device having a high degree of integration can be provided.

A transistor 442 illustrated in FIG. 13A1 is a kind of top-gate transistor. The transistor 442 includes the electrodes 417*a* and 417*b* over the insulating layer 429. The electrodes 417*a* and 417*b* are electrically connected to the semiconductor layer 416 in openings formed in the insulating layers 428 and 429.

Part of the insulating layer 426 that does not overlap with the electrode 415 is removed. The insulating layer 426 included in the transistor 442 is partly extended across the ends of the electrode 415.

The impurity 455 is added to the semiconductor layer 416 using the electrode 415 and the insulating layer 426 as masks, so that an impurity region can be formed in the semiconductor layer 416 in a self-aligned manner (see FIG. 13A3).

At this time, the impurity 455 is not added to the semiconductor layer 416 in a region that overlaps with the electrode 415, and the impurity 455 is added to the semiconductor layer 416 in a region that does not overlap with the electrode 415. The semiconductor layer 416 in a region to which the impurity 455 is added through the insulating layer 426 has a lower impurity concentration than the semiconductor layer 416 in a region to which the impurity 455 is added without the insulating layer 426. Thus, a lightly doped drain (LDD) region is formed in the semiconductor layer 416 in a region adjacent to the electrode 415.

A transistor 443 in FIG. 13A2 is different from the transistor 442 in that the electrode 418 is provided below the semiconductor layer 416. The electrode 418 and the semiconductor layer 416 overlap with each other with the insulating layer 472 positioned therebetween. The electrode 418 can function as a back gate electrode.

As in a transistor 444 in FIG. 13B1 and a transistor 445 in FIG. 13B2, the insulating layer 426 in a region that does not overlap with the electrode 415 may be wholly removed. Alternatively, as in a transistor 446 in FIG. 13C1 and a transistor 447 in FIG. 13C2, the insulating layer 426 except for the openings may be left without being removed.

In the transistors 444 to 447, after the formation of the electrode 415, the impurity 455 is added to the semiconductor layer 416 using the electrode 415 as a mask, so that an impurity region can be formed in the semiconductor layer 416 in a self-aligned manner.

[S-Channel Transistor]

Figure 14A:
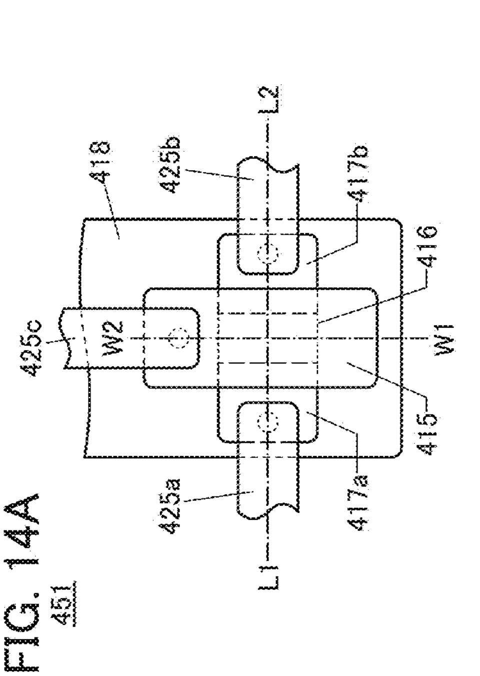
FIGS. 14A to 14C illustrate an example of a transistor.
Figure 14B:
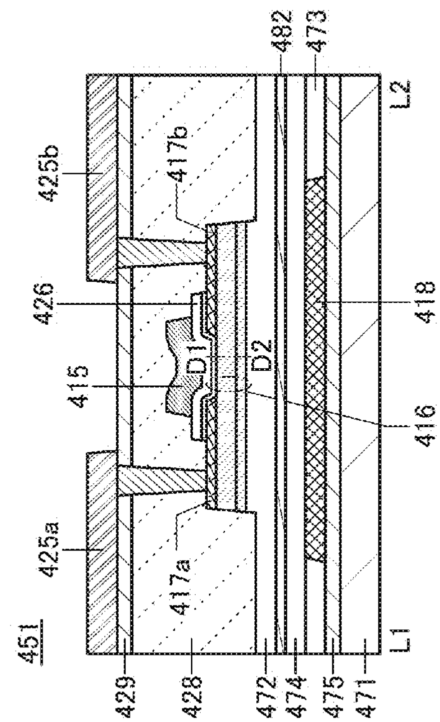
Figure 14C:
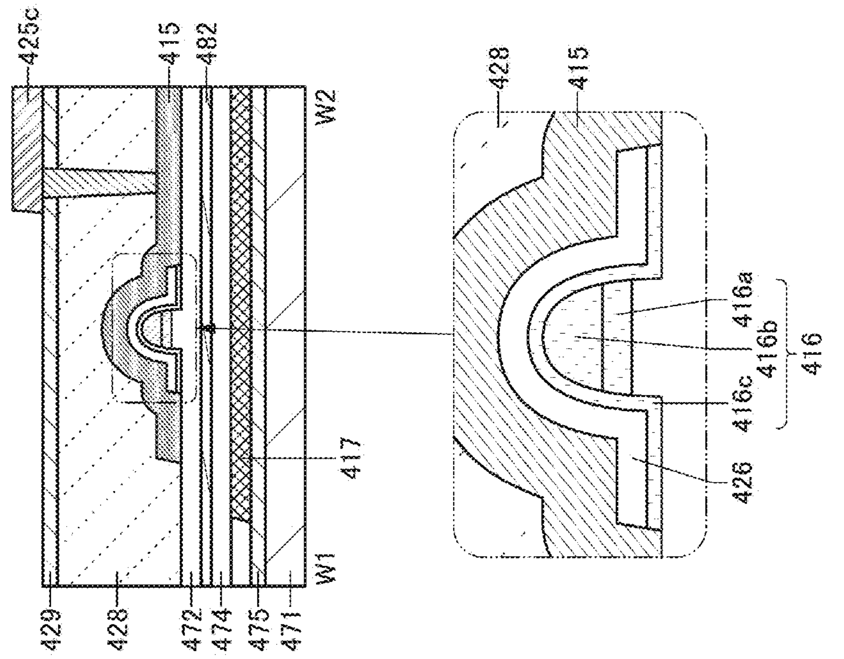

FIGS. 14A to 14C illustrate an example of a structure of a transistor including an oxide semiconductor for the semiconductor layer 416. FIG. 14A is a top view of a transistor 451. FIG. 14B is a cross-sectional view (in the channel length direction) of a portion along the dashed-dotted line L1-L2 in FIG. 14A. FIG. 14C is a cross-sectional view (in the channel width direction) of a portion along the dashed-dotted line W1-W2 in FIG. 14A.

The transistor 451 includes the semiconductor layer 416, the insulating layer 426, the insulating layer 472, an insulating layer 482, an insulating layer 474, an electrode 418, an electrode 415, the electrode 417*a*, and the electrode 417*b*. The electrode 415 can function as a gate, and the electrode 418 can function as a back gate. The insulating layer 426, the insulating layer 472, the insulating layer 482, and the insulating layer 474 each can function as a gate insulating layer. The electrode 417*a* can function as one of a source electrode and a drain electrode. The electrode 417*b* can function as the other of the source electrode and the drain electrode.

An insulating layer 475 is provided over the substrate 471, and the electrode 418 and an insulating layer 473 are provided over the insulating layer 475. Over the electrode 418 and the insulating layer 473, the insulating layer 474 is provided. The insulating layer 482 is provided over the insulating layer 474, and the insulating layer 472 is provided over the insulating layer 482.

A semiconductor layer 416*a* is provided over a projection formed in the insulating layer 472, and a semiconductor layer 416*b* is provided over the semiconductor layer 416*a*. The electrode 417*a* and the electrode 417*b* are provided over the semiconductor layer 416*b*. A region in the semiconductor layer 416*b* which overlaps with the electrode 417*a* can function as one of a source and a drain of the transistor 451. A region in the semiconductor layer 416*b* which overlaps with the electrode 417*b* can function as the other of the source and the drain of the transistor 451.

In addition, a semiconductor layer 416*c* is provided to be in contact with part of the semiconductor layer 416*b*. The insulating layer 426 is provided over the semiconductor layer 416*c*, and the electrode 415 is provided over the insulating layer 426.

The transistor 451 has a structure in which a top surface and side surfaces of the semiconductor layer 416*b* and side surfaces of the semiconductor layer 416*a* are covered with the semiconductor layer 416*c* in the portion along W1-W2. With the semiconductor layer 416*b* provided on the projection of the insulating layer 472, the side surface of the semiconductor layer 416*b* can be covered with the electrode 415. Thus, the transistor 451 has a structure in which the semiconductor layer 416*b* can be electrically surrounded by electric field of the electrode 415. In this way, the structure of a transistor in which the semiconductor layer in which the channel is formed is electrically surrounded by the electric field of the conductive film is called a surrounded channel (s-channel) structure. A transistor having an s-channel structure is referred to as an s-channel transistor.

In the s-channel structure, a channel can be formed in the whole (bulk) of the semiconductor layer 416*b*. In the s-channel structure, the drain current of the transistor is increased, so that a larger amount of on-state current can be obtained. Furthermore, the entire channel formation region of the semiconductor layer 416*b* can be depleted by the electric field of the electrode 415. Accordingly, off-state current of the transistor with an s-channel structure can be further reduced.

When the projection of the insulating layer 472 is increased in height, and the channel width is shortened, the effects of the s-channel structure for increasing the on-state current and reducing the off-state current can be enhanced. Part of the semiconductor layer 416*a* exposed in the formation of the semiconductor layer 416*b* may be removed. In this case, the side surfaces of the semiconductor layer 416*a* and the semiconductor layer 416*b* may be aligned to each other.

The insulating layer 428 is provided over the transistor 451 and the insulating layer 429 is provided over the insulating layer 428. An electrode 425*a*, an electrode 425*b*, an electrode 425*c* are provided over the insulating layer 429. The electrode 425*a* is electrically connected to the electrode 417*a* via a contact plug through an opening in the insulating layer 429 and the insulating layer 428. The electrode 425*b* is electrically connected to the electrode 417*b* via a contact plug through an opening in the insulating layer 429 and the insulating layer 428. The electrode 425*c* is electrically connected to the electrode 415 via a contact plug through an opening in the insulating layer 429 and the insulating layer 428.

Note that when the insulating layer 482 is formed using hafnium oxide, aluminum oxide, tantalum oxide, aluminum silicate, or the like, the insulating layer 482 can function as a charge trap layer. The threshold voltage of the transistor can be changed by injecting electrons into the insulating layer 482. For example, the injection of electrons into the insulating layer 482 can be performed with use of the tunnel effect. By applying a positive voltage to the electrode 418, tunnel electrons can be injected into the insulating layer 482.

<Energy Band Structure of Stacked Semiconductor Layers>

[Energy Band Structure (1) of Semiconductor Layer 416]

Figure 23A:
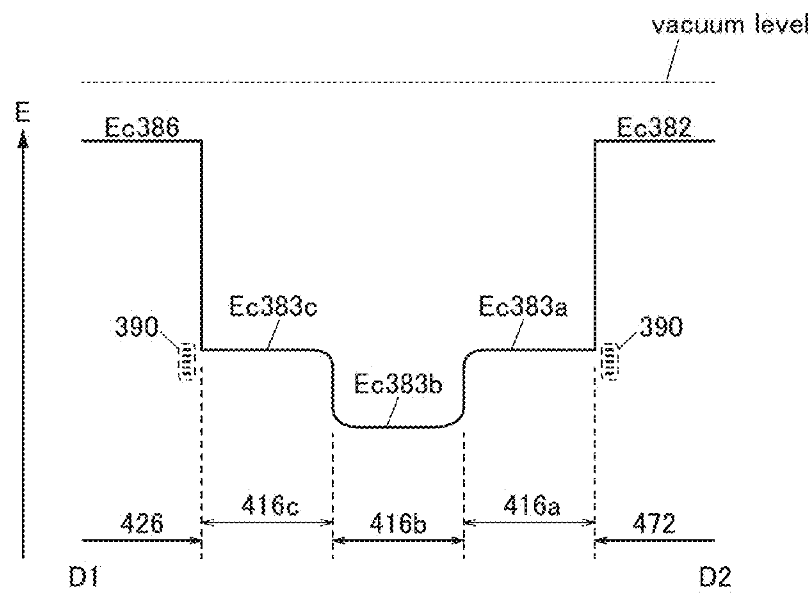
FIGS. 23A and 23B each illustrate an energy band structure.

The function and effect of the semiconductor layer 416 that is a stacked layer including the semiconductor layers 416*a*, 416*b*, and 416*c* each formed using an oxide semiconductor are described with an energy band structure diagram shown in FIG. 23A. FIG. 23A illustrates the energy band structure of a portion along the dashed-dotted line D1-D2 in FIG. 14B. In other words, FIG. 23A illustrates the energy band structure of a channel formation region of the transistor 451.

In FIG. 23A, Ec382, Ec383*a*, Ec383*b*, Ec383*c*, and Ec386 are the energies of bottoms of the conduction band in the insulating layer 472, the semiconductor layer 416*a*, the semiconductor layer 416*b*, the semiconductor layer 416*c*, and the insulating layer 426, respectively.

Here, an electron affinity corresponds to a value obtained by subtracting a band gap from a difference in energy between the vacuum level and the valence band maximum (the difference is also referred to as "ionization potential"). Note that the band gap can be measured using a spectroscopic ellipsometer (UT-300 manufactured by HORIBA JOBIN YVON). The energy difference between the vacuum level and the valence band maximum can be measured using an ultraviolet photoelectron spectroscopy (UPS) device (VersaProbe manufactured by ULVAC-PHI, Inc.).

In the case of an In—Ga—Zn oxide formed using a target whose atomic ratio is In:Ga:Zn=1:3:2, the band gap is about 3.5 eV, and the electron affinity is about 4.5 eV. In the case of an In—Ga—Zn oxide formed using a target whose atomic ratio is In:Ga:Zn=1:3:4, the band gap is about 3.4 eV, and the electron affinity is about 4.5 eV. In the case of an In—Ga—Zn oxide formed using a target whose atomic ratio is In:Ga:Zn=1:3:6, the band gap is about 3.3 eV, and the electron affinity is about 4.5 eV. In the case of an In—Ga—Zn oxide formed using a target whose atomic ratio is In:Ga:Zn=1:6:2, the band gap is about 3.9 eV, and the electron affinity is about 4.3 eV. In the case of an In—Ga—Zn oxide formed using a target whose atomic ratio is In:Ga:Zn=1:6:8, the band gap is about 3.5 eV, and the electron affinity is about 4.4 eV. In the case of an In—Ga—Zn oxide formed using a target whose atomic ratio is In:Ga:Zn=1:6:10, the band gap is about 3.5 eV, and the electron affinity is about 4.5 eV. In the case of an In—Ga—Zn oxide formed using a target whose atomic ratio is In:Ga:Zn=1:1:1, the band gap is about 3.2 eV, and the electron affinity is about 4.7 eV. In the case of an In—Ga—Zn oxide formed using a target whose atomic ratio is In:Ga:Zn=3:1:2, the band gap is about 2.8 eV, and the electron affinity is about 5.0 eV Since the insulating layer 472 and the insulating layer 426 are insulators, Ec382 and Ec386 are closer to the vacuum level (have a smaller electron affinity) than Ec383*a*, Ec383*b*, and Ec383*c*.

Further, Ec383*a* is closer to the vacuum level than Ec383*b* is. Specifically, Ec383*a* is preferably located closer to the vacuum level than Ec383*b* by greater than or equal to 0.07 eV and less than or equal to 1.3 eV, further preferably greater than or equal to 0.1 eV and less than or equal to 0.7 eV, still further preferably greater than or equal to 0.15 eV and less than or equal to 0.4 eV Further, Ec383*c* is closer to the vacuum level than Ec383*b* is. Specifically, Ec383*c* is preferably located closer to the vacuum level than Ec383*b* by greater than or equal to 0.07 eV and less than or equal to 1.3 eV, further preferably greater than or equal to 0.1 eV and less than or equal to 0.7 eV, still further preferably greater than or equal to 0.15 eV and less than or equal to 0.4 eV Here, a mixed region of the semiconductor layer 416*a* and the semiconductor layer 416*b* exists between the semiconductor layer 416*a* and the semiconductor layer 416*b* in some cases. In addition, a mixed region of the semiconductor layer 416*b* and the semiconductor layer 416*c* exists between the semiconductor layer 416*b* and the semiconductor layer 416*c* in some cases. The mixed region has a low density of interface states. For that reason, the stack including the semiconductor layers 416*a*, 416*b*, and 416*c* has a band structure where energy at each interface and in the vicinity of the interface is changed continuously (continuous junction).

In this state, electrons move mainly in the semiconductor layer 416*b*, not in the semiconductor layers 416*a* and 416*c*. Thus, when the interface state density at the interface between the semiconductor layer 416*a* and the semiconductor layer 416*b* and the interface state density at the interface between the semiconductor layer 416*b* and the semiconductor layer 416*c* are decreased, the on-state current of the transistor 451 can be increased.

Note that although trap states 390 due to impurities or defects might be formed in the vicinity of the interface between the semiconductor layer 416*a* and the insulating layer 472 and in the vicinity of the interface between the semiconductor layer 416*c* and the insulating layer 426, the semiconductor layer 416*b* can be apart from the trap states owing to the existence of the semiconductor layer 416*a* and the semiconductor layer 416*c*.

In the case where the transistor 451 has an s-channel structure, a channel is formed in the whole of the semiconductor layer 416*b* seen in the portion along W1-W2. Therefore, as the thickness of the semiconductor layer 416*b* is increased, the size of the channel region is increased. In other words, as the thickness of the semiconductor layer 416*b* is increased, the on-state current of the transistor 451 can be increased. For example, the semiconductor layer 416*b* has a region with a thickness greater than or equal to 10 nm, preferably greater than or equal to 40 nm, further preferably greater than or equal to 60 nm, still further preferably greater than or equal to 100 nm. Note that the semiconductor layer 416*b* has a region with a thickness of, for example, less than or equal to 300 nm, preferably less than or equal to 200 nm, or further preferably less than or equal to 150 nm because the productivity of the semiconductor device including the transistor 451 might be decreased. In some cases, when the channel formation region is reduced in size, the electrical characteristics of the transistor with a smaller thickness of the semiconductor layer 416*b* are higher than those of the transistor with a larger thickness of the semiconductor layer 416*b*. Therefore, the semiconductor layer 416*b* may have a thickness less than 10 nm.

Moreover, the thickness of the semiconductor layer 416*c* is preferably as small as possible to increase the on-state current of the transistor 451. For example, the semiconductor layer 416*c* may have a region with a thickness less than 10 nm, preferably less than or equal to 5 nm, and further preferably less than or equal to 3 nm. Meanwhile, the semiconductor layer 416*c* has a function of blocking entry of elements other than oxygen (such as hydrogen and silicon) included in the adjacent insulator into the semiconductor layer 416*b* where a channel is formed. For this reason, it is preferable that the semiconductor layer 416*c* have a certain thickness. The semiconductor layer 416*c* may have a region with a thickness greater than or equal to 0.3 nm, preferably greater than or equal to 1 nm, further preferably greater than or equal to 2 nm, for example.

To improve the reliability, preferably, the thickness of the semiconductor layer 416*a* is large and the thickness of the semiconductor layer 416*c* is small. For example, the semiconductor layer 416*a* may have a region with a thickness greater than or equal to 10 nm, preferably greater than or equal to 20 nm, further preferably greater than or equal to 40 nm, still further preferably greater than or equal to 60 nm. When the thickness of the semiconductor layer 416*a* is made large, a distance from an interface between the adjacent insulator and the semiconductor layer 416*a* to the semiconductor layer 416*b* in which a channel is formed can be large. Since the productivity of the semiconductor device including the transistor 451 might be decreased, the semiconductor layer 416*a* has a region with a thickness, for example, less than or equal to 200 nm, preferably less than or equal to 120 nm, or further preferably less than or equal to 80 nm.

Note that silicon contained in the oxide semiconductor might serve as a carrier trap or a carrier generation source. Therefore, the silicon concentration in the semiconductor layer 416*b* is preferably as low as possible. For example, a region with the silicon concentration lower than $1\times10^{19}$ atoms/cm$^3$, preferably lower than $5\times10^{18}$ atoms/cm$^3$, or further preferably lower than $2\times10^{18}$ atoms/cm$^3$ which is measured by secondary ion mass spectrometry (SIMS) is provided between the semiconductor layer 416*b* and the semiconductor layer 416*a*. A region with the silicon concentration of lower than $1\times10^{19}$ atoms/cm$^3$, preferably lower than $5\times10^{18}$ atoms/cm$^3$, further preferably lower than $2\times10^{18}$ atoms/cm$^3$ which is measured by SIMS is provided between the semiconductor layer 416*b* and the semiconductor layer 416*c*.

It is preferable to reduce the concentrations of hydrogen in the semiconductor layer 416*a* and the semiconductor layer 416*c* in order to reduce the concentration of hydrogen in the semiconductor layer 416*b*. The semiconductor layer 416*a* and the semiconductor layer 416*c* each have a region in which the concentration of hydrogen measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the semiconductor layer 416*a* and the semiconductor layer 416*c* in order to reduce the concentration of nitrogen in the semiconductor layer 416*b*. The semiconductor layer 416*a* and the semiconductor layer 416*c* each have a region in which the concentration of nitrogen measured by SIMS is lower than $5\times10^{19}$ atoms/cm$^3$, preferably less than or equal to $5\times10^{18}$ atoms/cm$^3$, further preferably less than or equal to $1\times10^{18}$ atoms/cm$^3$, still further preferably less than or equal to $5\times10^{17}$ atoms/cm$^3$ Note that when copper enters the oxide semiconductor, an electron trap might be generated. The electron trap might shift the threshold voltage of the transistor in the positive direction. Therefore, the concentration of copper on the surface of or in the semiconductor layer 416*b* is preferably as low as possible. For example, the semiconductor layer 416*b* preferably has a region in which the concentration of copper is lower than or equal to $1\times10^{19}$ atoms/cm$^3$, lower than or equal to $5\times10^{18}$ atoms/cm$^3$, or lower than or equal to $1\times10^{18}$ atoms/cm$^3$.

The above three-layer structure is an example. For example, a two-layer structure without either one of the semiconductor layer 416*a* and the semiconductor layer 416*c* may be employed. A four-layer structure in which any one of the semiconductors described as examples of the semiconductor layer 416*a*, the semiconductor layer 416*b*, and the semiconductor layer 416*c* is provided below or over the semiconductor layer 416*a* or below or over the semiconductor layer 416*c* may be employed. An g-layer structure (g is an integer of 5 or more) may be included in which any one of the semiconductors described as examples of the semiconductor layers 416*a*, 416*b*, and 416*c* is provided at two or more of the following positions: over the semiconductor layer 416*a*, below the semiconductor layer 416*a*, over the semiconductor layer 416*c*, and below the semiconductor layer 416*c* may be employed.

In particular, in the transistor 451 described in this embodiment, an upper surface and a side surface of the semiconductor layer 416*b* are in contact with the semiconductor layer 416*c*, and a bottom surface of the semiconductor layer 416*b* is in contact with the semiconductor layer 416*a*. In this manner, the semiconductor layer 416*b* is surrounded by the semiconductor layer 416*a* and the semiconductor layer 416*c*, whereby the influence of the trap state can be further reduced.

Each of the band gaps of the semiconductor layer 416*a* and the semiconductor layer 416*c* is preferably larger than that of the semiconductor layer 416*b*.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

An oxide semiconductor has a band gap of 2 eV or more; therefore, a transistor including an oxide semiconductor in a semiconductor layer in which a channel is formed (the transistor is also referred to as "OS transistor") has an extremely small off-state current. Specifically, the off-state current per micrometer in channel width at room temperature (25° C.) and at a source-drain voltage of 3.5 V can be lower than $1\times10^{-20}$ A, lower than $1\times10^{-22}$ A, or lower than $1\times10^{-24}$ A. That is, the on/off ratio of the transistor can be greater than or equal to 20 digits and less than or equal to 150 digits. An OS transistor has high withstand voltage between its source and drain. With use of the OS transistor, a semiconductor device with high output voltage and high withstand voltage can be provided.

With one embodiment of the present invention, a transistor with low power consumption can be provided. Accordingly, a semiconductor device with low power consumption can be provided.

Figure 15C:
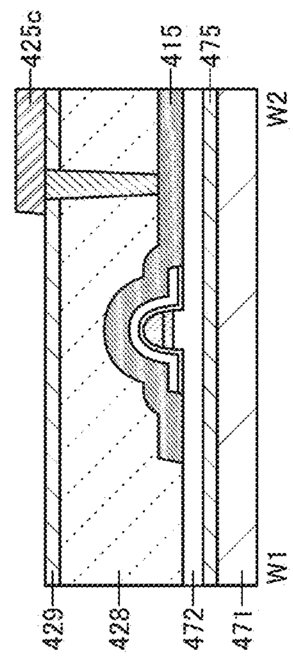
FIGS. 15A to 15C illustrate an example of a transistor.
Figure 15A:
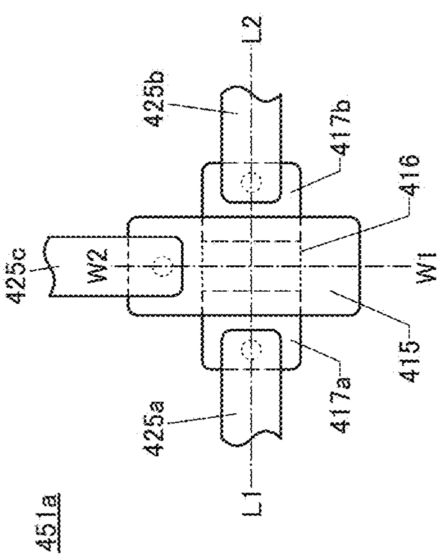
Figure 15B:
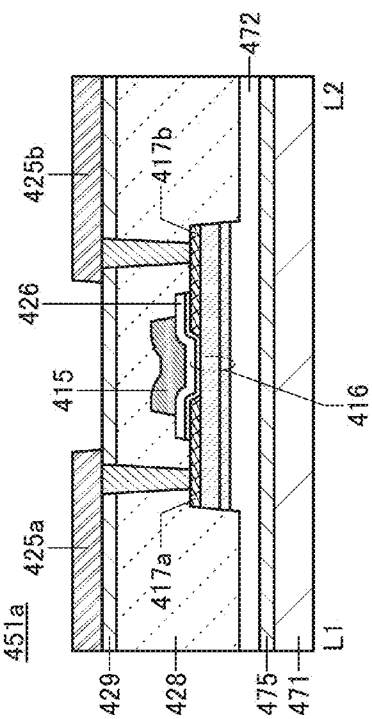

The electrode 418 that can function as a back gate is not necessary provided, depending on the purpose. FIG. 15A is a top view of a transistor 451*a*. FIG. 15B is a cross-sectional view of a portion indicated by the dashed-dotted line L1-L2 in FIG. 15A. FIG. 15C is a cross-sectional view of a portion indicated by the dashed-dotted line W1-W2 in FIG. 15A. The transistor 451*a* has a structure in which the electrode 418, the insulating layer 473, the insulating layer 474, and the insulating layer 482 are removed from the transistor 451. The productivity of transistor can be improved by omission of the electrode and insulating layer. Thus, the productivity of semiconductor device can be improved.

Figure 16A:
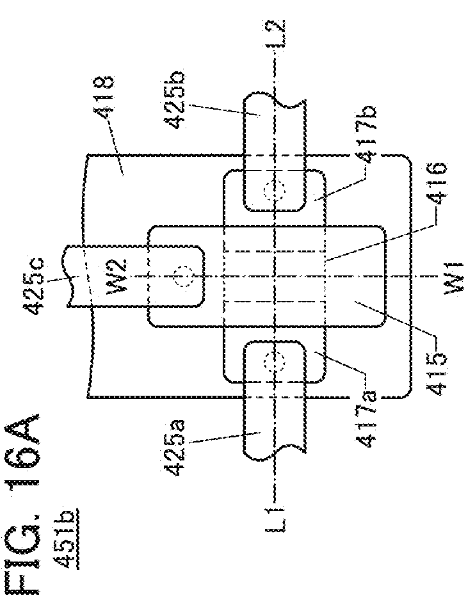
FIGS. 16A to 16E illustrate an example of a transistor.
Figure 16B:
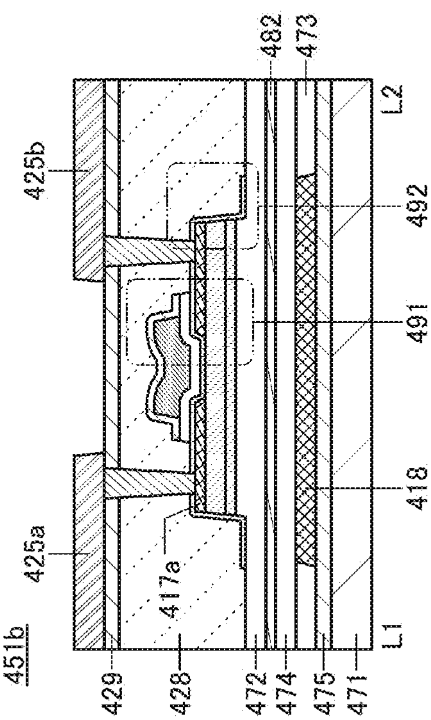
Figure 16C:
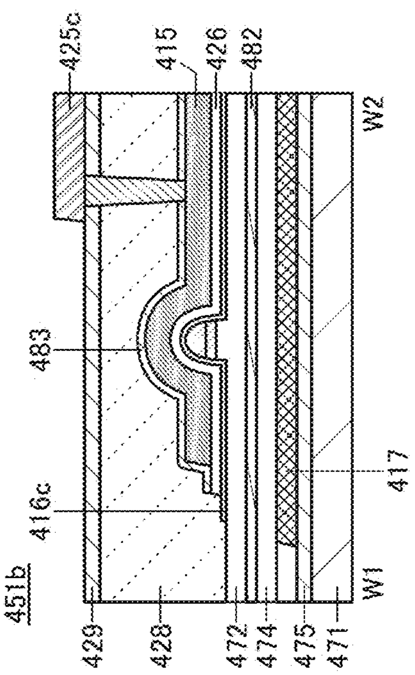
Figure 16D:
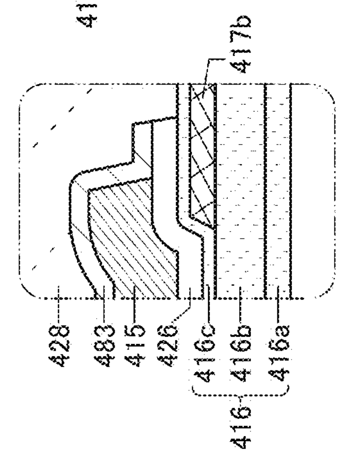
Figure 16E:
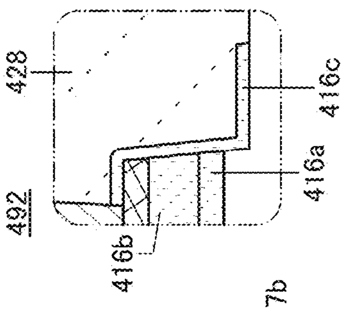

FIGS. 16A to 16E show a transistor 451*b* which has a structure different from that of the transistor 451. FIG. 16A is a top view of the transistor 451*b*. FIG. 16B is a cross-sectional view of a portion indicated by the dashed-dotted line L1-L2 in FIG. 16A. FIG. 16C is a cross-sectional view of a portion indicated by the dashed-dotted line W1-W2 in FIG. 16A. FIG. 16D is an enlarged view of a portion 491 in FIG. 16B. FIG. 16E is an enlarged view of a portion 492 in FIG. 16B.

The transistor 451*b* is different from the transistor 451 in that an insulating layer 483 is provided. The insulating layer 483 is provided over the electrode 415. The electrode 415 is covered with the insulating layer 483. The insulating layers 426 and 483 extend beyond an end portion of the electrode 415 and are in contact with each other in the extended portion. By covering the electrode 415 with the insulating layer 483, oxygen contained in the insulating layer 428 can be prevented from moving to the electrode 415. By forming the insulating layer 483 by an ALD method, oxidation of the electrode 415 at the formation of the insulating layer 483 can be prevented. The electrode 415 is electrically connected to the electrode 425*c* via a contact plug through an opening in the insulating layers 429, 428, and 483.

The transistor 451*b* is different from the transistor 451 in the shape of the semiconductor layer 416*c*. In the transistor 451*b*, the electrode 417*a*, the electrode 417*b*, the semiconductor layer 416*a*, and the semiconductor layer 416*b* are covered with the semiconductor layer 416*c*. In particular, it is preferable that a side surface of the semiconductor layer 416*b* be directly covered with the semiconductor layer 416*c*. By providing the semiconductor layer 416*c* in contact with the side surface of the semiconductor layer 416*b*, diffusion of elements other than oxygen (such as hydrogen and silicon) included in the adjacent insulator into the inside through the side surface of the semiconductor layer 416*b* can be prevented. Furthermore, outward diffusion of oxygen included in the semiconductor layer 416*b* can be suppressed.

At an interface between a semiconductor layer and an insulating layer or in the vicinity of the interface, trap states 390 due to impurities or defects are easily formed. By providing the semiconductor layer 416*c* between the side surface of the semiconductor layer 416*b* and the insulating layer 428, the side surface of the semiconductor layer 416*b* can be apart from the trap states. Thus, variation in electrical characteristics of the transistor can be reduced.

Figure 17A:
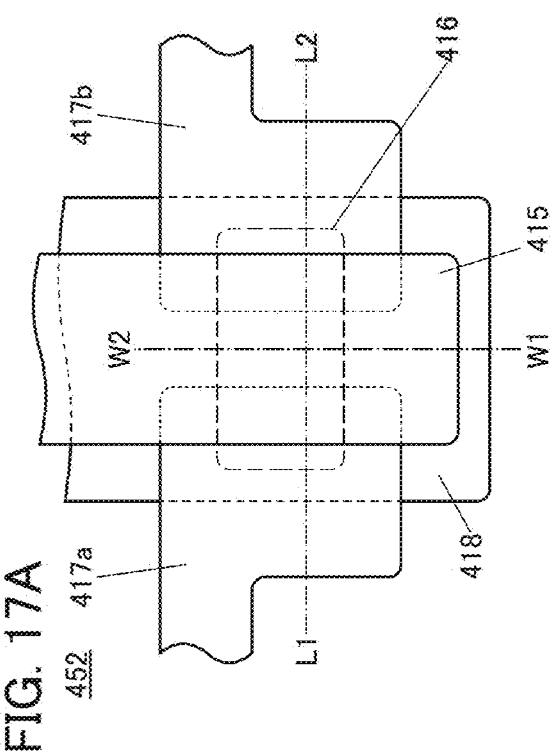
FIGS. 17A to 17C illustrate an example of a transistor.
Figure 17B:
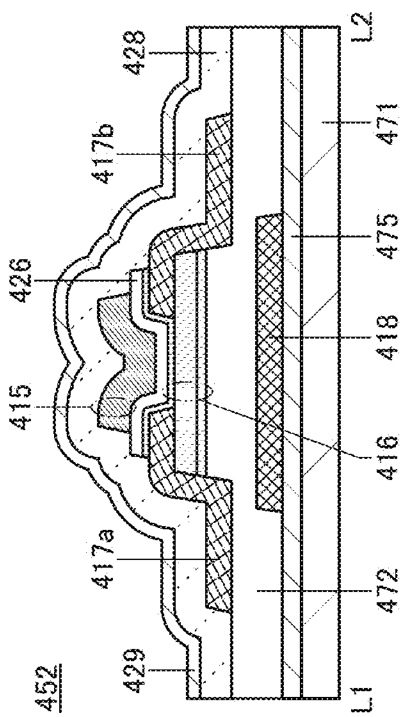
Figure 17C:
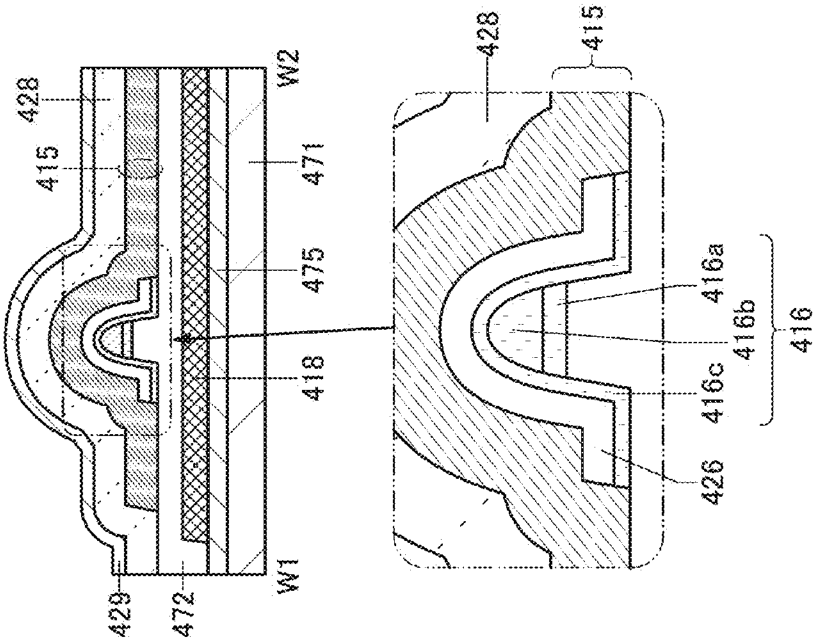

FIGS. 17A to 17C illustrate another example of an s-channel transistor. FIG. 17A is a top view of a transistor 452. FIG. 17B and FIG. 17C are cross-sectional views of portions indicated by the dashed-dotted line L1-L2 and the dashed-dotted line W1-W2 in FIG. 17A.

Although the transistor 452 has a structure similar to that of the transistor 451, there is a different point in that the electrode 417*a* and the electrode 417*b* are in contact with the side surfaces of the semiconductor layer 416*a* and the semiconductor layer 416*b*. As the insulating layer 428 covering the transistor 452, an insulating layer with a flat surface such as that in the transistor 451 may be used. In addition, the electrode 425*a*, the electrode 425*b*, and the electrode 425*c* may be provided over the insulating layer 429.

Figure 18A:
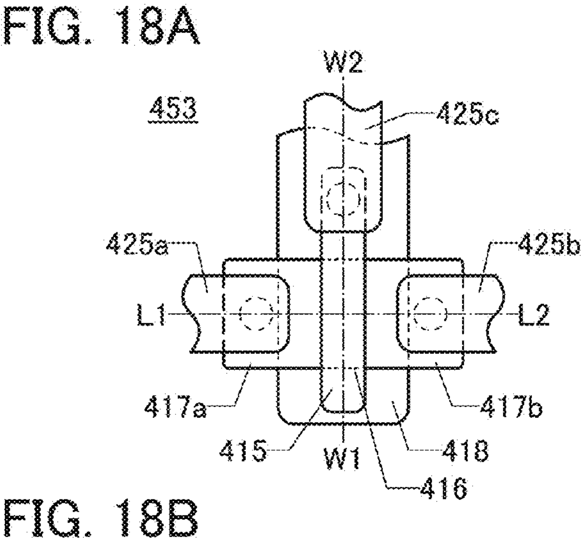
FIGS. 18A and 18B illustrate an example of a transistor.
Figure 18B:
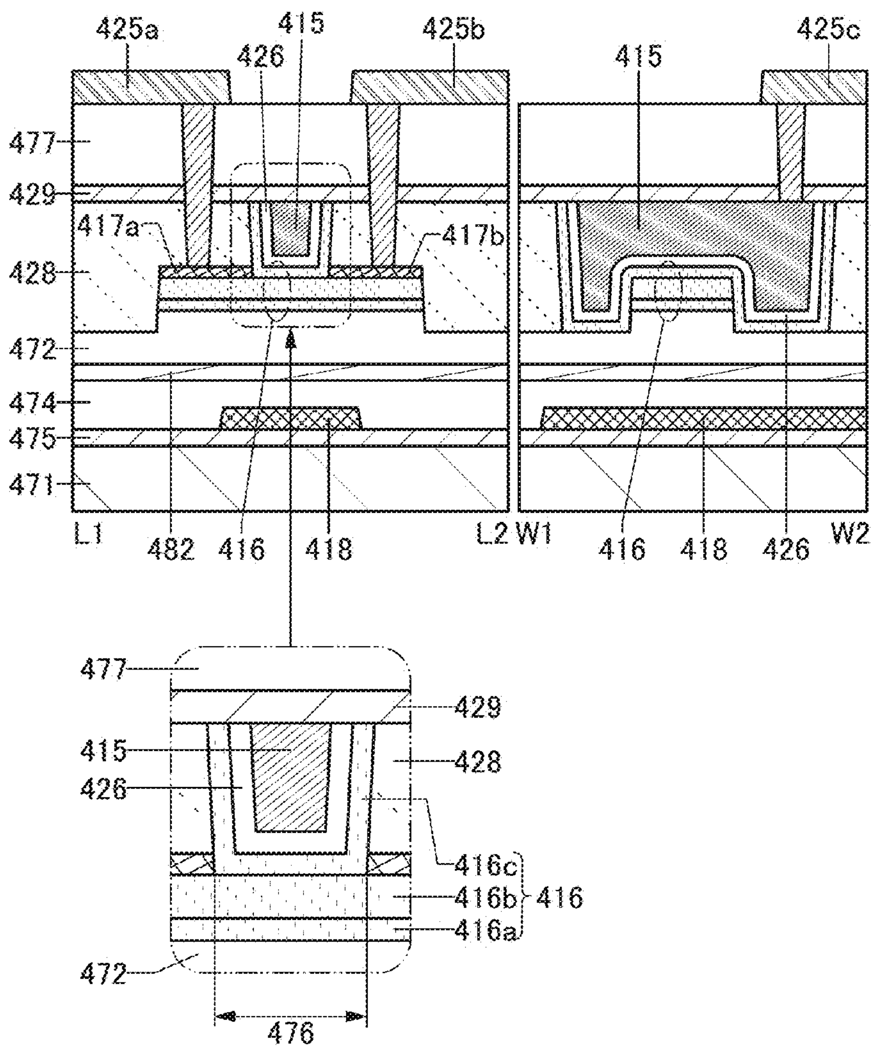

FIGS. 18A and 18B illustrate another example of an s-channel transistor. FIG. 18A is a top view of a transistor 453. FIG. 18B is a cross-sectional view of portions indicated by the dashed-dotted line L1-L2 and the dashed-dotted line W1-W2 in FIG. 18A. As in the transistor 451, the transistor 453 includes the semiconductor layer 416*a* and the semiconductor layer 416*b* over the projection of the insulating layer 472. The electrode 417*a* and the electrode 417*b* are provided over the semiconductor layer 416*b*. A region of the semiconductor layer 416*b* which overlaps with the electrode 417*a* can function as one of a source and a drain of the transistor 453. A region of the semiconductor layer 416*b* which overlaps with the electrode 417*b* can function as the other of the source and the drain of the transistor 453. Thus, a region 476 of the semiconductor layer 416*b* which is located between the electrode 417*a* and the electrode 417*b* can function as a channel formation region.

In the transistor 453, an opening is provided in a region overlapping with the region 476 by removing part of the insulating layer 428, and the semiconductor layer 416*c* is provided along a side and bottom surfaces of the opening. In the opening, the insulating layer 426 is provided along the side and bottom surfaces of the opening with the semiconductor layer 416*c* located therebetween. In addition, in the opening, the electrode 415 is provided along the side and bottom surfaces of the opening with the semiconductor layer 416*c* and the insulating layer 426 located therebetween.

Note that the opening is wider than the semiconductor layer 416*a* and the semiconductor layer 416*b* in the cross section in the channel width direction. Thus, in the region 476, side surfaces of the semiconductor layer 416*a* and the semiconductor layer 416*b* are covered with the semiconductor layer 416*c*.

The insulating layer 429 is provided over the insulating layer 428 and an insulating layer 477 is provided over the insulating layer 429. The electrode 425*a*, the electrode 425*b*, and the electrode 425*c* are provided over the insulating layer 477. The electrode 425*a* is electrically connected to the electrode 417*a* via a contact plug in an opening formed by removing part of the insulating layers 477, 429, and 428. The electrode 425*b* is electrically connected to the electrode 417*b* via a contact plug in an opening formed by removing part of the insulating layers 477, 429, and 428. The electrode 425*c* is electrically connected to the electrode 415 via a contact plug in an opening formed by removing part of the insulating layers 477 and 429.

Figure 19A:
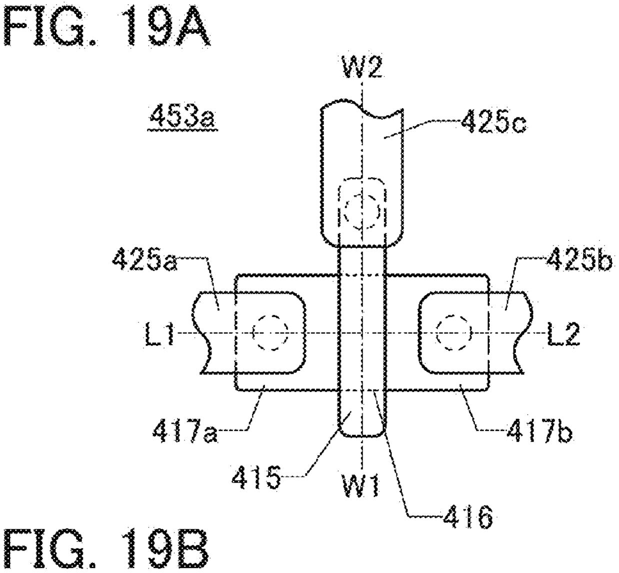
FIGS. 19A and 19B illustrate an example of a transistor.
Figure 19B:
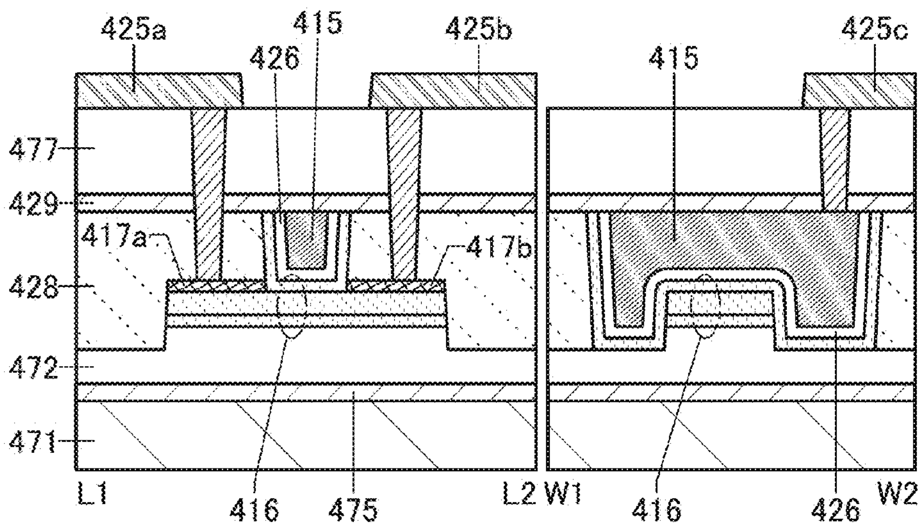

The electrode 418 that can function as a back gate is not necessarily provided, depending on the purpose. FIG. 19A is a top view of a transistor 453*a*. FIG. 19B is a cross-sectional view of portions indicated by the dashed-dotted line L1-L2 and the dashed-dotted line W1-W2 in FIG. 19A. The transistor 453*a* has a structure in which the electrode 418, the insulating layer 474, and the insulating layer 482 are removed from the transistor 453. The productivity of the transistor can be improved by omission of the electrode and the insulating layers. Accordingly, the productivity of the semiconductor device can be improved.

Figure 20C:
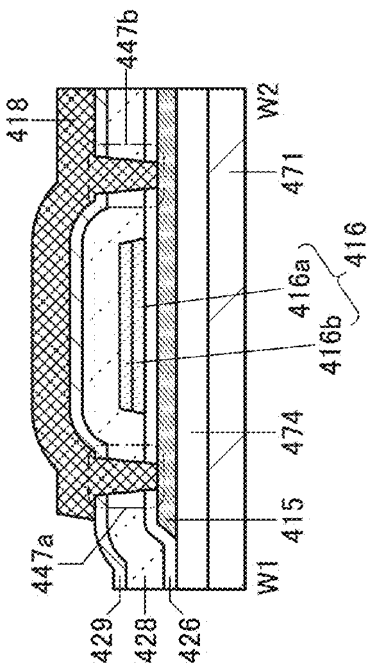
FIGS. 20A to 20C illustrate an example of a transistor.
Figure 20A:
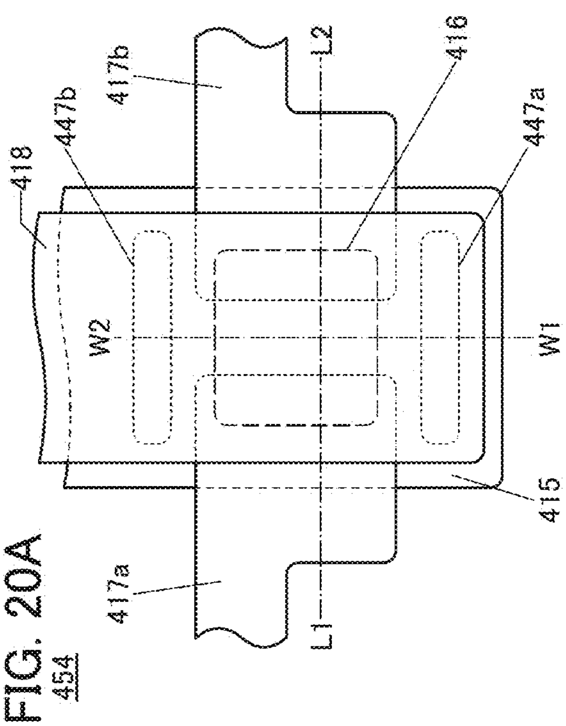
Figure 20B:
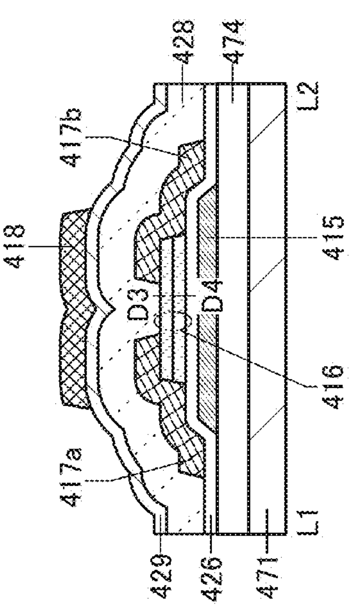

FIGS. 20A to 20C illustrate another example of an s-channel transistor. FIG. 20A is a top view of a transistor 454. FIG. 20B is a cross-sectional view of a portion indicated by the dashed-dotted line L1-L2 in FIG. 20A. FIG. 20C is a cross-sectional view of a portion indicated by the dashed-dotted line W1-W2 in FIG. 20A.

The transistor 454 is a kind of bottom-gate transistor having a back-gate electrode. In the transistor 454, the electrode 415 is formed over the insulating layer 474, and the insulating layer 426 is provided to cover the electrode 415. The semiconductor layer 416 is formed in a region that is over the insulating layer 426 and overlaps with the electrode 415. The semiconductor layer 416 in the transistor 454 has a stacked structure of the semiconductor layer 416*a* and the semiconductor layer 416*b*.

The electrode 417*a* and the electrode 417*b* are formed so as to be partly in contact with the semiconductor layer 416 and be over the insulating layer 426. The insulating layer 428 is formed so as to be partly in contact with the semiconductor layer 416 and be over the electrode 417*a* and the electrode 417*b*. The insulating layer 429 is formed over the insulating layer 428. The electrode 418 is formed in a region that is over the insulating layer 429 and overlaps with the semiconductor layer 416.

The electrode 418 provided over the insulating layer 429 is electrically connected to the electrode 415 in an opening 447*a* and an opening 447*b* provided in the insulating layer 429, the insulating layer 428, and the insulating layer 426. Accordingly, the same potential is supplied to the electrodes 418 and 415. Furthermore, either or both of the openings 447*a* and 447*b* may be omitted. In the case where neither the opening 447*a* nor the opening 447*b* is provided, different potentials can be supplied to the electrode 418 and the electrode 415.

[Energy Band Structure (2) of Semiconductor Layer 416]

Figure 23B:
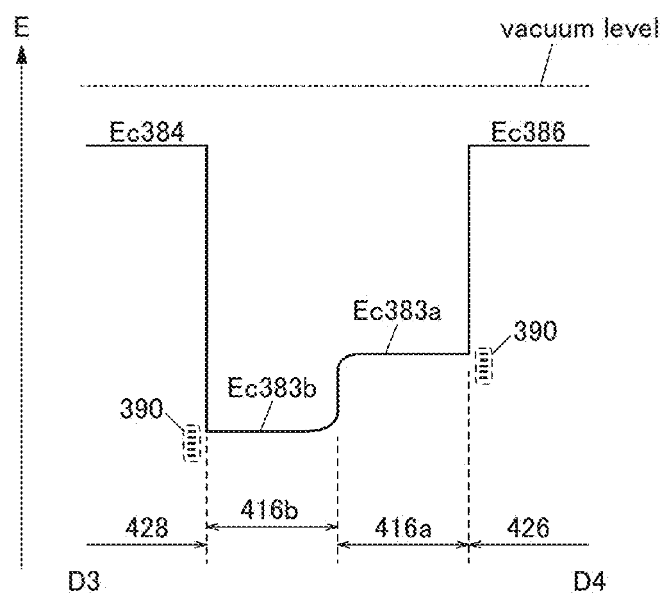

FIG. 23B is an energy band structure diagram showing a portion along the dashed-dotted line D3-D4 in FIG. 20B. FIG. 23B shows the energy band structure of a channel formation region of the transistor 454.

In FIG. 23B, Ec384 represents the energy of the conduction band minimum of the insulating layer 428. The semiconductor layer 416 is formed using two layers, the semiconductor layers 416*a* and 416*b*; thus, the transistor can be manufactured with improved productivity. Since the semiconductor layer 416*c* is not provided, the transistor including the two semiconductor layers is easily affected by the trap states 390 but can have higher field-effect mobility than a transistor including one semiconductor layer as the semiconductor layer 416.

Figure 21C:
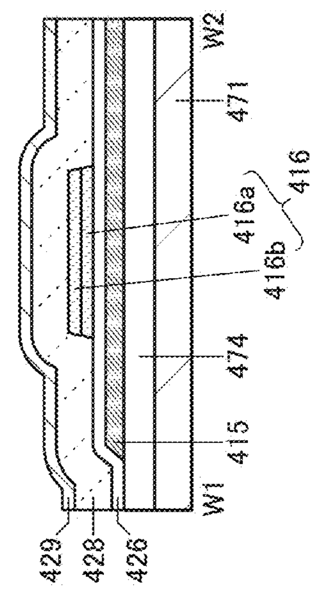
FIGS. 21A to 21C illustrate an example of a transistor.
Figure 21A:
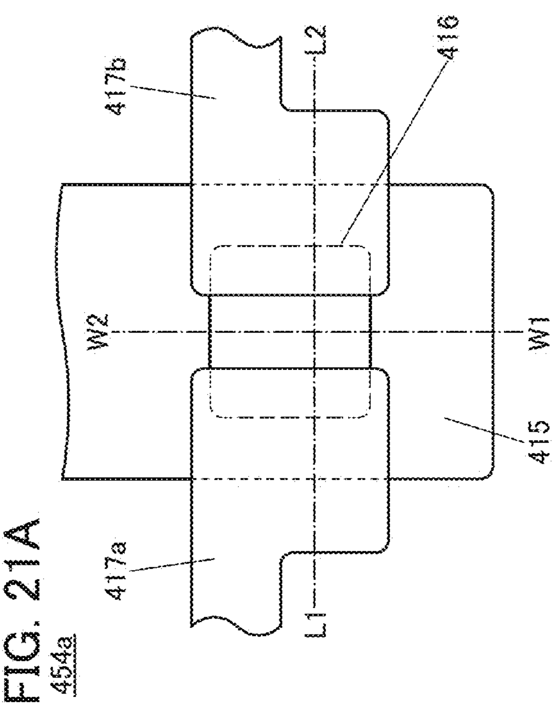
Figure 21B:
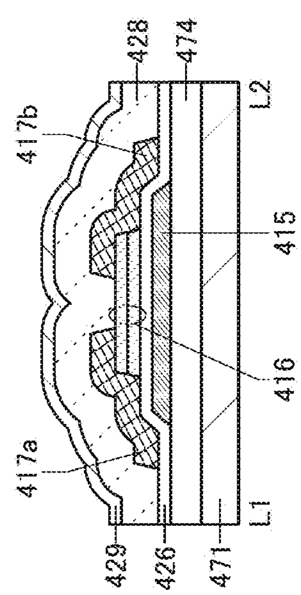

The electrode 418 that can function as a back gate is not necessary provided, depending on the purpose. FIG. 21A is a top view of a transistor 454*a*. FIG. 21B and FIG. 21C are cross-sectional views of portions indicated by the dashed-dotted line L1-L2 and the dashed-dotted line W1-W2 in FIG. 21A. The transistor 454*a* has a structure in which the electrode 418, the opening 447*a*, and the opening 447*b* are removed from the transistor 454. The productivity of the transistor can be improved by omission of the electrode and the openings. Accordingly, the productivity of the semiconductor device can be improved.

Figure 22C:
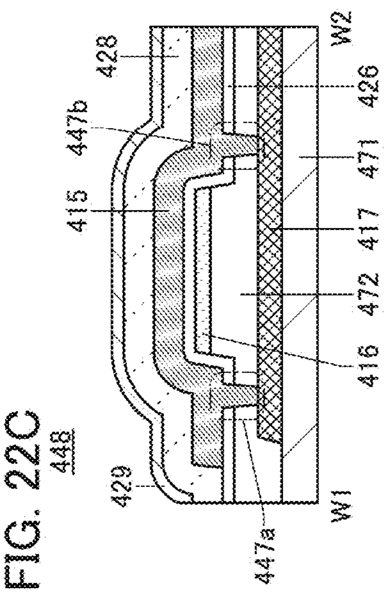
FIGS. 22A to 22C illustrate an example of a transistor.
Figure 22A:
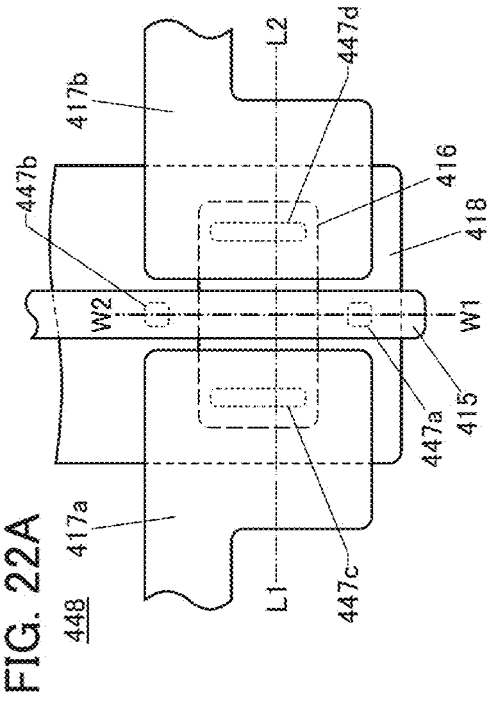
Figure 22B:
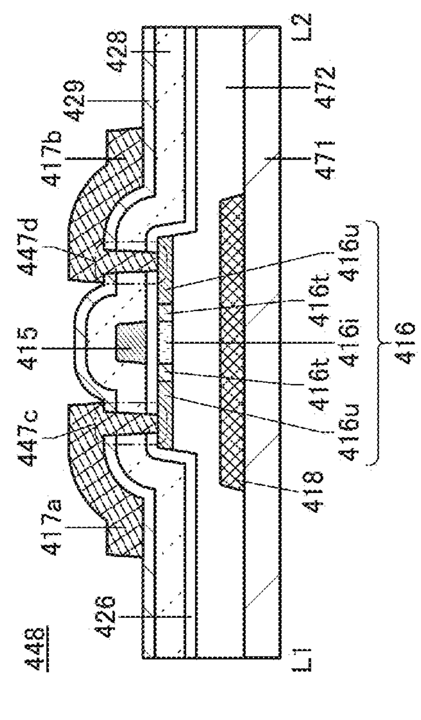

FIGS. 22A to 22C illustrate an example of a transistor with an s-channel structure. A transistor 448 in FIGS. 22A to 22C has almost the same structure as the transistor 447. The transistor 448 is a kind of top-gate transistor having a back-gate electrode. FIG. 22A is a top view of the transistor 448. FIG. 22B is a cross-sectional view of a portion indicated by the dashed-dotted line L1-L2 in FIG. 22A. FIG. 22C is a cross-sectional view of a portion indicated by the dashed-dotted line W1-W2 in FIG. 22A.

FIGS. 22A to 22C illustrate an example in which an inorganic semiconductor layer such as a silicon layer is used as the semiconductor layer 416 in the transistor 448. In FIGS. 22A to 22C, the electrode 418 is provided over the substrate 471, and the insulating layer 472 is provided over the electrode 418. In addition, the semiconductor layer 416 is formed over a projection of the insulating layer 472.

The semiconductor layer 416 includes a semiconductor layer 416*i*, two semiconductor layers 416*t*, and two semiconductor layers 416*u*. The semiconductor layer 416*i* is sandwiched between the two semiconductor layers 416*t*. The semiconductor layer 416*i* and the two semiconductor layers 416*t* are sandwiched between the two semiconductor layers 416*u*. The electrode 415 is provided in a region overlapping with the semiconductor layer 416*i*.

A channel is formed in the semiconductor layer 416*i* when the transistor 448 is on. Therefore, the semiconductor layer 416*i* serves as a channel formation region. The semiconductor layers 416*t* serve as low concentration impurity regions (i.e., LDD). The semiconductor layers 416*u* serve as high concentration impurity regions. Note that one or both of the two semiconductor layers 416*t* are not necessarily provided. One of the two semiconductor layers 416*u* serves as a source region, and the other semiconductor layer 416*u* serves as a drain region.

The electrode 417*a* provided over the insulating layer 429 is electrically connected to one of the semiconductor layers 416*u* in an opening 447*c* formed in the insulating layers 426, 428, and 429. The electrode 417*b* provided over the insulating layer 429 is electrically connected to the other of the semiconductor layers 416*u* in an opening 447*d* formed in the insulating layers 426, 428, and 429.

The electrode 415 provided over the insulating layer 426 is electrically connected to the electrode 418 in the opening 447*a* and the opening 447*b* formed in the insulating layers

426 and 472. Accordingly, the same potential is supplied to the electrodes 415 and 418. Furthermore, either or both of the openings 447*a* and 447*b* may be omitted. In the case where neither the opening 447*a* nor the opening 447*b* is provided, different potentials can be applied to the electrode 415 and the electrode 418.

<Film Formation Method>

The conductive layer such as the electrode, the insulating layer, and the semiconductor layer in this specification and the like can be formed by a chemical vapor deposition (CVD) method, an evaporation method, a sputtering method, or the like. The CVD method generally includes a plasma enhanced CVD (PECVD) method using plasma, a thermal CVD (TCVD) method using heat, and the like. In addition, there is an atmospheric pressure CVD (APCVD) for performing deposition under an atmospheric pressure. The CVD method can be further classified into a metal CVD (MCVD) method and a metal organic CVD (MOCVD) method according to a source gas to be used.

Furthermore, the evaporation method can be typically classified into a resistance heating evaporation method, an electron beam evaporation method, a molecular beam epitaxy (MBE) method, a pulsed laser deposition (PLD) method, an ion beam assisted deposition (IAD) method, an atomic layer deposition (ALD) method, and the like.

By using the PECVD method, a high-quality film can be formed at a relatively low temperature. By using a deposition method that does not use plasma for deposition, such as the MOCVD method or the evaporation method, a film can be formed with few defects because damage is not easily caused on a surface on which the film is deposited.

A sputtering method is typically classified into a DC sputtering method, a magnetron sputtering method, an RF sputtering method, an ion beam sputtering method, an electron cyclotron resonance (ECR) sputtering method, a facing-target sputtering method, and the like.

In the facing-target sputtering method, plasma is confined between the targets; thus, plasma damage to a substrate can be reduced. Further, step coverage can be improved because an incident angle of a sputtered particle to the substrate can be made smaller depending on the inclination of the target.

Different from a film formation method whereby particles released from a target are deposited, a CVD method and an ALD method are film formation methods whereby a film is formed by a reaction at a surface of an object of the treatment. Thus, a CVD method and an ALD method enable favorable step coverage almost regardless of the shape of an object. In particular, an ALD method enables excellent step coverage and excellent thickness uniformity and can be favorably used for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is skipped. Thus, transistors or semiconductor devices can be manufactured with improved productivity.

<Usable Material>

[Substrate]

There is no great limitation on a material used for the substrate 471. The material may be determined in accordance with the required characteristics; for example, whether it has light-transmitting property or not or heat resistance that can endure heat treatment or not is taken into consideration for the determination. For example, a glass substrate of barium borosilicate glass, aluminoborosilicate glass, or the like, a ceramic substrate, a quartz substrate, or a sapphire substrate can be used. Alternatively, a semiconductor substrate, a flexible substrate, an attachment film, a base film, or the like may be used as the substrate 471.

As the semiconductor substrate, a single material semiconductor substrate of silicon, germanium, or the like or a compound semiconductor substrate of silicon carbide, silicon germanium, gallium arsenide, indium phosphide, zinc oxide, or gallium oxide, or the like is used, for example. The semiconductor substrate may be a single-crystal semiconductor substrate or a polycrystalline semiconductor substrate.

As materials of the flexible substrate, the attachment film, and the base material film, the following materials can be used: polyethylene terephthalate (PET), polyethylene naphthalate (PEN), polyether sulfone (PES), polytetrafluoroethylene (PTFE), polypropylene, polyester, polyvinyl fluoride, polyvinyl chloride, polyolefin, polyamide (e.g., nylon or aramid), polyimide, polycarbonate, aramid, an epoxy resin, an acrylic resin, and the like.

The flexible substrate used as the substrate 471 preferably has a lower coefficient of linear expansion because a lower coefficient of linear expansion suppresses deformation due to an environment. The flexible substrate used as the substrate 471 is formed using, for example, a material whose coefficient of linear expansion is lower than or equal to $1\times10^{3}$/K, lower than or equal to $5\times10^{-5}$/K, or lower than or equal to $1\times10^{-5}$/K. In particular, aramid is preferably used for the flexible substrate because of its low coefficient of linear expansion.

<Insulating Layer>

The insulating layers 422, 426, 428, 429, 472, 473, 474, 475, 477, 482, and 483 can be formed using a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, or the like. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulating layer 475 and the insulating layer 429 be formed using an insulating material that is relatively impermeable to impurities. The insulating layers 475 and 429 may each be formed to have, for example, a single-layer structure or a stacked-layer structure including an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Examples of such an insulating material that is relatively impermeable to impurities include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride. The insulating layer 475 or 429 may be formed using indium tin zinc oxide (In—Sn—Zn oxide) having an excellent insulating property or the like.

When the insulating material that is relatively impermeable to impurities is used for the insulating layer 475, impurity diffusion from the substrate 471 side can be suppressed, and the reliability of the transistor can be improved. When the insulating material that is relatively impermeable to impurities is used for the insulating layer 429, impurity diffusion from the insulating layer 429 side can be suppressed, and the reliability of the transistor can be improved.

A plurality of insulating layers formed using any of the above-described materials may be stacked as each of the insulating layers 422, 426, 428, 429, 472, 473, 474, 477, 482, and 483. The formation method of the insulating layers 422, 426, 428, 429, 472, 473, 474, 477, 482, and 483 is not particularly limited, and a sputtering method, a CVD method, an MBE method, a PLD method, an ALD method, a spin coating method, or the like can be used.

For example, in the case where an aluminum oxide film is formed by a thermal CVD method, two kinds of gases, e.g., $H_2O$ as an oxidizer and a source material gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

In the case of forming a silicon oxide or a silicon oxynitride by a PECVD method, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

A silicon oxynitride film having few defects can be formed under the conditions that the flow rate of the oxidizing gas is greater than or equal to 20 times and less than 100 times, or greater than or equal to 40 times and less than or equal to 80 times the flow rate of the deposition gas and that the pressure in a treatment chamber is lower than or equal to 100 Pa or lower than or equal to 50 Pa.

A dense silicon oxide or a dense silicon oxynitride can be formed under the following conditions: the substrate placed in a treatment chamber is held at a temperature higher than or equal to 280° C. and lower than or equal to 400° C.; the pressure in the treatment chamber into which a source gas is introduced is set to be higher than or equal to 20 Pa and lower than or equal to 250 Pa, preferably higher than or equal to 100 Pa and lower than or equal to 250 Pa; and a high-frequency power is supplied to an electrode provided in the treatment chamber.

A silicon oxide or a silicon oxynitride can be formed by a CVD method using an organosilane gas. As the organosilane gas, any of the following silicon-containing compound can be used: tetraethyl orthosilicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); trisdimethylaminosilane ($SiH(N(CH_3)_2)_3$); or the like. By a CVD method using an organosilane gas, the insulating layer having high coverage can be formed.

The insulating layer may be formed by a plasma CVD method using a microwave. A microwave refers to a wave in the frequency range of 300 MHz to 300 GHz. In a microwave, electron temperature is low and electron energy is low. Furthermore, in supplied power, the proportion of power used for acceleration of electrons is low, and therefore, power can be used for dissociation and ionization of more molecules. Thus, plasma with high density (high-density plasma) can be excited. This method causes little plasma damage to the deposition surface or a deposit, so that the insulating layer having few defects can be formed.

When an oxide semiconductor is used for the semiconductor layer 416, the hydrogen concentration in the insulating layers is preferably lowered in order to prevent an increase in the hydrogen concentration in the semiconductor layer 416. It is particularly preferable to lower the hydrogen concentration of the insulating layer in contact with the semiconductor layer 416. Specifically, the hydrogen concentration in the insulating layer, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Furthermore, the nitrogen concentration in the insulating layers is preferably low in order to prevent an increase in the nitrogen concentration in the semiconductor layer 416. It is particularly preferable to lower the nitrogen concentration of the insulating layer in contact with the semiconductor layer 416. Specifically, the nitrogen concentration in the insulating layer, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The concentration measured by SIMS analysis may include a variation within a range of ±40%.

When an oxide semiconductor is used for the semiconductor layer 416, the insulating layers are preferably formed with insulating layers from which oxygen is released by heating (also referred to as an "insulating layer containing excess oxygen"). It is particularly preferable that an insulating layer in contact with the semiconductor layer 416 be an insulating layer containing excess oxygen. For example, the insulating layer is preferably an insulating layer of which the amount of released oxygen converted into oxygen atoms is greater than or equal to $1.0\times10^{18}$ atoms/cm$^3$, $1.0\times10^{19}$ atoms/cm$^3$, or greater than or equal to $1.0\times10^{20}$ atoms/cm$^3$ in TDS analysis in which heat treatment is performed so that the surface temperature of the insulating layer is higher than or equal to 100° C. and lower than or equal to 700° C., preferably higher than or equal to 100° C. and lower than or equal to 500° C.

The insulating layer containing excess oxygen can be formed by performing treatment for adding oxygen to an insulating layer. The treatment for adding oxygen can be performed by heat treatment under an oxygen atmosphere or performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In the case where oxygen is added by plasma treatment in which oxygen is excited by a microwave to generate high-density oxygen plasma, the amount of oxygen added to the insulating layer can be increased. In this specification, the treatment for adding oxygen is also referred to as “oxygen doping treatment”.

The formation of an insulating layer by sputtering in an atmosphere including oxygen allows introduction of oxygen into the insulating layer.

Generally, a capacitor has such a structure that a dielectric is sandwiched between two electrodes that face to each other, and as the thickness of the dielectric is smaller (as the distance between the two facing electrodes is shorter) or as the dielectric constant of the dielectric is higher, the capacitance becomes higher. However, if the thickness of the dielectric is reduced in order to increase the capacitance of the capacitor, because of a tunnel effect or the like, current unintentionally flowing between the two electrodes (leakage current) tends to increase and the withstand voltage of the capacitor tends to be lower.

A portion where a gate electrode, a gate insulating layer, and a semiconductor layer of a transistor overlap with each other functions as the capacitor (hereinafter also referred to as “gate capacitor”). A channel is formed in a region in the semiconductor layer, which overlaps with the gate electrode with the gate insulating layer provided therebetween. That is, the gate electrode and the channel formation region function as two electrodes of the capacitor. Furthermore, the gate insulating layer functions as a dielectric of the capacitor. Although it is preferable that the capacitance of the gate capacitor be as high as possible, a reduction in the thickness of the gate insulating layer for the purpose of increasing the capacitance increases the probability of occurrence of an increase in the leakage current or a reduction in the withstand voltage.

In the case where a high-k material such as hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), hafnium oxide, or yttrium oxide is used as a dielectric, even if the thickness of the dielectric is made thick, sufficient capacitance of the capacitor can be ensured.

For example, in the case where a high-k material with a high dielectric constant is used as the dielectric, even when the dielectric is made thick, a capacitance equivalent to that in the case of using silicon oxide as the dielectric can be obtained. This enables a reduction in leakage current between the two electrodes of the capacitor. The dielectric may have a stacked-layer structure of the high-k material and another insulating material.

The insulating layer 428 has a flat surface. As the insulating layer 428, an organic material having heat resistance, such as polyimide, an acrylic-based resin, a benzocyclobutene-based resin, polyamide, or an epoxy-based resin, can be used as well as the above-mentioned insulating materials. Other than such organic materials, it is possible to use a low-dielectric constant material (a low-k material), a siloxane-based resin, phosphosilicate glass (PSG), borophosphosilicate glass (BPSG), or the like. Note that a plurality of insulating layers formed of these materials may be stacked to form the insulating layer 428.

Note that the siloxane-based resin corresponds to a resin including an Si—O—Si bond formed using a siloxane-based material as a starting material. The siloxane-based resin may include as a substituent an organic group (e.g., an alkyl group or an aryl group) or a fluoro group. The organic group may include a fluoro group.

There is no particular limitation on the method for forming the insulating layer 428, and any of the following methods that depend on a material thereof can be used: a sputtering method; an SOG method; spin coating; dipping; spray coating; a droplet discharging method (e.g., an ink-jet method); a printing method (e.g., screen printing, or offset printing); or the like.

The sample surface may be subjected to CMP treatment. The CMP treatment can reduce unevenness of the surface, and coverage whereby an insulating layer or a conductive layer to be formed later can be increased.

[Semiconductor Layer]

A single-crystal semiconductor, a polycrystalline semiconductor, a microcrystalline semiconductor, an amorphous semiconductor, or the like may be used for the semiconductor layer 416. As a semiconductor material, silicon, germanium, or the like can be used. Alternatively, a compound semiconductor of silicon germanium, silicon carbide, gallium arsenide, oxide semiconductor, nitride semiconductor, or the like, an organic semiconductor, or the like may be used.

In the case of using an organic semiconductor for the semiconductor layer 416, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

As described above, the band gap of an oxide semiconductor is 2 eV or wider; thus, when the oxide semiconductor is used for the semiconductor layer 416, a transistor with an extremely low off-state current can be provided. An OS transistor has high withstand voltage between its source and drain. Thus, a transistor with high reliability can be provided. Furthermore, a transistor with high output voltage and high withstand voltage can be provided. Furthermore, a semiconductor device with high reliability can be provided. Furthermore, a semiconductor device with high output voltage and high withstand voltage can be provided.

Alternatively, for example, a transistor including silicon having crystallinity in a semiconductor layer in which a channel is formed (also referred to as a “crystalline Si transistor”) tends to obtain relatively high mobility as compared to the OS transistor. On the other hand, the crystalline Si transistor has difficulty in obtaining extremely small off-state current unlike the OS transistor. Thus, it is important that the semiconductor material used for the semiconductor layer be selected depending on the purpose and the usage. For example, depending on the purpose and the usage, the OS transistor and the crystalline Si transistor may be used in combination.

A case in which an oxide semiconductor is used for the semiconductor layer 416 is described below. An oxide semiconductor used for the semiconductor layer 416 preferably contains at least indium (In) or zinc (Zn). In particular, indium and zinc are preferably contained. The oxide semiconductor has a high carrier mobility (electron mobility) when containing, for example, indium. When the oxide semiconductor contains zinc, the oxide semiconductor is easily to be crystallized in some cases.

An oxide semiconductor preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M. The element M is an element having high bonding energy with oxygen, for example. The element M is an element that can increase the energy gap of the oxide semiconductor, for example.

Note that the oxide semiconductor used for the semiconductor layer 416 is not limited to the oxide containing indium. The oxide semiconductor may be, for example, an oxide which does not contain indium and contains zinc, an oxide which does not contain indium and contains gallium, or an oxide which does not contain indium and contains tin, e.g., a zinc tin oxide, a gallium tin oxide, or gallium oxide.

First, preferred ranges of the atomic ratio of indium, the element M, and zinc contained in an oxide semiconductor according to the present invention are described with reference to FIGS. 43A to 43C. Note that the proportion of oxygen atoms is not shown in FIGS. 43A to 43C. The terms of the atomic ratio of indium, the element M, and zinc contained in the oxide semiconductor are denoted by [In], [M], and [Zn], respectively.

Figure 43A:
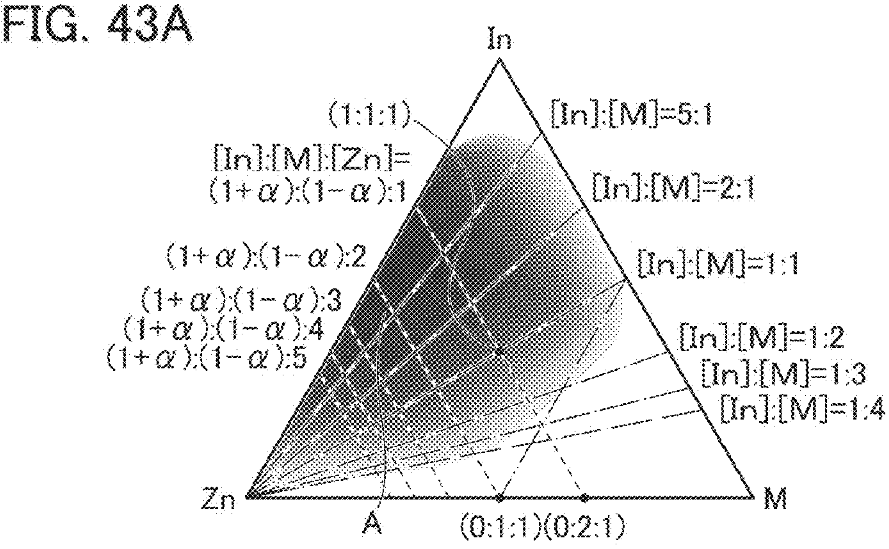
FIGS. 43A to 43C each illustrate an atomic ratio range of an oxide semiconductor of one embodiment of the present invention.
Figure 43B:
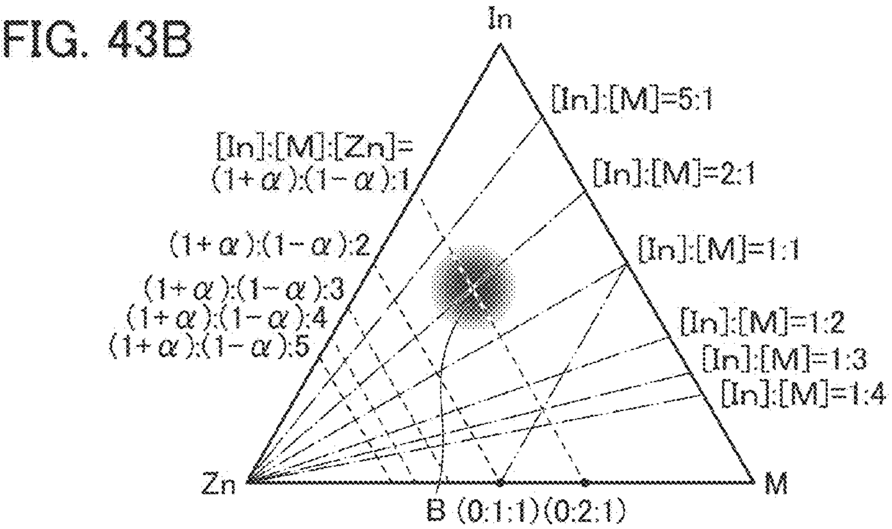
Figure 43C:
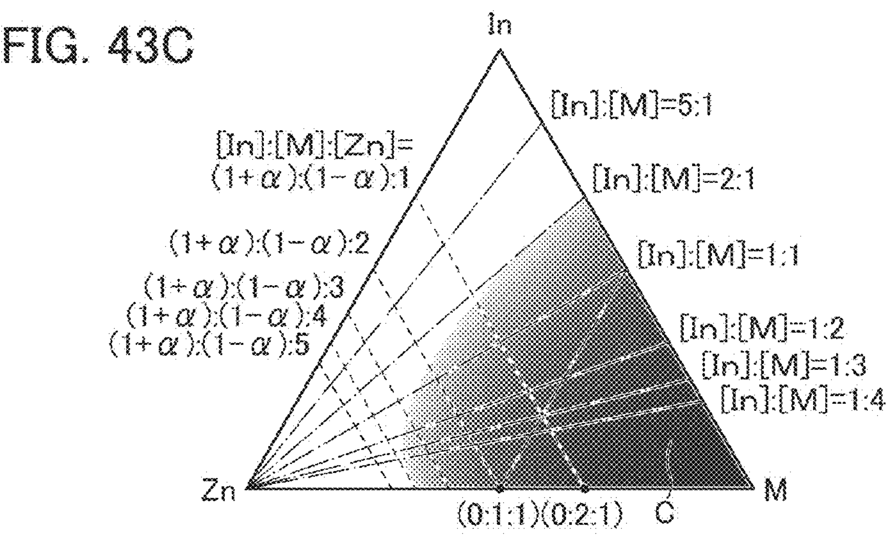

In FIGS. 43A to 43C, broken lines indicate a line where the atomic ratio [In]:[M]:[Zn] is $(1+\alpha):(1-\alpha):1$ (where $-1 \leq \alpha \leq 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$ (where $\beta \geq 0$), a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

Dashed-double dotted lines indicate a line where the atomic ratio [In]:[M]:[Zn] is $(1+\gamma): 2:(1-\gamma)$, where $-1 \leq \gamma \leq 1$. An oxide semiconductor having the atomic ratio of [In]:[M]:[Zn]=0:2:1 or a neighborhood thereof in FIGS. 43A to 43C tends to have a spinel crystal structure.

FIGS. 43A and 43B illustrate examples of the preferred ranges of the atomic ratio of indium, the element M, and zinc contained in an oxide semiconductor in one embodiment of the present invention.

Figure 44:
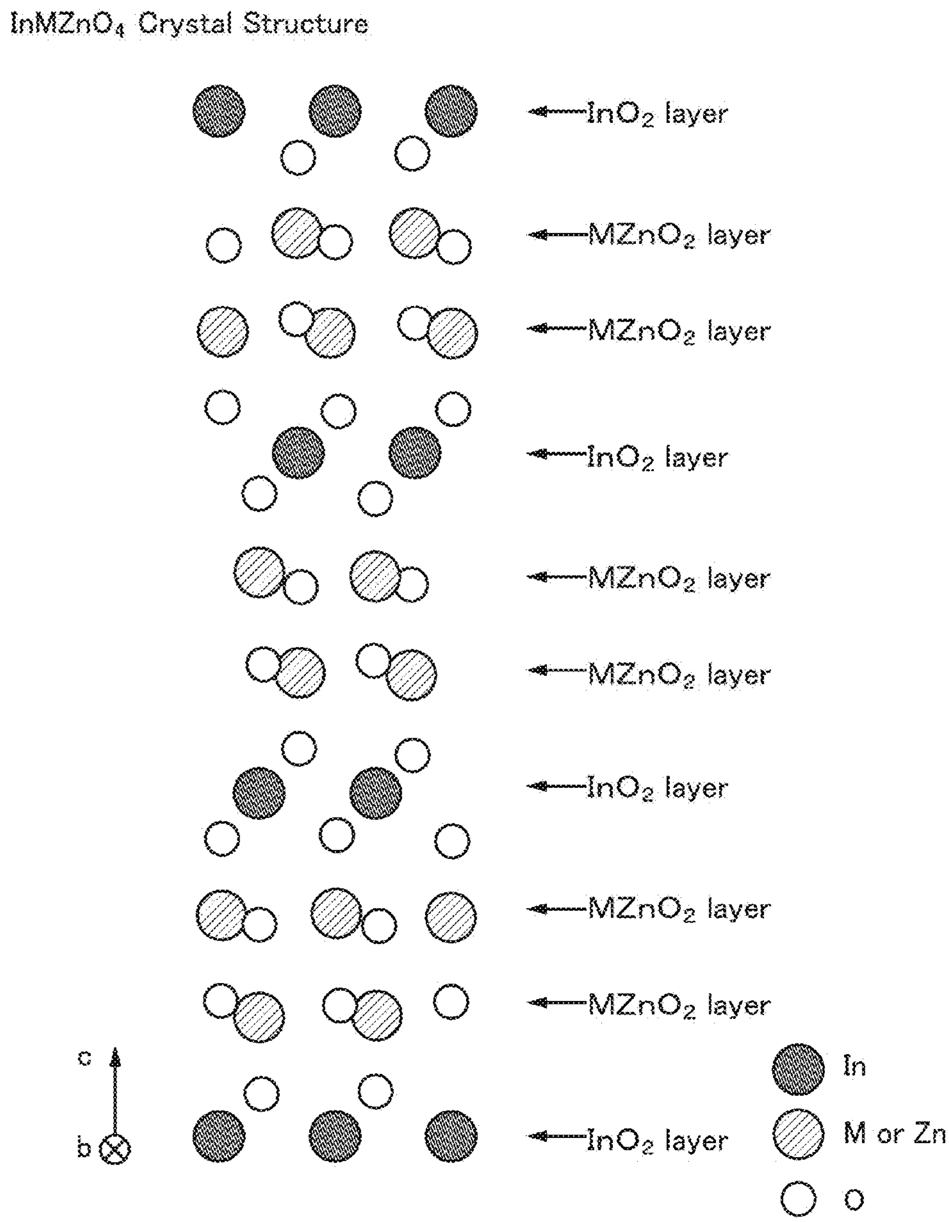
FIG. 44 illustrates a crystal of $InMZnO_4$.

FIG. 44 illustrates an example of the crystal structure of $InMZnO_4$ with an atomic ratio [In]:[M]:[Zn] of 1:1:1. The crystal structure illustrated in FIG. 44 is $InMZnO_4$ observed from a direction parallel to the b-axis. Note that a metal element in a layer that contains M, Zn, and oxygen (hereinafter this layer is referred to as "(M,Zn) layer") in FIG. 44 represents the element M or zinc. In that case, the proportion of the element M is the same as the proportion of zinc. The element M and zinc can be replaced with each other, and their arrangement is random.

Note that $InMZnO_4$ has a layered crystal structure (also referred to as layered structure) and includes two (M,Zn) layers that contain the element M, zinc, and oxygen with respect to one layer that contains indium and oxygen (hereinafter referred to as In layer), as illustrated in FIG. 44.

Indium and the element M can be replaced with each other. Accordingly, when the element M in the (M, Zn) layer is replaced by indium, the layer can also be referred to as an (In, M, Zn) layer. In that case, a layered structure that includes two (In, M, Zn) layers with respect to one In layer is obtained.

An oxide semiconductor with an atomic ratio [In]:[M]:[Zn] of 1:1:2 has a layered structure that includes three (M,Zn) layers with respect to one In layer. In other words, if [Zn] is larger than [In] and [M], the proportion of the (M,Zn) layer to the In layer becomes higher when the oxide semiconductor is crystallized.

Note that in the case where the number of (M,Zn) layers with respect to one In layer is not an integer in the oxide, the oxide might have a plurality of kinds of layered structures where the number of (M,Zn) layers with respect to one In layer is an integer. For example, in the case of [In]:[M]:[Zn] =1:1:1.5, the oxide semiconductor may have a mix of a layered structure including one In layer for every two (M,Zn) layers and a layered structure including one In layer for every three (M,Zn) layers.

For example, when the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:[M]:[Zn] close to 0:2:1, two phases of a spinel crystal structure and a layered crystal structure are likely to exist. In addition, with an atomic ratio [In]:[M]:[Zn] close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor with a higher content of indium can have high carrier mobility (electron mobility). This is because in an oxide semiconductor containing indium, the element M, and zinc, the s orbital of heavy metal mainly contributes to carrier transfer, and a higher indium content in the oxide semiconductor enlarges a region where the s orbitals of indium atoms overlap; therefore, an oxide semiconductor with a high indium content has higher carrier mobility than an oxide semiconductor with a low indium content.

In contrast, when the indium content and the zinc content in an oxide semiconductor become lower, the carrier mobility becomes lower. Thus, with an atomic ratio [In]:[M]:[Zn] of 0:1:0 or around 0:1:0 (e.g., a region C in FIG. 43C), insulation performance becomes better.

Accordingly, an oxide semiconductor in one embodiment of the present invention preferably has an atomic ratio represented by a region A in FIG. 43A. With this atomic ratio, a layered structure with high carrier mobility and a few grain boundaries is easily obtained.

A region B in FIG. 43B represents an atomic ratio [In]:[M]:[Zn] of 4:2:3 to 4:2:4.1 and the vicinity thereof. The vicinity includes an atomic ratio [In]:[M]:[Zn] of 5:3:4. An oxide semiconductor with an atomic ratio represented by the region B is an excellent oxide semiconductor that has particularly high crystallinity and high carrier mobility.

Note that a condition where an oxide semiconductor has a layered structure is not uniquely determined by an atomic ratio. The atomic ratio affects difficulty in forming a layered structure. Even with the same atomic ratio, whether a layered structure is formed or not depends on a formation condition. Therefore, the illustrated regions each represent an atomic ratio with which an oxide semiconductor has a layered structure, and boundaries of the regions A to C are not clear.

Next, the case where the oxide semiconductor is used for a transistor is described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8\times10^{11}/cm^3$, preferably lower than $1\times10^{11}/cm^3$, more preferably lower than $1\times10^{10}/cm^3$, and greater than or equal to $1\times10^{-9}/cm^3$ is used.

A highly purified intrinsic or substantially highly purified intrinsic oxide semiconductor has few carrier generation sources and thus can have a low carrier density. A highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, the transistor whose channel region is formed in the oxide semiconductor having a high density of trap states has unstable electrical characteristics in some cases.

To obtain stable electrical characteristics of the transistor, it is effective to reduce the concentration of impurities in the oxide semiconductor. In order to reduce the concentration of impurities in the oxide semiconductor, the concentration of impurities in a film which is adjacent to the oxide semiconductor is preferably reduced. As examples of the impurities, hydrogen, nitrogen, alkali metal, alkaline earth metal, iron, nickel, silicon, and the like are given.

Here, the influence of impurities in the oxide semiconductor is described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor contains alkali metal or alkaline earth metal, defect states are formed and carriers are generated, in some cases. Thus, a transistor including an oxide semiconductor that contains alkali metal or alkaline earth metal is likely to be normally-on. Therefore, it is preferable to reduce the concentration of alkali metal or alkaline earth metal of the oxide semiconductor. Specifically, the concentration of alkali metal or alkaline earth metal in the oxide semiconductor measured by SIMS is set lower than or equal to $1\times10^{18}$ atoms/cm$^3$, and preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally on. Accordingly, it is preferable that hydrogen in the oxide semiconductor be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurity concentration is used for a channel formation region in a transistor, the transistor can have stable electrical characteristics.

For example, when an InGaZnOx (X>0) film is formed as the semiconductor layer 416 by a thermal CVD method, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, in the case where an InGaZnOx film (X>0) is formed as the semiconductor layer 416 by an ALD method, an $In(CH_3)_3$ gas and an $O_3$ gas are sequentially introduced a plurality of times to form an $InO_2$ layer, subsequently a $Ga(CH_3)_3$ gas and an $O_3$ gas are sequentially introduced a plurality of times to form a GaO layer, and then a $Zn(CH_3)_2$ gas and an $O_3$ gas are sequentially introduced a plurality of times to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed using these gases. Note that although an $H_2O$ gas which is obtained by bubbling water with an inert gas such as Ar may be used instead of an $O_3$ gas, it is preferable to use an $O_3$ gas, which does not contain H. Instead of an $In(CH_3)_3$ gas, an $In(C_2H_5)_3$ gas or tris(acetylacetonato)indium may be used. Note that tris(acetylacetonato)indium is also referred to as $In(acac)_3$. Instead of a $Ga(CH_3)_3$ gas, a $Ga(C_2H_5)_3$ gas or tris(acetylacetonato)gallium may be used. Note that tris (acetylacetonato)gallium is also referred to as $Ga(acac)_3$. Furthermore, a $Zn(CH_3)_2$ gas or zinc acetate may be used. However, the deposition gas is not limited to these.

In the case where the oxide layer is formed by a sputtering method, a target containing indium is preferably used in order to reduce the number of particles. addition, if an oxide target having a high atomic ratio of the element M is used, the conductivity of the target may be decreased. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

As described above, in the case where the oxide semiconductor is formed by a sputtering method, the atomic ratio of In to M and Zn contained in the target may be 3:1:1, 3:1:2, 3:1:4, 1:1:0.5, 1:1:1, 1:1:2, 1:4:4, 5:1:7, 4:2:4.1, or a ratio close to these ratios, for example.

In the case where an oxide semiconductor is formed by a sputtering method, the oxide semiconductor is deposited at a substrate temperature higher than or equal to 100° C. and lower than or equal to 750° C., higher than or equal to 150° C. and lower than or equal to 450° C., or higher than or equal to 200° C. and lower than or equal to 350° C., whereby the crystallinity of the oxide semiconductor can be increased.

When the oxide semiconductor is formed by a sputtering method, an oxide semiconductor having an atomic ratio different from the atomic ratio of the target may be deposited. Especially for zinc, the atomic ratio of zinc in the deposited film is smaller than the atomic ratio of the target in some cases. Specifically, the film has an atomic ratio of zinc of 40 atomic % to 90 atomic % of the atomic ratio of zinc in the target.

Each of the semiconductor layer 416*a*, the semiconductor layer 416*b*, and the semiconductor layer 416*c* is preferably formed using a material containing either In or Ga or both of them. Typical examples are an In—Ga oxide (an oxide containing In and Ga), an In—Zn oxide (an oxide containing In and Zn), and an In-M-Zn oxide (an oxide containing In, an element M, and Zn). The element M is one or more kinds of elements selected from Al, Ti, Ga, Y, Zr, La, Ce, Nd, and Hf and has a higher strength of bonding with oxygen than that of In.

The semiconductor layer 416*a* and the semiconductor layer 416*c* are preferably formed using a material containing one or more kinds of metal elements contained in the semiconductor layer 416*b*. With the use of such a material, interface states are less likely to be generated at the interface between the semiconductor layer 416*a* and the semiconductor layer 416*b* and at the interface between the semiconductor layer 416*c* and the semiconductor layer 416*b*. Accordingly, carriers are not likely to be scattered or captured at the interfaces, which results in an improvement in field-effect mobility of the transistor. Further, threshold-voltage variation of the transistor can be reduced. Thus, a semiconductor device having favorable electrical characteristics can be obtained.

In the case where the semiconductor layer 416*b* is an In-M-Zn oxide and the semiconductor layers 416*a* and 416*c* are each an In-M-Zn oxide, the semiconductor layers 416*a* and 416*c* each have the atomic ratio where In:M:Zn=$x_1$:$y_1$:$z_1$, and the semiconductor layer 416*b* has an atomic ratio where In:M:Zn=$x_2$:$y_2$:$z_2$, for example. In that case, the compositions of the semiconductor layers 416*a*, 416*c*, and 416*b* can be determined so that $y_1/x_1$ is larger than $y_2/x_2$. It is preferable that the compositions of the semiconductor layer 416*a*, the semiconductor layer 416*c*, and the semiconductor layer 416*b* are determined so that $y_1/x_1$ is 1.5 times or more as large as $y_2/x_2$. It is more preferable that the compositions of the semiconductor layers 416*a*, 416*c*, and 416*b* be determined so that $y_1/x_1$ is twice or more as large as $y_2/x_2$. It is still more preferable that the compositions of the semiconductor layers 416*a*, 416*c*, and 416*b* be determined so that $y_1/x_1$ is three times or more as large as $y_2/x_2$. It is preferable that $y_1$ be greater than or equal to $x_1$ because the transistor can have stable electrical characteristics. However, when $y_1$ is three times or more as large as $x_1$, the field-effect mobility of the transistor is reduced; accordingly, $y_1$ is preferably smaller than three times $x_1$. When the semiconductor layer 416*a* and the semiconductor layer 416*c* have the above compositions, the semiconductor layer 416*a* and the semiconductor layer 416*c* can each be a layer in which oxygen vacancies are less likely to be generated than that in the semiconductor layer 416*b*.

In the case where the semiconductor layers 416*a* and 416*c* are each an In-M-Zn oxide and the summation of In and the element M is assumed to be 100 atomic %, the atomic percentages of In and an element M are preferably as follows: the percentage of In is lower than 50 atomic % and the percentage of M is higher than or equal to 50 atomic %. The percentages of In and M are more preferably as follows: the percentage of In is lower than 25 atomic % and the percentage of M is higher than or equal to 75 atomic %. In the case where the semiconductor layer 416*b* is an In-M-Zn oxide and the summation of In and M is assumed to be 100 atomic %, the atomic percentages of In and the element M are preferably more than or equal to 25 atomic % and less than 75 atomic %, respectively, further preferably more than or equal to 34 atomic % and less than 66 atomic %, respectively.

For example, an In—Ga—Zn oxide which is formed using a target having an atomic ratio of In:Ga:Zn=1:3:2, 1:3:4, 1:3:6, 1:4:5, 1:6:4, 1:9:6, or the atomic ratio close to these ratios, or an In—Ga oxide which is formed using a target having an atomic ratio of In:Ga=1:9, or gallium oxide can be used for each of the semiconductor layer 416*a* and the semiconductor layer 416*c* containing In or Ga. Furthermore, an In—Ga—Zn oxide which is formed using a target having an atomic ratio of In:Ga:Zn=3:1:2, 1:1:1, 5:5:6, 5:1:7, 4:2:4.1, or an atomic ratio close to these ratios can be used for the semiconductor layer 416*b*. Note that the atomic ratio of each of the semiconductor layer 416*a*, the semiconductor layer 416*b*, and the semiconductor layer 416*c* may vary within a range of ±20% of any of the above-described atomic ratios as an error.

In order to give stable electrical characteristics to the OS transistor, it is preferable that impurities and oxygen vacancies in the oxide semiconductor layer be reduced to highly purify the oxide semiconductor layer so that the semiconductor layer 416 can be regarded as an intrinsic or substantially intrinsic oxide semiconductor layer. Furthermore, it is preferable that at least the channel formation region of the semiconductor layer 416 can be regarded as an intrinsic or substantially intrinsic oxide semiconductor layer.

It is preferable that impurities and oxygen vacancies in the semiconductor layer 416*b* be reduced to obtain a highly purified oxide semiconductor layer; accordingly, the semiconductor layer 416*b* can be regarded as an intrinsic or substantially intrinsic oxide semiconductor layer. Furthermore, it is preferable that at least the channel formation region of the semiconductor layer 416*b* be regarded as an intrinsic or substantially intrinsic semiconductor layer.

Note that the substantially intrinsic oxide semiconductor layer refers to an oxide semiconductor layer in which the carrier density is higher than or equal to $1\times10^{-9}/cm^3$ and lower than $8\times10^{11}/cm^3$, preferably lower than $1\times10^{11}/cm^3$, further preferably lower than $1\times10^{10}/cm^3$.

When an oxide semiconductor layer is used as the semiconductor layer 416, the layer preferably includes c-axis aligned crystalline oxide semiconductor (CAAC-OS). A CAAC-OS is an oxide semiconductor having a plurality of c-axis aligned crystal parts. Note that CAAC-OS will be described in detail in another embodiment.

In the oxide semiconductor layer used as the semiconductor layer 416, a region where CAAC is not formed (a lateral growth buffer region, also referred to as "LGBR") preferably accounts for less than 20% of the whole oxide semiconductor layer.

The CAAC-OS has dielectric anisotropy. Specifically, the CAAC-OS has a larger dielectric constant in the c-axis direction than in the a-axis direction and the b-axis direction. In a transistor in which a CAAC-OS is used for a semiconductor layer where a channel is formed and a gate electrode is positioned in the c-axis direction, the dielectric constant in the c-axis direction is large; thus, the electric field generated from the gate electrode easily reaches the entire CAAC-OS. The subthreshold swing value (S value) can be made small. In addition, in the transistor in which a CAAC-OS is used for the semiconductor layer, an increase in S value due to miniaturization is less likely to occur.

Moreover, since the dielectric constant in the a-axis direction and the b-axis direction of a CAAC-OS is small, an influence of the electric field generated between a source and a drain is reduced. Thus, a channel length modulation effect, a short-channel effect, or the like is less likely to occur, whereby the reliability of the transistor can be increased.

Here, the channel length modulation effect is a phenomenon in which, when the drain voltage is higher than the threshold voltage, a depletion layer expands from the drain side, so that the effective channel length is decreased. The short-channel effect is a phenomenon in which a channel length is reduced, so that a deterioration in electrical characteristics such as a decrease in threshold voltage is caused. The more transistor is miniaturized, the more deterioration in electrical characteristics caused by the phenomena is likely to occur.

Note that after the oxide semiconductor layer is formed, oxygen doping treatment may be performed. In order to further decrease impurities such as water or hydrogen in the oxide semiconductor layer to highly purify the oxide semiconductor layer, heat treatment is preferably performed.

For example, the oxide semiconductor layer is subjected to heat treatment in a reduced-pressure atmosphere, an inert gas atmosphere of nitrogen, a rare gas, or the like, an oxidizing gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidizing gas atmosphere refers to an atmosphere including an oxidizing gas such as oxygen, ozone, or nitrogen oxide at 10 ppm or higher. The inert gas atmosphere refers to an atmosphere including the oxidation gas at lower than 10 ppm and is filled with nitrogen or a rare gas.

By the heat treatment, at the same time as the release of the impurities, oxygen contained in the insulating layer 426 is diffused to the oxide semiconductor layer and oxygen vacancies in the oxide semiconductor layer can be reduced. Note that the heat treatment may be performed in such a manner that heat treatment is performed in an inert gas atmosphere, and then another heat treatment is performed in an atmosphere containing an oxidation gas at 10 ppm or more, 1% or more, or 10% or more in order to compensate for desorbed oxygen. The heat treatment may be performed at any time after the oxide semiconductor layer is formed.

There is no particular limitation on a heat treatment apparatus used for the heat treatment, and the apparatus may be provided with a device for heating an object to be processed by heat conduction or heat radiation from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas.

The heat treatment may be performed at a temperature higher than or equal to 250° C. and lower than or equal to 650° C., preferably higher than or equal to 300° C. and lower than or equal to 500° C. The treatment time is preferably shorter than or equal to 24 hours. Heat treatment for over 24 hours is not preferable because the productivity is reduced.

[Electrode]

As a conductive material for forming each of the electrode 415, the electrode 417*a*, the electrode 417*b*, the electrode 418, the electrode 425*a*, and the electrode 425*b*, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, and the like can be used. Alternatively, a semiconductor having a high electric conductivity typified by polycrystalline silicon including an impurity element such as phosphorus, or silicide such as nickel silicide may be used. A plurality of stacked conductive layers formed with these materials may be used as the electrode.

The conductive material for forming the electrodes 415, 417*a*, 417*b*, 418, 425*a*, and 425*b* can also be formed using a conductive material containing oxygen, such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added, or a conductive material containing nitrogen, such as titanium nitride or tantalum nitride. It is also possible to use a stacked-layer structure formed using a material containing the above metal element and conductive material containing oxygen. It is also possible to use a stacked-layer structure formed using a material containing the above metal element and conductive material containing nitrogen. It is also possible to use a stacked-layer structure formed using a material containing the above metal element, conductive material containing oxygen, and conductive material containing nitrogen. There is no particular limitation on the formation method of the conductive material, and any of a variety of formation methods such as an evaporation method, a CVD method, and a sputtering method can be employed.

[Contact Plug]

As the contact plug, a conductive material with high embeddability such as tungsten or polysilicon can be used. A side surface and a bottom surface of the material may be covered with a barrier layer (a diffusion prevention layer) of a titanium layer, a titanium nitride layer, or a stacked layer of these layers. In this case, the barrier layer is regarded as part of the contact plug in some cases.

This embodiment can be implemented in an appropriate combination with any of the structures described in the other embodiments, examples, or the like.

Embodiment 3

In this embodiment, application examples of the above semiconductor device or the transistors described in the above embodiments will be described.

<Application Example of Semiconductor Device>

[CPU]

Figure 24:
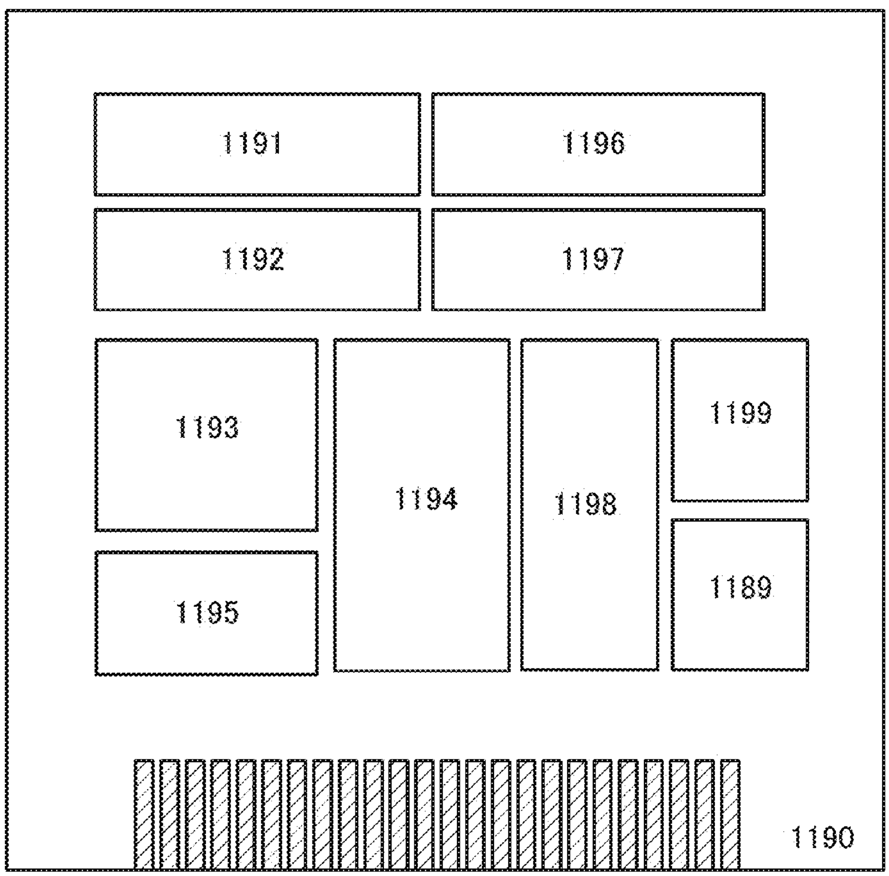
FIG. 24 is a block diagram showing a structure example of a CPU.

The above-described semiconductor device can be used for part of a CPU. FIG. 24 is a block diagram illustrating a configuration example of the CPU.

The CPU illustrated in FIG. 24 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Obviously, the CPU illustrated in FIG. 24 is only an example in which the structure is simplified, and an actual CPU may have various structures depending on the application. For example, the CPU may have the following configuration: a structure including the CPU illustrated in FIG. 24 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads data from or writes data to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 24, a memory element is provided in the register 1196. The memory element in the above embodiments is used as the register 1196.

Although the semiconductor device of one embodiment of the present invention is used in a CPU in this embodiment, the semiconductor device of one embodiment of the present invention can also be used in an LSI such as a digital signal processor (DSP), a custom LSI, or a programmable logic device (PLD), and a radio frequency (RF) tag.

[RF Tag]

The above-described semiconductor device can be used for part of an RF tag.

The RF tag of one embodiment of the present invention includes a memory circuit (a memory device), stores data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have high reliability in order to be used for this purpose.

Figure 25:
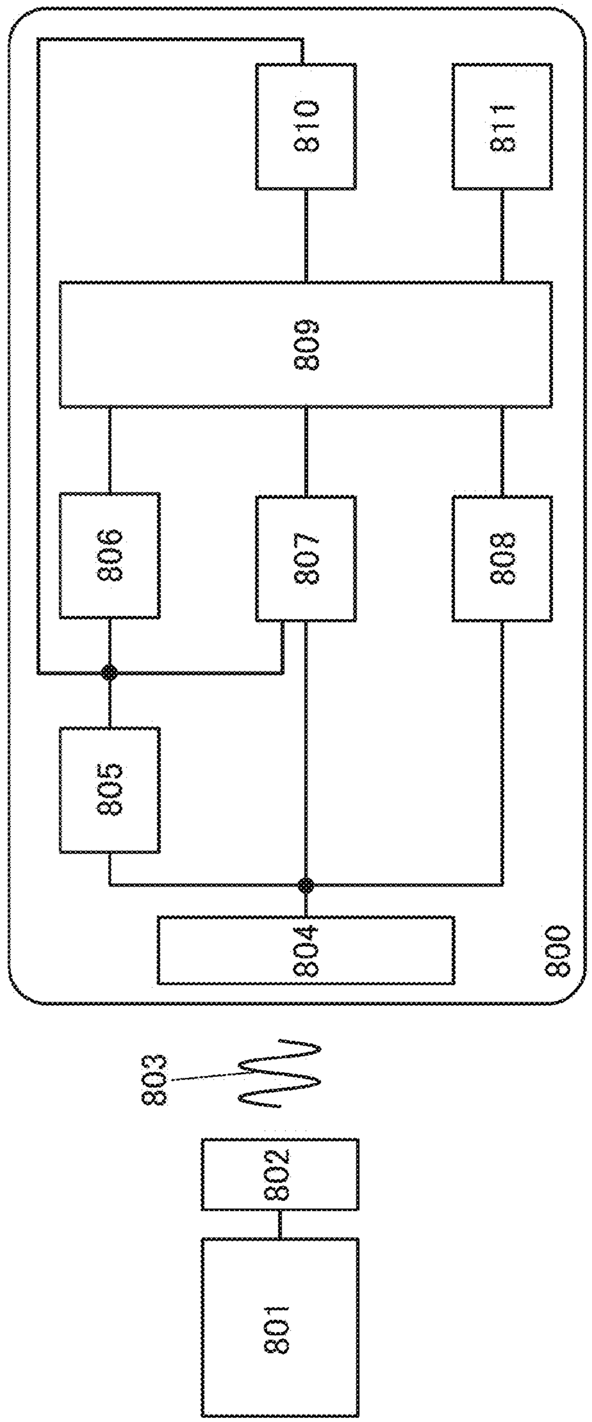
FIG. 25 is a block diagram illustrating an RF tag of one embodiment of the present invention.
Figure 26A:
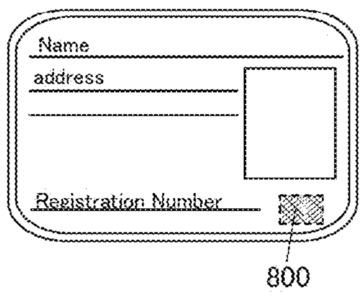
FIGS. 26A to 26F illustrate application examples of an RF tag of one embodiment of the present invention.
Figure 26B:
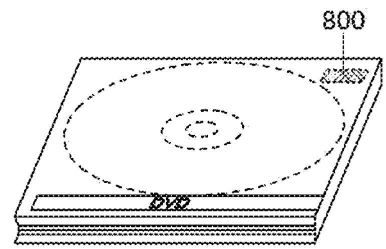
Figure 26C:
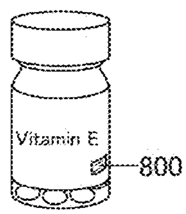
Figure 26D:
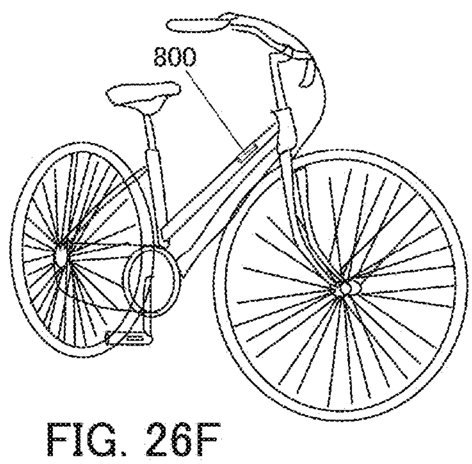
Figure 26E:
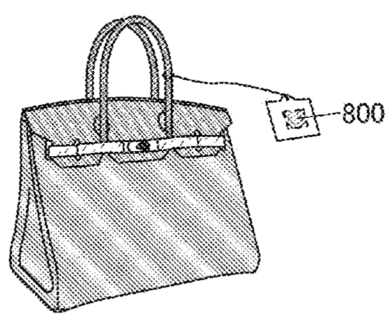
Figure 26F:
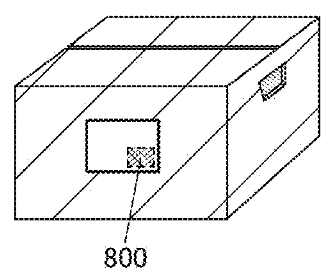

A configuration of the RF tag is described with reference to FIG. 25. FIG. 25 is a block diagram illustrating a configuration example of an RF tag.

As shown in FIG. 25, an RF tag 800 includes an antenna 804 that receives a radio signal 803 that is transmitted from an antenna 802 connected to a communication device 801 (also referred to as an interrogator, a reader/writer, or the like). Any of the above-described transistors may be used in the communication device 801. The RF tag 800 includes a rectifier circuit 805, a constant voltage circuit 806, a demodulation circuit 807, a modulation circuit 808, a logic circuit 809, a memory circuit 810, and a ROM 811. A semiconductor of a transistor having a rectifying function included in the demodulation circuit 807 may be a material that enables a reverse current to be low enough, for example, an oxide semiconductor. This can suppress the phenomenon of a rectifying function becoming weaker due to generation of reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800.

Next, the structure of each circuit is described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. Furthermore, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Furthermore, the ROM 811 stores an identification number (ID) or the like and outputs it in accordance with processing.

Note that the decision whether each circuit described above is provided or not can be made as appropriate.

The memory device described above can be used as the memory circuit 810. Since the memory device of one embodiment of the present invention can retain data even when not powered, the memory circuit can be favorably used for an RF tag. Furthermore, the memory device of one embodiment of the present invention needs less power (voltage) for data writing than a conventional nonvolatile memory; thus, it is possible to prevent a difference between the maximum communication range in data reading and that in data writing. In addition, it is possible to suppress malfunction or incorrect writing that is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

Application examples of an RF tag of one embodiment of the present invention are described with reference to FIGS. 26A to 26F. The RF tag is widely used and can be provided for, for example, products, e.g., bills, coins, securities, bearer bonds, documents such as driver's licenses or resident's cards (see FIG. 26A), recording media such as DVD software or video tapes (see FIG. 26B), containers such as plates, cups, or bottles (see FIG. 26C), packaging containers such as wrapping paper, boxes, or ribbon, moving objects such as bicycles (see FIG. 26D), personal belongings such as bags or glasses, plants, animals, human bodies, clothing, household goods, medical supplies such as medicine and chemicals, and electronic devices (e.g., liquid crystal display devices, EL display devices, television sets, or cellular phones), or tags on products (see FIGS. 26E and 26F).

The RF tag 800 of one embodiment of the present invention is fixed to a product by being attached to a surface thereof or embedded therein. For example, the RF tag 800 is fixed to each product by being embedded in paper of a book, or embedded in an organic resin of a package. Since the RF tag 800 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 800 of one embodiment of the present invention, and the identification function can be utilized to prevent counterfeiting. Moreover, the efficiency of a system such as an inspection system can be improved by providing the RF tag 800 of one embodiment of the present invention for packaging containers, recording media, personal belongings, clothing, household goods, electronic devices, or the like. Moving objects can also have higher security against theft or the like by being provided with the RF tag 800 of one embodiment of the present invention. As described above, the RF tag 800 of one embodiment of the present invention can be used for each application described above.

[Imaging Device]

Next, an example of an imaging device including any of the above-described transistors will be described. In this embodiment, an imaging device 610 will be described with reference to drawings.

Figure 27A:
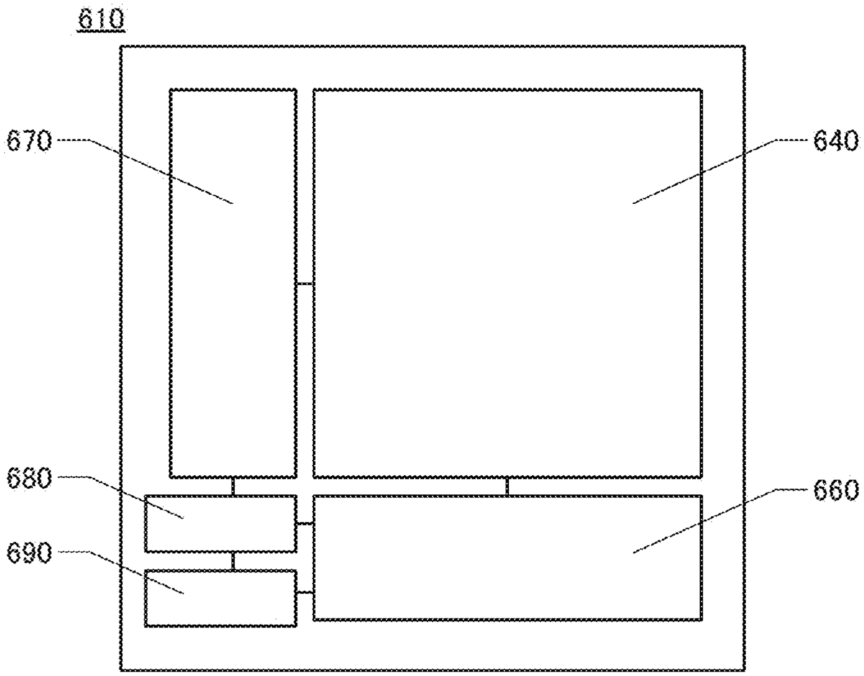
FIGS. 27A and 27B illustrate a structure example of an imaging device.

FIG. 27A is a plan view illustrating a configuration example of the imaging device 610. The imaging device 610 includes a pixel portion 640, a first circuit 660, a second circuit 670, a third circuit 680, and a fourth circuit 690. In this specification and the like, the first circuit 660 to the fourth circuit 690 and the like may be referred to as "peripheral circuit" or "driving circuit". For example, the first circuit 660 can be regarded as part of the peripheral circuit.

Figure 27B:
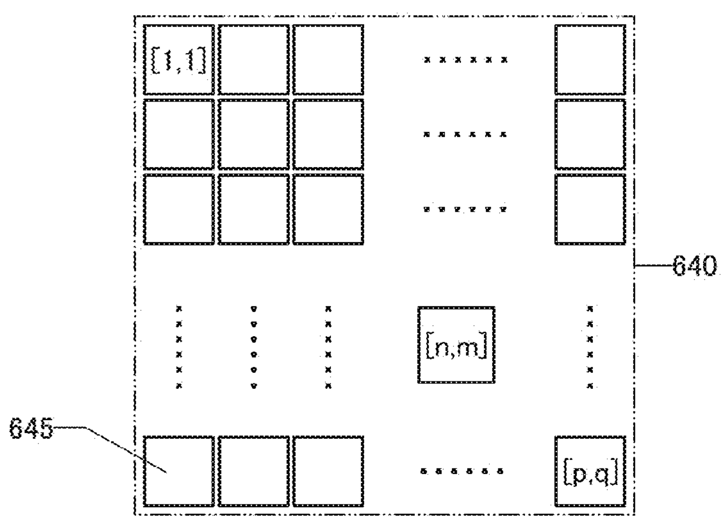

FIG. 27B illustrates a configuration example of the pixel portion 640. The pixel portion 640 includes a plurality of pixels 645 (imaging elements) arranged in matrix with p rows and q columns (p and q are each an integer greater than or equal to 2). Note that in FIG. 27B, n is a natural number of greater than or equal to 1 and smaller than or equal to p, and m is a natural number of greater than or equal to 1 and smaller than or equal to q.

For example, using the pixels 645 arranged in a 1920×1080 matrix, the imaging device 610 that can take an image with "full high definition" (also referred to as "2K resolution", "2K1K", "2K", and the like) can be obtained. Furthermore, with the imaging device 610 including the pixels 645 arranged in a matrix of 4096×2160, for example, an image with "ultra high definition" (also referred to as "4K resolution," "4K2K," "4K," and the like) can be taken. Using the pixels 645 arranged in a 8192×4320 matrix, the imaging device 610 that can take an image with "super high definition" (also referred to as "8K resolution", "8K4K", "8K", and the like) can be obtained. Using a larger number of the pixels 645, the imaging device 610 can be obtained which can take an image with 16K or 32K resolution.

The first circuit 660 and the second circuit 670 are connected to the plurality of pixels 645 and have a function of supplying signals for driving the plurality of pixels 645. The first circuit 660 may have a function of processing an analog signal output from the pixel 645. The third circuit 680 may have a function of controlling the operation timing of the peripheral circuit. For example, the third circuit 680 may have a function of generating a clock signal. Furthermore, the third circuit 680 may have a function of converting the frequency of a clock signal supplied from the outside. Moreover, the third circuit 680 may have a function of supplying a reference potential signal (e.g., a ramp wave signal).

Figure 28:
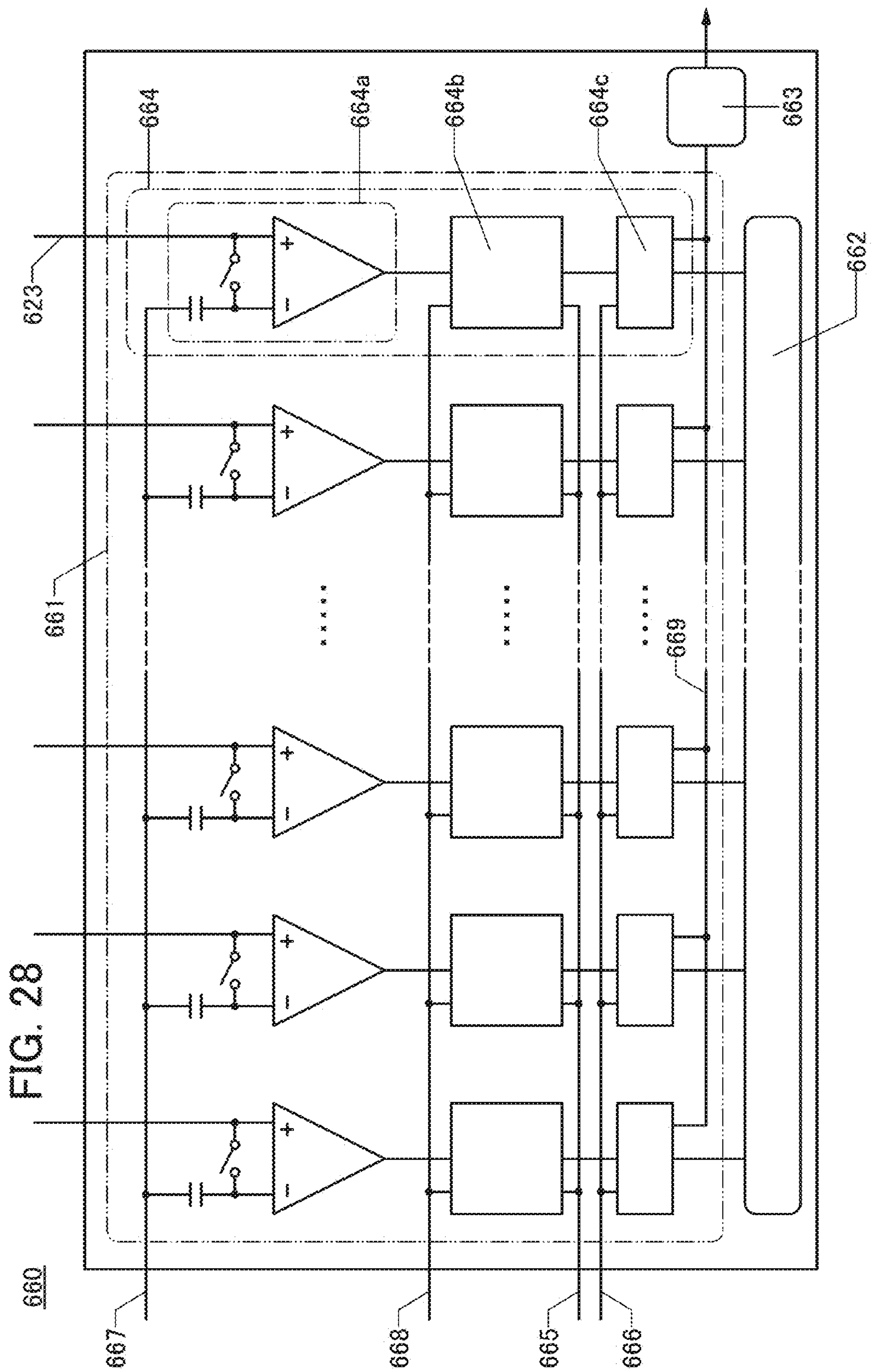
FIG. 28 illustrates a configuration example of a peripheral circuit.

FIG. 28 is a configuration example of the first circuit 660. The first circuit 660 illustrated in FIG. 28 includes a signal processing circuit 661, a column driver circuit 662, and an output circuit 663. The signal processing circuit 661 includes a circuit 664 provided in each column. The circuit 664 includes a circuit 664*a* which can remove noise by a correlated double sampling (CDS) method (also referred to as a "CDS circuit"), a counter circuit 664*b*, and a latch circuit 664*c*. The circuit 664 has a function of analog-digital conversion. The signal processing circuit 661 can function as a column-parallel (column type) analog-digital conversion device.

The circuit 664*a* includes a comparator, a switch, and a capacitor. Two input terminals of the comparator are connected to each other via the switch. As the switch, a transistor, a micro electro mechanical systems (MEMS) element, or the like may be used. One terminal of the comparator is connected to a wiring 667 via the capacitor. The other terminal of the comparator is connected to a wiring 623 which is provided in each column. Note that the other terminal of the comparator and the wiring 623 may be connected to each other via a capacitor.

The circuit 664*a* has a function of comparing a potential of an analog signal (imaging data) input from the wiring 623 with that of a reference potential signal (e.g., a ramp wave signal) input from the wiring 667 and outputting an H potential or an L potential. A clock signal from a wiring 668 and the H potential or the L potential output from the circuit 664*a* are input to the counter circuit 664*b*. The counter circuit 664*b* measures the length of a period in which the H potential or the L potential is input and outputs the measurement result to the latch circuit 664*c* as an N-bit digital signal. A set signal or a reset signal is input from a wiring 665 to the counter circuit 664*b*. The latch circuit 664*c* has a function of holding the digital signal. A set signal or a reset signal is input from a wiring 666 to the latch circuit 664*c*.

The column driver circuit 662 is also referred to as a column selection circuit, a horizontal driver circuit, or the like. The column driver circuit 662 generates a selection signal for selecting a column from which the digital signal held in the latch circuit 664*c* is to be read. The column driver circuit 662 can be formed using a shift register or the like. Columns are sequentially selected by the column driver circuit 662, and the digital signal output from the latch circuit 664*c* in the selected column is input to the output circuit 663 via a wiring 669. The wiring 669 can function as a horizontal transfer line.

The digital signal input to the output circuit 663 is processed in the output circuit 663, and is output outside the imaging device 610. The output circuit 663 can be formed using a buffer circuit, for example. The output circuit 663 may have a function of controlling the timing at which a signal is output outside the imaging device 610.

The second circuit 670 has a function of generating and outputting a selection signal for selecting the pixel 645 from which a signal is read. Note that the second circuit 670 may also be referred to as a row selection circuit or a vertical driver circuit. In this manner, an imaging data which is an analog signal can be converted to an N-bit digital signal to be output to the outside.

The peripheral circuit includes at least one of a logic circuit, a switch, a buffer, an amplifier circuit, and a converter circuit. A semiconductor device such as an IC chip may be used as part or the whole of the peripheral circuit. Furthermore, the semiconductor device of one embodiment of the present invention may be provided in part of the peripheral circuit.

Note that in the peripheral circuit, at least one of the first circuit 660 to the fourth circuit 690 may be omitted. For example, when one of the first circuit 660 and the fourth circuit 690 additionally has a function of the other of the first circuit 660 and the fourth circuit 690, the other of the first circuit 660 and the fourth circuit 690 may be omitted. For another example, when one of the second circuit 670 and the third circuit 680 additionally has a function of the other of the second circuit 670 and the third circuit 680, the other of the second circuit 670 and the third circuit 680 may be omitted. As another example, a function of another peripheral circuit may be added to one of the first to fourth circuits 660 to 690 to omit that peripheral circuit.

Figure 29A:
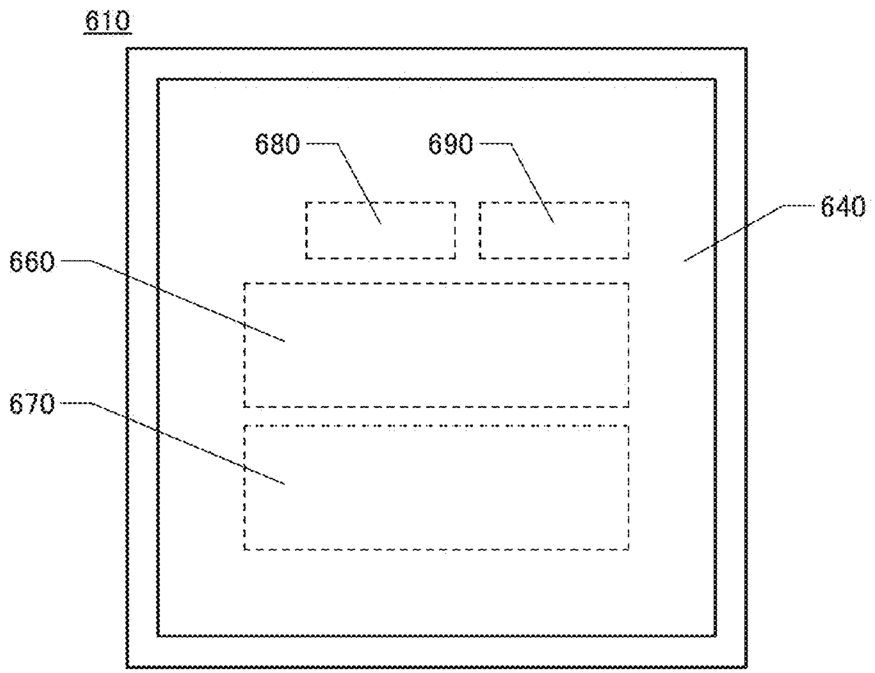
FIGS. 29A and 29B illustrate a structure example of an imaging device.
Figure 29B:
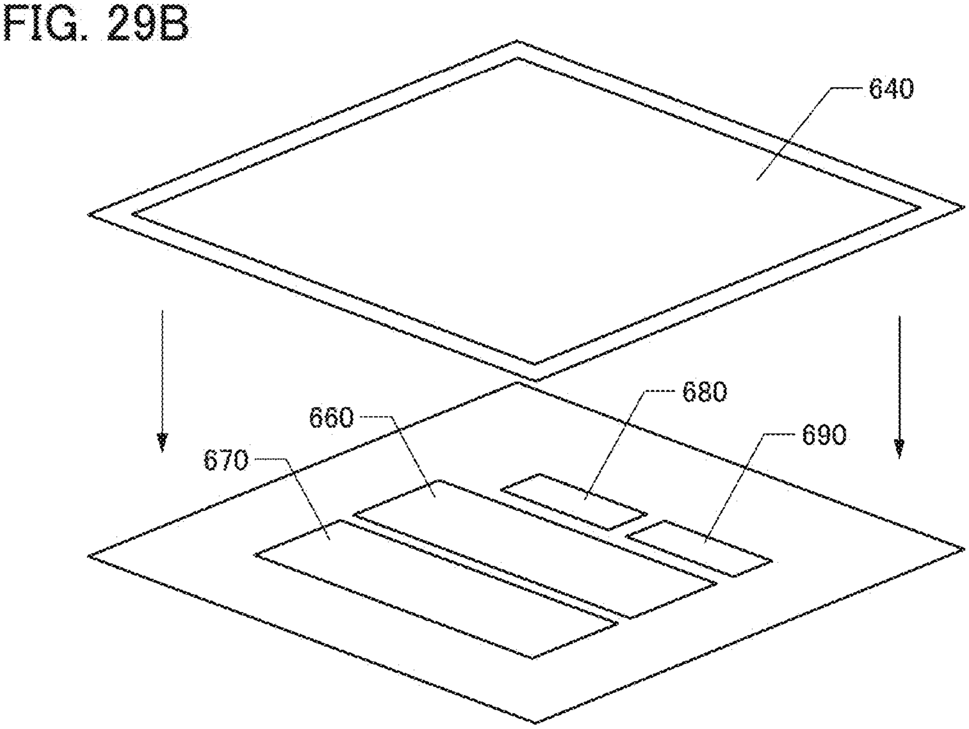

As illustrated in FIGS. 29A and 29B, the pixel portion 640 may be provided over the first circuit 660 to the fourth circuit 690 to overlap with the first circuit 660 to the fourth circuit 690. FIG. 29A is a top view of the imaging device 610 in which the pixel portion 640 is provided over the first circuit 660 to the fourth circuit 690 to overlap with the first circuit 660 to the fourth circuit 690. FIG. 29B is a perspective view illustrating the structure of the imaging device 610 illustrated in FIG. 29A.

The provision of the pixel portion 640 over the first circuit 660 to the fourth circuit 690 can increase the area occupied by the pixel portion 640 in the imaging device 610. Accordingly, the light sensitivity, the dynamic range, the resolution, the quality of a captured image, or the integration degree of the imaging device 610 can be improved.

[Pixel (Imaging Element)]

Next, an example of a circuit which can be used for the pixel 645 will be described. The pixel 645 illustrated in FIG. 30A includes a photoelectric conversion element 638, a transistor 612, a transistor 635, and a capacitor 633. One of a source and a drain of the transistor 612 is electrically connected to the photoelectric conversion element 638. The other of the source and the drain of the transistor 612 is electrically connected to a gate of the transistor 635 via a node 637 (charge accumulation portion).

Here, an OS transistor is preferably used as the transistor 612. Since the off-state current of the OS transistor can be extremely small, the capacitor 633 can be small. Alternatively, the capacitor 633 can be omitted as in the pixel 645 shown in FIG. 30B. Furthermore, when the transistor 612 is an OS transistor, the potential of the node 637 is less likely to be changed. Thus, an imaging device that is less likely to be affected by noise can be provided. For example, any of the transistors described in the above embodiment can be used for the transistor 612. In addition, an OS transistor may also be used as the transistor 635.

A diode element formed using a silicon substrate with a PN junction or a PIN junction can be used as the photoelectric conversion element 638. Alternatively, a PIN diode element formed using an amorphous silicon film, a microcrystalline silicon film, or the like may be used. Alternatively, a diode-connected transistor may be used. Alternatively, a variable resistor or the like utilizing a photoelectric effect may be formed using silicon, germanium, selenium, or the like.

The photoelectric conversion element may be formed using a material capable of generating electric charge by absorbing radiation. Examples of the material capable of generating electric charge by absorbing radiation include lead iodide, mercury iodide, gallium arsenide, CdTe, and CdZn.

Figure 30A:
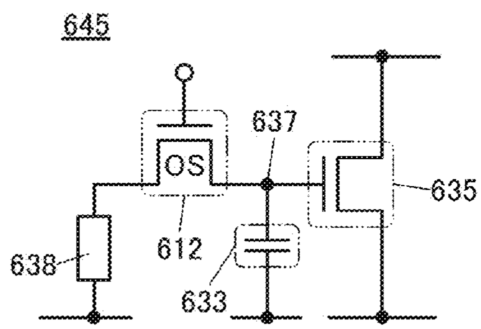
FIGS. 30A to 30C are each a circuit diagram illustrating an example of an imaging device.
Figure 30B:
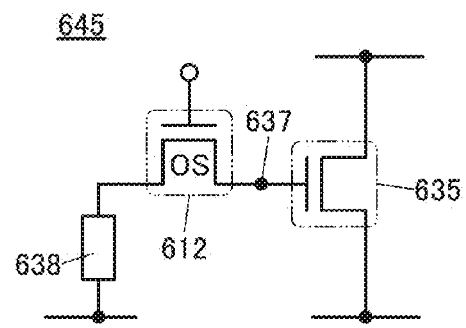
Figure 30C:
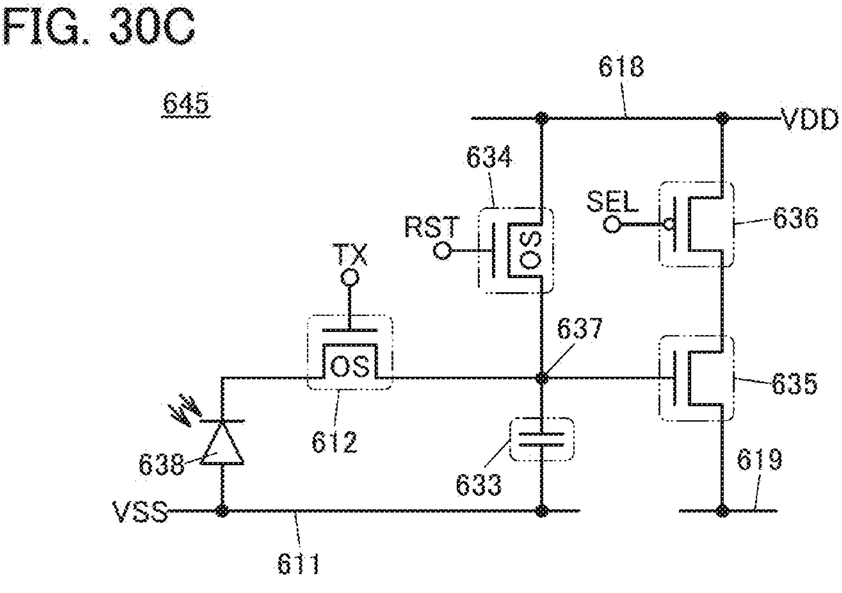

In the pixel 645 illustrated in FIG. 30C, a photodiode is used as the photoelectric conversion element 638. The pixel 645 illustrated in FIG. 30C includes the photoelectric conversion element 638, the transistor 612, a transistor 634, a transistor 635, a transistor 636, and the capacitor 633. One of the source and the drain of the transistor 612 is electrically connected to a cathode of the photoelectric conversion element 638. The other of the source and the drain of the transistor 612 is electrically connected to the node 637. An anode of the photoelectric conversion element 638 is electrically connected to a wiring 611. One of a source and a drain of the transistor 634 is electrically connected to the node 637, and the other is electrically connected to a wiring 618. The gate of the transistor 635 is electrically connected to the node 637. One of a source and a drain of the transistor 635 is electrically connected to a wiring 619. The other of the source and the drain of the transistor 635 is electrically connected to one of a source and a drain of the transistor 636. The other of the source and the drain of the transistor 636 is electrically connected to the wiring 618. One electrode of the capacitor 633 is electrically connected to the node 637. The other electrode of the capacitor 633 is electrically connected to the wiring 611.

The transistor 612 can function as a transfer transistor. A gate of the transistor 612 is supplied with a transfer signal TX. The transistor 634 can function as a reset transistor. A gate of the transistor 634 is supplied with a reset signal RST. The transistor 635 can function as an amplifier transistor. The transistor 636 can function as a selection transistor. A gate of the transistor 636 is supplied with a selection signal SEL. Moreover, $V_{DD}$ is supplied to the wiring 618 and $V_{SS}$ is supplied to the wiring 611.

Next, operations of the pixel 645 illustrated in FIG. 30C will be described. First, the transistor 634 is turned on so that $V_{DD}$ is supplied to the node 637 (reset operation). Then, the transistor 634 is turned off so that $V_{DD}$ is retained at the node 637. Next, the transistor 612 is turned on so that the potential of the node 637 is changed in accordance with the amount of light received by the photoelectric conversion element 638 (accumulation operation). After that, the transistor 612 is turned off so that the potential of the node 637 is retained. Next, the transistor 636 is turned on so that a potential corresponding to the potential of the node 637 is output to the wiring 619 (selection operation). Measuring the potential of the wiring 619 can determine the amount of light received by the photoelectric conversion element 638.

An OS transistor is preferably used as each of the transistors 612 and 634. Since the off-state current of the OS transistor is extremely low as described above, the capacitor 633 can be small or omitted. Furthermore, when the transistors 612 and 634 are OS transistors, the potential of the node 637 is less likely to be changed. Thus, an imaging device which is less likely to be affected by noise can be provided.

A high-resolution imaging device can be obtained when the imaging device 610 including any of the pixels 645 illustrated in FIGS. 30A to 30C are arranged in a matrix.

For example, using the imaging devices 610 arranged in a 1920×1080 matrix, an imaging device can be obtained which can take an image with "full high definition" (also referred to as "2K resolution", "2K1K", "2K", and the like). Using the imaging devices 610 arranged in a 4096×2160 matrix, an imaging device can be obtained which can take an image with "ultra high definition" (also referred to as "4K resolution", "4K2K", "4K", and the like). Using the imaging devices 610 arranged in a 8192×4320 matrix, an imaging device can be obtained which can take an image with "super high definition" (also referred to as "8K resolution", "8K4K", "8K", and the like). Using a larger number of the pixels 645, an imaging device can be obtained which can take an image with 16K or 32K resolution.

Figure 31:
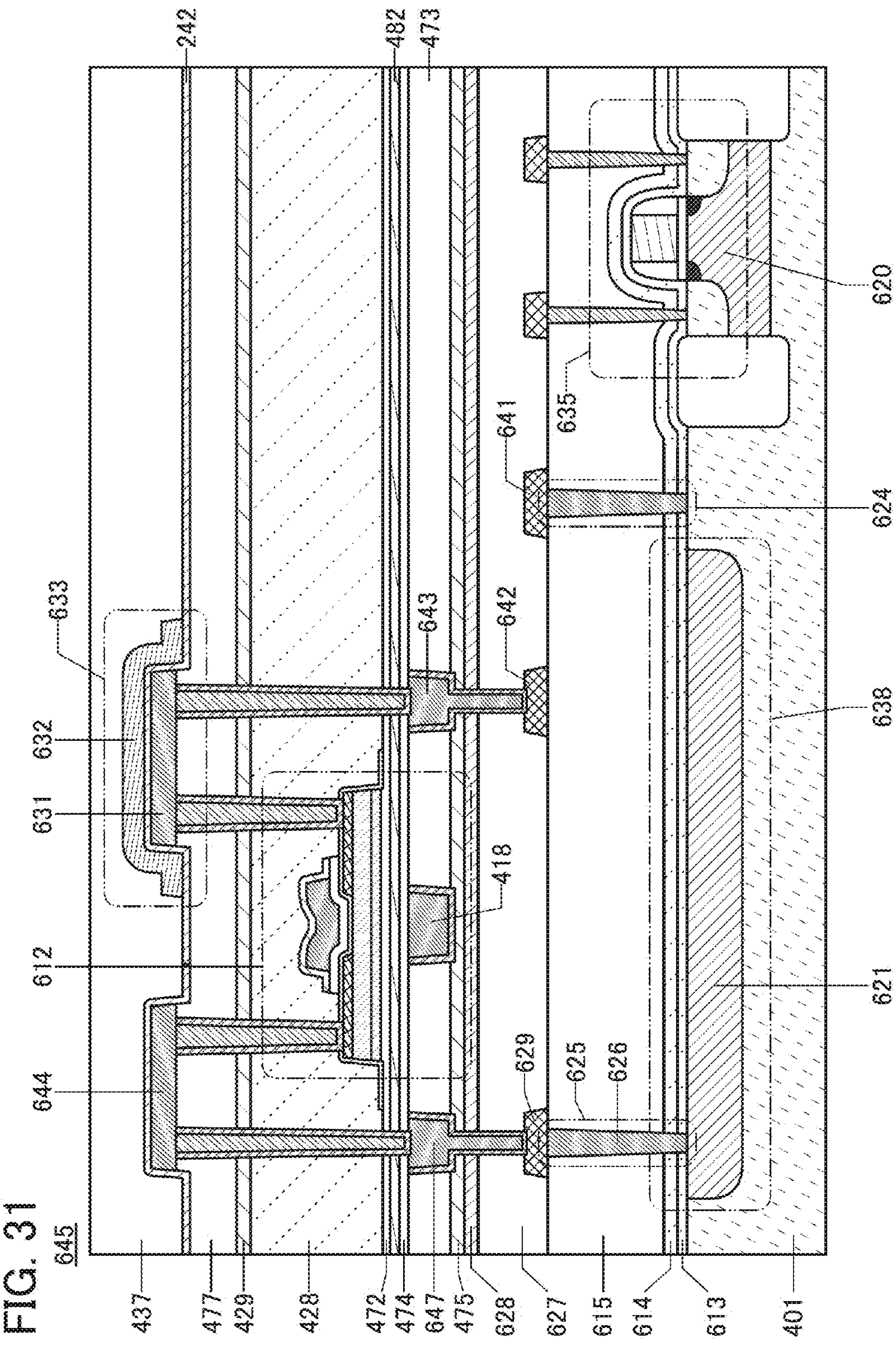
FIG. 31 illustrates a structure example of an imaging device.

FIG. 31 illustrates a structure example of the pixel 645. FIG. 31 is a cross-sectional view of the pixel 645.

In the pixel 645 illustrated in FIG. 31, an n-type semiconductor is used for the substrate 401. A p-type semiconductor 621 of the photoelectric conversion element 638 is provided in the substrate 401. A portion of the substrate 401 functions as an n-type semiconductor 622 of the photoelectric conversion element 638.

The transistor 635 is provided on the substrate 401. The transistor 635 can function as an n-channel transistor. A well 620 of a p-type semiconductor is provided in a portion of the substrate 401. The well 620 can be provided by a method similar to that for forming the p-type semiconductor 621. The well 620 and the p-type semiconductor 621 can be formed at the same time.

The insulating layer 613, the insulating layer 614, and the insulating layer 615 are formed over the photoelectric conversion element 638 and the transistor 635.

An opening 624 is formed in the insulating layers 613 to 615 so as to overlap with the n-type semiconductor 622, and an opening 625 is formed in the insulating layers 613 to 615 to overlap with the p-type semiconductor 621. Contact plugs 626 are formed in the opening 624 and the opening 625. The contact plugs 626 can be provided in a manner similar to that of the above-described contact plug. The number of openings (624 and 625) to be formed or their arrangement are not particularly limited. Thus, an imaging device with high layout flexibility can be provided.

An electrode 641, an electrode 629, and an electrode 642 are formed over the insulating layer 615. The electrode 641 is electrically connected to the n-type semiconductor 622 via the contact plug 626 provided in the opening 624. The electrode 629 is electrically connected to the p-type semiconductor 621 via the contact plug 626 provided in the opening 625. The electrode 642 can function as an electrode of the capacitor 633.

An insulating layer 627 is formed so as to cover the electrode 641, the electrode 642, and the electrode 629. The insulating layer 627 can be formed using a material and a method which are similar to those of the insulating layer 615. A surface of the insulating layer 627 may be subjected to CMP treatment. By the CMP treatment, unevenness of the surface can be reduced, and coverage with an insulating layer or a conductive layer formed later can be increased. The electrode 641, the electrode 642, and the electrode 629 can be formed using a material and a method which are similar to those of the above-described electrode.

An insulating layer 628 and the insulating layer 475 are formed over the insulating layer 627, and an electrode 647, the electrode 418, and an electrode 643 are formed over the insulating layer 475. The electrode 647 is electrically connected to the electrode 629.

An electrode 644 and the electrode 631 are formed over the insulating layer 477. An insulating layer 242 is formed to cover the electrode 644 and the electrode 631. An electrode 632 is formed to cover the electrode 631 with the insulating layer 242 provided therebetween. A region where the electrode 631, the insulating layer 242, and the electrode 632 overlap with each other functions as the capacitor 633.

The electrode 644 is electrically connected to one of the source and the drain of the transistor 612. The electrode 644 is electrically connected to the electrode 647. An insulating layer 437 is formed to cover the electrode 632.

Modification Example 1

Figure 32:
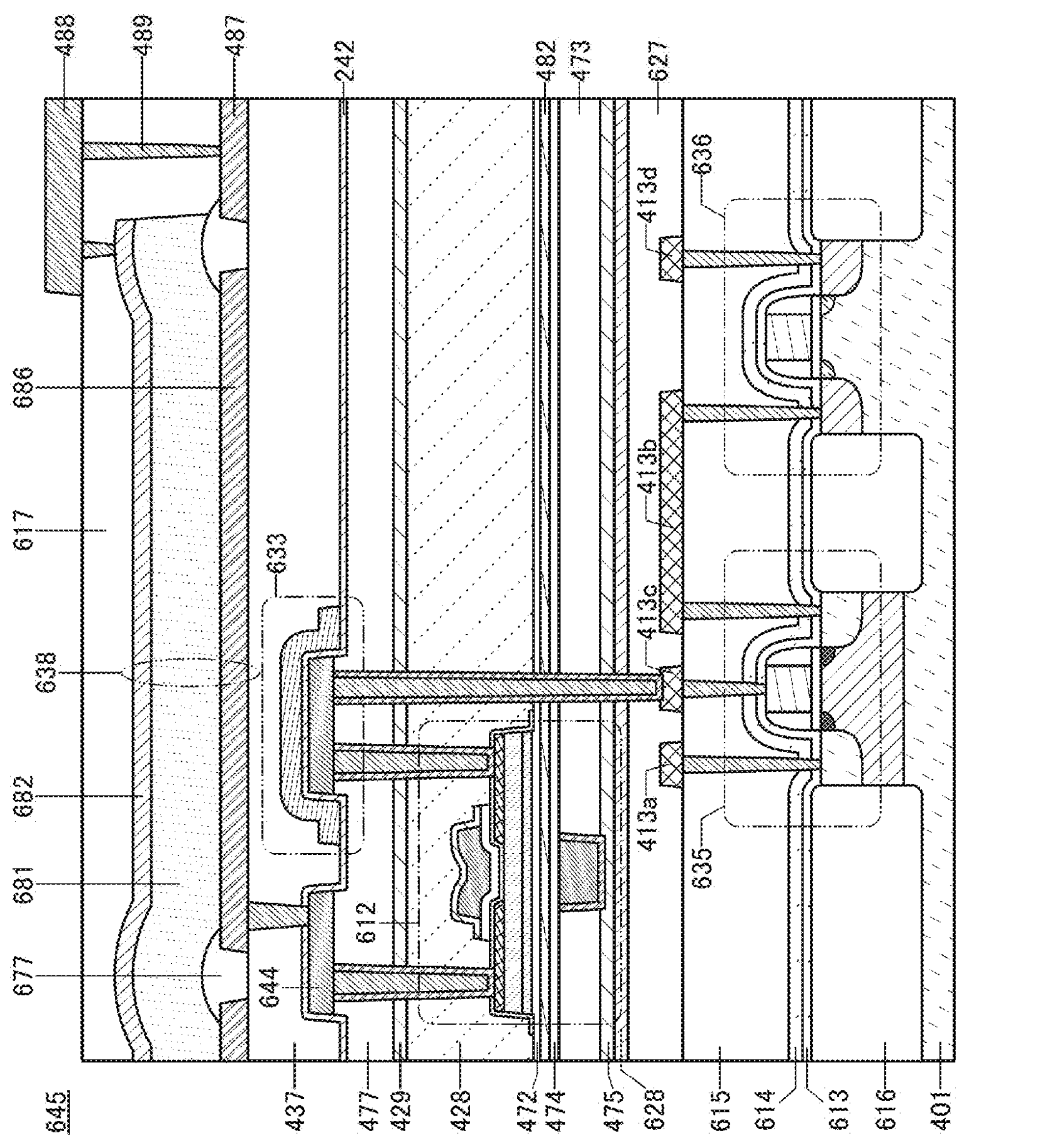
FIG. 32 illustrates a structure example of an imaging device.

FIG. 32 illustrates a structural example of the pixel 645 which is different from that in FIG. 31.

In the pixel 645 illustrated in FIG. 32, the transistor 635 and the transistor 636 are provided on the substrate 401. The transistor 635 can function as an n-channel transistor. The transistor 636 can function as a p-channel transistor.

The transistor 635 and the transistor 636 are electrically isolated from each other by an element isolation layer 616. The element isolation layer can be formed by a local oxidation of silicon (LOCOS) method, a shallow trench isolation (STI) method, or the like.

The electrode 413*a*, the electrode 413*b*, the electrode 413*c*, and an electrode 413*d* are formed over the insulating layer 615. The electrode 413*a* is electrically connected to one of the source and the drain of the transistor 635, and the electrode 413*b* is electrically connected to the other of the source and the drain of the transistor 635. The electrode 413*c* is electrically connected to the gate of the transistor 635. The electrode 413*b* is electrically connected to one of the source and the drain of the transistor 636, and the electrode 413*d* is electrically connected to the other of the source and the drain of the transistor 636.

In the pixel 645 illustrated in FIG. 32, the photoelectric conversion element 638 is provided over the insulating layer 437. An insulating layer 617 is provided over the photoelectric conversion element 638, and an electrode 488 is provided over the insulating layer 617. The insulating layer 617 can be formed using a material and a method which are similar to those of the insulating layer 437.

The photoelectric conversion element 638 illustrated in FIG. 32 includes a photoelectric conversion layer 681 between an electrode 686 formed with a metal material or the like and a light-transmitting conductive layer 682. FIG. 32 illustrates the photoelectric conversion layer 681 including a selenium-based material for the photoelectric conversion layer 681. The photoelectric conversion element 638 including a selenium-based material has high external quantum efficiency with respect to visible light. Moreover, the use of the photoelectric conversion element can achieve a highly sensitive sensor in which the amplification of electrons with respect to the amount of incident light is large owing to an avalanche phenomenon. Furthermore, the selenium-based material has a high light-absorption coefficient, which leads to an advantage that the photoelectric conversion layer 681 can be formed thin.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity and light-absorption coefficient for visible light than amorphous selenium.

Although the photoelectric conversion layer 681 is illustrated as a single layer, gallium oxide, cerium oxide, or the like as a hole blocking layer may be provided on the light reception side of the selenium-based material, and nickel oxide, antimony sulfide, or the like as an electron injection blocking layer may be provided on the electrode 686 side.

Furthermore, the photoelectric conversion layer 681 may be a layer including a compound of copper, indium, and selenium (CIS). Alternatively, a layer including a compound of copper, indium, gallium, and selenium (CIGS) may be used. With CIS or CIGS, a photoelectric conversion element that can utilize an avalanche phenomenon as in the case of using a single layer of selenium can be formed.

Furthermore, CIS and CIGS are p-type semiconductors, and an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to cause the avalanche phenomenon. Since the OS transistor has higher drain withstand voltage than a Si transistor, the application of a relatively high voltage to the photoelectric conversion element is easy. Thus, by combination of the OS transistor having high drain withstand voltage and a photoelectric conversion element including the selenium-based material in the photoelectric conversion layer, a highly sensitive and highly reliable imaging device can be obtained.

For the light-transmitting conductive layer 682, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 682 is not limited to a single layer, and may be a stacked layer of different films. Although the light-transmitting conductive layer 682 and a wiring 487 are electrically connected to each other through the electrode 488 and a contact plug 489 in the structure illustrated in FIG. 32, the light-transmitting conductive layer 682 and the wiring 487 may be in direct contact with each other.

The electrode 686, the wiring 487, and the like may each have a structure in which a plurality of conductive layers are stacked. For example, the electrode 686 can include a conductive layer 686*a* and a conductive layer 686*b* and the wiring 487 can include a conductive layer 487*a* and a conductive layer 487*b* (not illustrated). For example, the conductive layer 686*a* and the conductive layer 487*a* may be made of a low-resistance metal or the like, and the conductive layer 686*b* and the conductive layer 487*b* may be made of a metal or the like that exhibits an excellent contact property with the photoelectric conversion layer 681. Such a structure improves the electrical properties of the photoelectric conversion element PD. Note that some kinds of metal may cause electrochemical corrosion by being in contact with the light-transmitting conductive layer 682. Even when such a metal is used in the conductive layer 487*a*, electrochemical corrosion can be prevented by the conductive layer 487*b*.

The conductive layer 686*b* and the conductive layer 487*b* can be formed using, for example, molybdenum, tungsten, or the like. The conductive layers 686*a* and 487*a* can be formed using, for example, aluminum, titanium, or a stack of titanium, aluminum, and titanium that are stacked in that order.

The insulating layer 617 may be a multilayer. Note that a partition wall 677 can be formed using an inorganic insulator, an insulating organic resin, or the like. The partition wall 677 may be colored black or the like in order to shield the transistors and the like from light and/or to determine the area of a light-receiving portion in each pixel.

Alternatively, a PIN diode element or the like formed using an amorphous silicon film, a microcrystalline silicon film, or the like may be used as the photoelectric conversion element 638. In the photodiode, an n-type semiconductor layer, an i-type semiconductor layer, and a p-type semiconductor layer are stacked in that order. The i-type semiconductor layer is preferably formed using amorphous silicon. The p-type semiconductor layer and the n-type semiconductor layer can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

Note that a PN or PIN diode element is preferably provided such that the p-type semiconductor layer serves as a light-receiving surface, in which case the output current of the photoelectric conversion element 638 can be increased.

The photoelectric conversion element 638 formed using the selenium-based material, amorphous silicon, or the like can be formed through general semiconductor manufacturing processes such as a deposition process, a lithography process, and an etching process.

[Semiconductor Wafer and Chip]

Figure 33A:
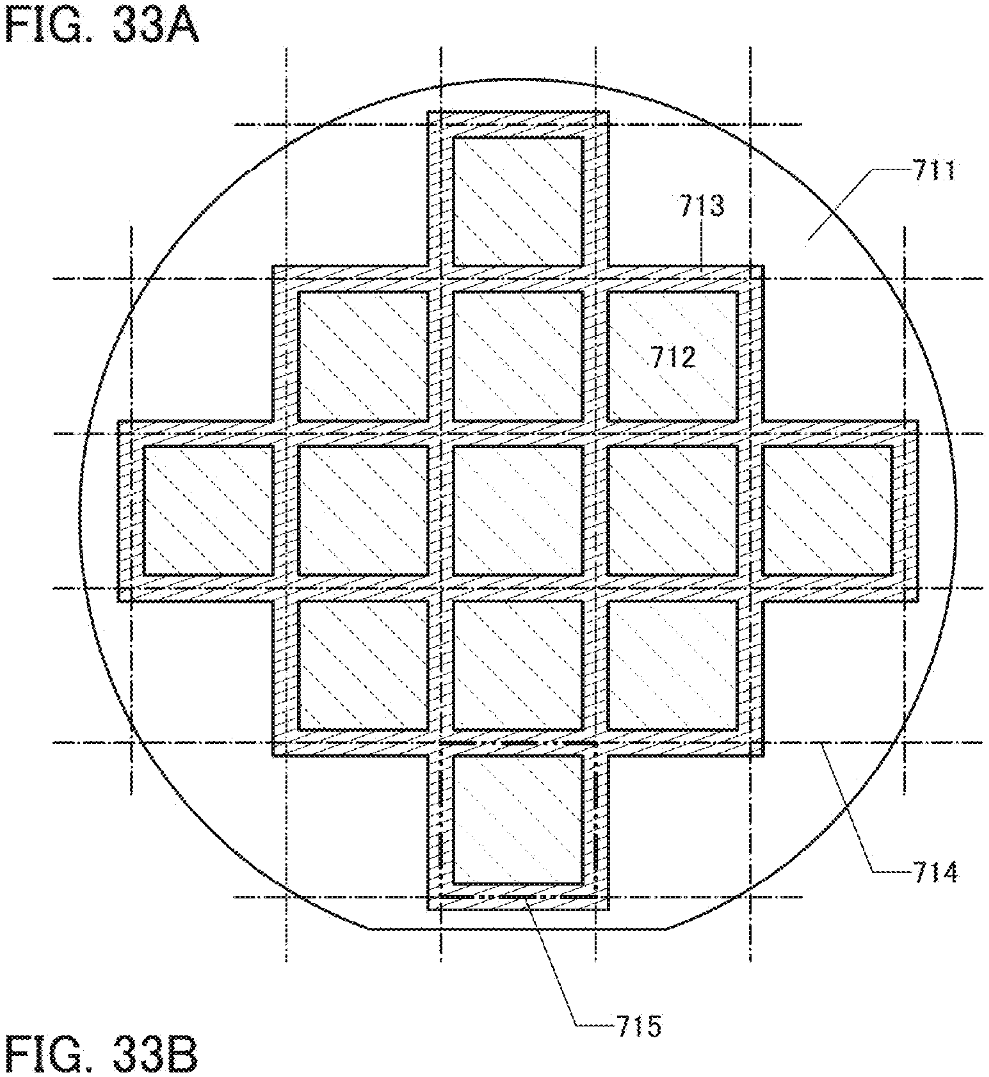
FIGS. 33A and 33B are top views of a semiconductor wafer of one embodiment of the present invention.

FIG. 33A is a top view illustrating a substrate 711 before dicing treatment. As the substrate 711, a semiconductor substrate (also referred to as a "semiconductor wafer") can be used, for example. A plurality of circuit regions 712 are provided over the substrate 711. A semiconductor device, a CPU, or an RF tag according to one embodiment of the present invention, an image sensor, or the like can be provided in the circuit region 712.

Figure 33B:
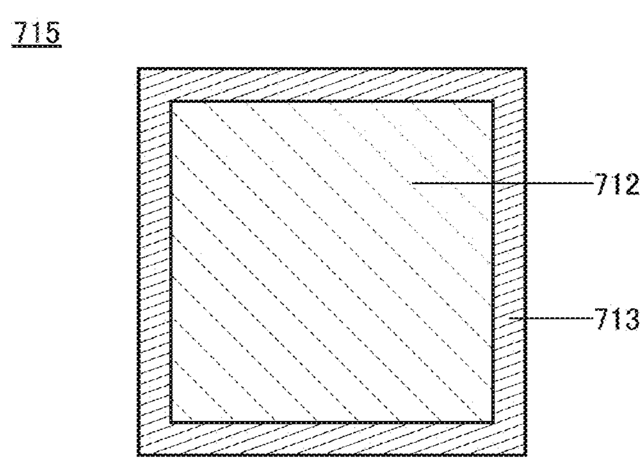

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 33B is an enlarged view of the chip 715.

A conductive layer or a semiconductor layer may be provided in the separation regions 713. Providing a conductive layer or a semiconductor layer in the separation regions 713 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 713 allows a reduction in the usage of the pure water. Therefore, the cost of manufacturing semiconductor devices can be reduced. Thus, semiconductor devices can be manufactured with improved productivity.

For a semiconductor layer provided in the separation regions 713, a material having a band gap greater than or equal to 2.5 eV and less than or equal to 4.2 eV, preferably greater than or equal to 2.7 eV and less than or equal to 3.5 eV is preferably used. The use of such a material allows accumulated charges to be released slowly; thus, the rapid move of charges due to ESD can be suppressed and electrostatic breakdown is less likely to occur.

[Electronic Component]

Figure 34A:
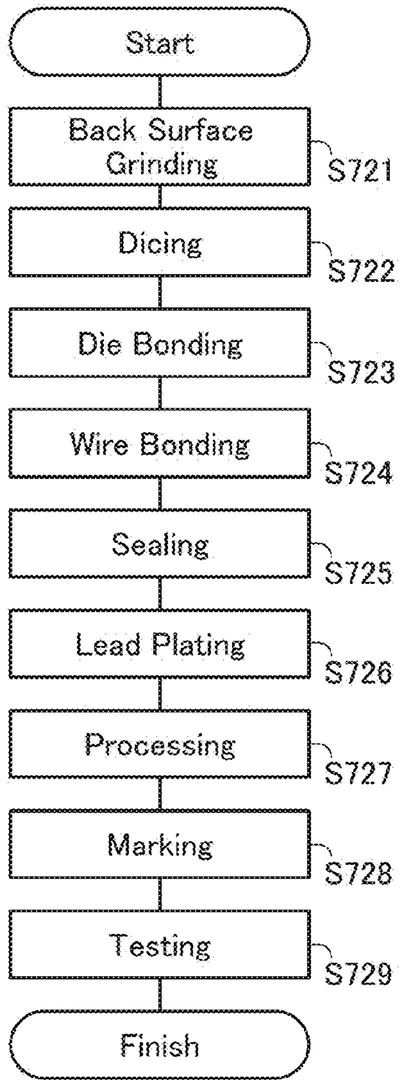
FIG. 34A is a flowchart showing a manufacturing process example of an electronic component.
Figure 34B:
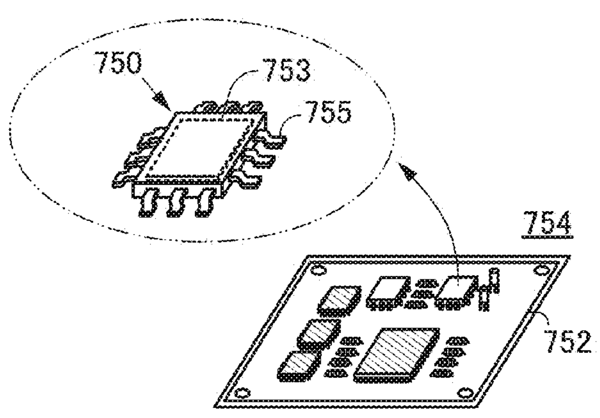
FIG. 34B is a schematic perspective view of the electronic component.

FIGS. 34A and 34B show an example where the chip 715 is used to make an electronic component. Note that the electronic component is also referred to as a semiconductor package or an IC package. This electronic component has a plurality of standards and names depending on a terminal extraction direction and a terminal shape.

The electronic component can be completed in an assembly process (post-process) in which the semiconductor device described in the above embodiment and a component other than the semiconductor device are combined.

The post-process will be described with reference to a flow chart in FIG. 34A. After an element substrate including the semiconductor device described in any of the above embodiments is completed in a pre-process, a back surface grinding step in which a back surface (a surface where a semiconductor device and the like are not formed) of the element substrate is ground is performed (Step S721). When the element substrate is thinned by grinding, warpage or the like of the element substrate is reduced, so that the size of the electronic component can be reduced.

Next, the element substrate is divided into a plurality of chips (chips 715) in a dicing step (Step S722). Then, the separated chips are individually picked up to be bonded to a lead frame in a die bonding step (Step S723). To bond a chip and a lead frame in the die bonding step, a method such as resin bonding or tape-automated bonding is selected as appropriate depending on products. Note that the chip may be bonded to an interposer substrate instead of the lead frame.

Next, a wire bonding step for electrically connecting a lead of the lead frame and an electrode on the chip through a metal wire is performed (Step S724). As the metal wire, a silver wire or a gold wire can be used. Ball bonding or wedge bonding can be used as the wire bonding.

The wire-bonded chip is subjected to a molding step of sealing the chip with an epoxy resin or the like (Step S725). Through the molding step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, the lead of the lead frame is plated in a lead plating step (Step S726). This plating process prevents rust of the lead and facilitates soldering at the time of mounting the chip on a printed circuit board in a later step. Then, the lead is cut and processed in a formation step (Step S727).

Next, a printing (marking) step is performed on a surface of the package (Step S728). After a testing step (Step S729) for checking whether an external shape is good and whether there is a malfunction, for example, the electronic component is completed.

FIG. 34B is a perspective schematic diagram of a completed electronic component. FIG. 34B is a perspective schematic diagram illustrating a quad flat package (QFP) as an example of the electronic component. An electronic component 750 in FIG. 34B includes a lead 755 and a semiconductor device 753. As the semiconductor device 753, the semiconductor device described in any of the above embodiments can be used.

The electronic component 750 in FIG. 34B is mounted on a printed circuit board 752, for example. A plurality of electronic components 750 that are combined and electrically connected to each other over the printed circuit board 752; thus, a substrate on which the electronic components are mounted (a circuit board 754) is completed. The completed circuit board 754 is provided in an electronic device or the like.

[Display Device]

Figure 35A:
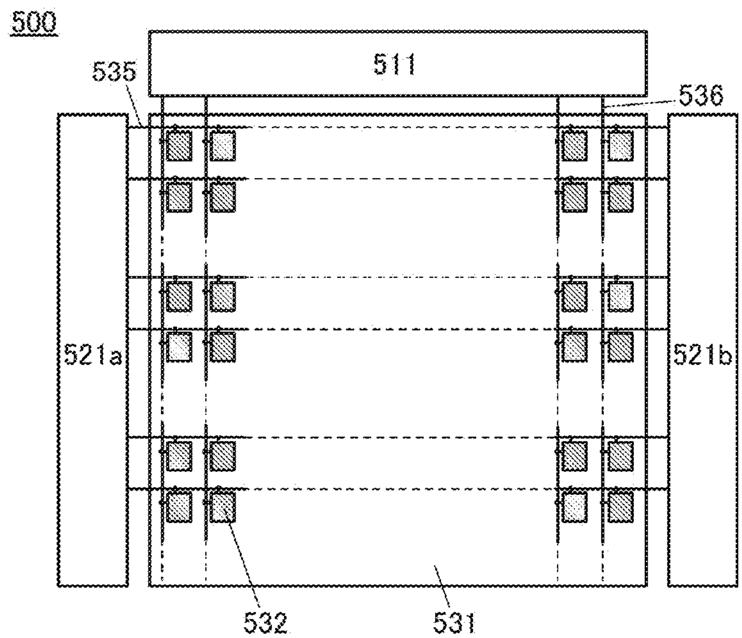
FIGS. 35A to 35C each illustrate an example of a display device.

Next, an example of a display device including any of the above-described transistors will be described. FIG. 35A is a block diagram illustrating a structure example of a display device 500.

The display device 500 in FIG. 35A includes driver circuits 511, 521*a*, and 521*b*, and a display region 531. Note that the driver circuits 511, 521*a*, and 521*b* are collectively referred to as a driver circuit or a peripheral driver circuit in some cases.

The driver circuits 521*a* and 521*b* can function as, for example, scan line driver circuits. The driver circuit 511 can function as, for example, a signal line driver circuit. Note that one of the driver circuits 521*a* and 521*b* may be omitted. Alternatively, some sort of circuit facing the driver circuit 511 with the display region 531 provided therebetween may be provided.

The display device 500 illustrated as an example in FIG. 35A includes p wirings 535 which are arranged substantially parallel to each other and whose potentials are controlled by the driver circuit 521*a* and/or the driver circuit 521*b*, and *q* wirings 536 which are arranged substantially parallel to each other and whose potentials are controlled by the driver circuit 511. The display region 531 includes a plurality of pixels 532 arranged in a matrix. The pixel 532 includes a pixel circuit 534 and a display element.

When every three pixels 532 function as one pixel, full-color display can be provided. The three pixels 532 each control the transmittance, reflectance, amount of emitted light, or the like of red light, green light, or blue light. The light colors controlled by the three pixels 532 are not limited to the combination of red, green, and blue, and may be yellow, cyan, and magenta.

A pixel 532 that controls white light may be added to the pixels controlling red light, green light, and blue light so that the four pixels 532 will collectively serve as one pixel. The addition of the pixel 532 controlling white light can heighten the luminance of the display region. When the number of the pixels 532 functioning as one pixel is increased to use red, green, blue, yellow, cyan, and magenta in appropriate combination, the range of color reproduction can be widened.

Using the pixels arranged in a matrix of 1920×1080, the display device 500 can display an image with "full high definition" (also referred to as "2K resolution", "2K1K", "2K", and the like). Using the pixels arranged in a matrix of 3840×2160, the display device 500 can display an image with "ultra high definition" (also referred to as "4K resolution", "4K2K", "4K", and the like). Using the pixels arranged in a matrix of 7680×4320, the display device 500 can display an image with "super high definition" (also referred to as "8K resolution", "8K4K", "8K", and the like).

Using a larger number of pixels, the display device 500 can display an image with 16K or 32K resolution.

A wiring 535_*g* on the g-th row (g is a natural number larger than or equal to 1 and smaller than or equal to p) is electrically connected to q pixels 532 on the g-th row among the plurality of pixels 532 arranged in p rows and q columns (p and q are each a natural number larger than or equal to 1) in the display region 531. A wiring 536_*h* on the h-th column (h is a natural number larger than or equal to 1 and smaller than or equal to q) is electrically connected to p pixels 532 on the h-th column among the plurality of pixels 532 arranged in p rows and q columns.

[Display Element]

The display device 500 can employ various modes and include various display elements. Examples of the display element include a display medium whose contrast, luminance, reflectance, transmittance, or the like is changed by electrical or magnetic effect, such as an electroluminescence (EL) element (e.g., an organic EL element, an inorganic EL element, or an EL element including organic and inorganic materials), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, or a display element using a carbon nanotube. Alternatively, quantum dots may be used as the display element.

Note that examples of display devices having EL elements include an EL display. Examples of display devices including electron emitters are a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. For example, the display device may be a plasma display panel (PDP). The display device may be a retina scanning type projection device.

In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

FIGS. 35B and 35C and FIGS. 36A and 36B illustrate circuit structure examples that can be used for the pixel 532.

[Example of Pixel Circuit for Light-Emitting Display Device]

Figure 35B:
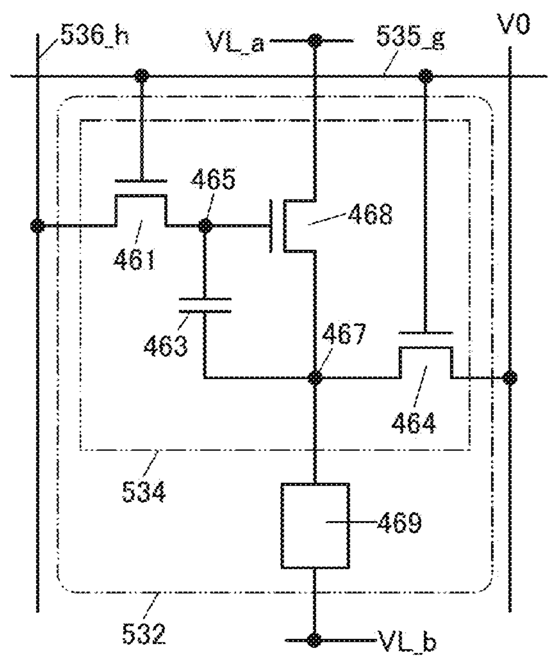

The pixel circuit 534 in FIG. 35B includes transistors 461, 468, and 464, and a capacitor 463. The pixel circuit 534 in FIG. 35B is electrically connected to a light-emitting element 469 that can function as a display element.

The transistors 461, 468, and 464 can be OS transistors. It is particularly preferable to use an OS transistor as the transistor 461.

One of a source electrode and a drain electrode of the transistor 461 is electrically connected to the wiring 536_*h*. A gate electrode of the transistor 461 is electrically connected to the wiring 535_*g*. The wiring 536_*h* supplies a video signal.

The transistor 461 has a function of controlling writing of a video signal to a node 465.

One of a pair of electrodes of the capacitor 463 is electrically connected to the node 465, and the other is electrically connected to a node 467. The other of the source electrode and the drain electrode of the transistor 461 is electrically connected to the node 465.

The capacitor 463 has a function as a storage capacitor for storing data written to the node 465.

One of a source electrode and a drain electrode of the transistor 468 is electrically connected to a potential supply line VL_a, and the other of the source electrode and the drain electrode of the transistor 468 is electrically connected to the node 467. A gate electrode of the transistor 468 is electrically connected to the node 465.

One of a source electrode and a drain electrode of the transistor 464 is electrically connected to a potential supply line V0, and the other of the source electrode and the drain electrode of the transistor 464 is electrically connected to the node 467. A gate electrode of the transistor 464 is electrically connected to the wiring 535_*g*.

One of an anode and a cathode of the light-emitting element 469 is electrically connected to a potential supply line VL_b, and the other is electrically connected to the node 467.

As the light-emitting element 469, an organic electroluminescence element (also referred to as an organic EL element) or the like can be used, for example. Note that the light-emitting element 469 is not limited thereto and may be an inorganic EL element containing an inorganic material, for example.

A high power supply potential $V_{DD}$ is supplied to one of the potential supply line VL_a and the potential supply line VL_b, and a low power supply potential $V_{SS}$ is supplied to the other, for example.

In the display device 500 including the pixel circuits 534 in FIG. 35B, the pixels 532 are sequentially selected row by row by the driver circuit 521*a* and/or the driver circuit 521*b*, so that the transistors 461 and 464 are turned on and a video signal is written to the node 465.

The pixel 532 in which the data has been written to the node 465 is brought into a holding state when the transistors 461 and 464 are turned off. The amount of current flowing between the source electrode and the drain electrode of the transistor 468 is controlled in accordance with the potential of the data written to the node 465. The light-emitting element 469 emits light with a luminance corresponding to the amount of flowing current. This operation is sequentially performed row by row; thus, an image can be displayed.

Figure 36A:
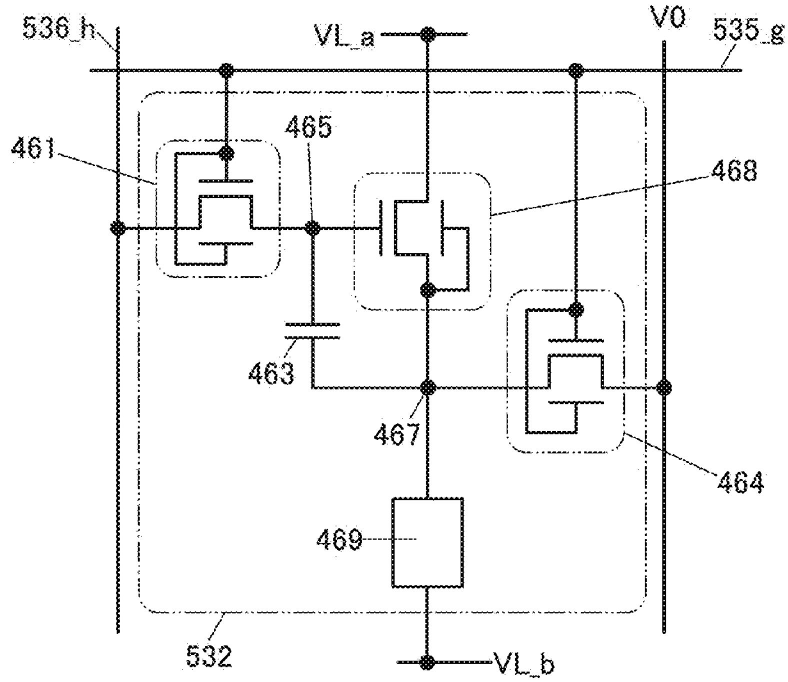
FIGS. 36A and 36B each illustrate an example of a display device.

As shown in FIG. 36A, the transistors 461, 464, and 468 may be transistors with back gates. In each of the transistors 461 and 464 in FIG. 36A, the gate is electrically connected to the back gate. Thus, the gate and the back gate always have the same potential. The back gate of the transistor 468 is electrically connected to the node 467. Therefore, the back gate always has the same potential as the node 467.

[Example of Pixel Circuit for Liquid Crystal Display Device]

Figure 35C:
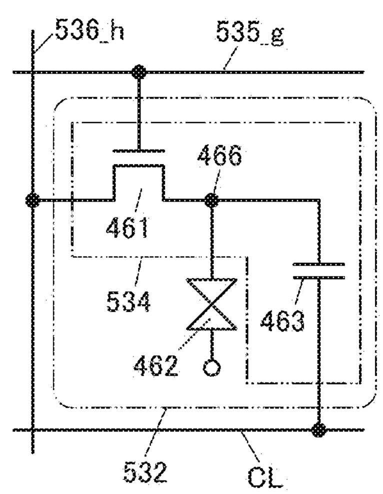

The pixel circuit 534 in FIG. 35C includes the transistor 461 and the capacitor 463. The pixel circuit 534 in FIG. 35C is electrically connected to a liquid crystal element 462 that can function as a display element. It is preferable to use an OS transistor as the transistor 461.

The potential of one of a pair of electrodes of the liquid crystal element 462 is set as appropriate according to the specifications of the pixel circuit 534. For example, one of the pair of electrodes of the liquid crystal element 462 may be supplied with a common potential, or may have the same potential as a capacitor line CL. Further, the potential applied to one of the pair of electrodes of the liquid crystal element 462 may be different among the pixels 532. The other of the pair of electrodes of the liquid crystal element 462 is electrically connected to a node 466. The alignment state of the liquid crystal element 462 depends on data written to the node 466.

As a driving method of the display device including the liquid crystal element 462, any of the following modes can be used, for example: a twisted nematic (TN) mode, a super-twisted nematic (STN) mode, a vertical alignment (VA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, a multi-domain vertical alignment (MVA) mode, a patterned vertical alignment (PVA) mode, an in-plane switching (IPS) mode, a fringe field switching (FFS) mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that one embodiment of the present invention is not limited thereto, and various liquid crystal elements and driving methods can be used.

In the case where a liquid crystal element is used as the display element, thermotropic liquid crystal, low-molecular liquid crystal, high-molecular liquid crystal, polymer-dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which 5 wt. % or more of a chiral material is mixed is used for a liquid crystal layer in order to improve the temperature range. The liquid crystal composition that includes the liquid crystal exhibiting a blue phase and a chiral material has a short response time of 1 msec or less, and has optical isotropy, which makes the alignment process unnecessary and the viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, productivity of the liquid crystal display device can be improved.

Furthermore, it is possible to use a method called domain multiplication or multi-domain design, in which a pixel is divided into some regions (subpixels) and molecules are aligned in different directions in their respective regions.

The specific resistivity of the liquid crystal material is greater than or equal to $1\times10^9$ Ω·cm, preferably greater than or equal to $1\times10^{11}$ Ω·cm, still preferably greater than or equal to $1\times10^{12}$ Ω·cm. Note that the specific resistance in this specification is measured at 20° C.

In the pixel circuit 534 on the g-th row and the h-th column, one of the source electrode and the drain electrode of the transistor 461 is electrically connected to the wiring 536_*h*, and the other of the source electrode and the drain electrode of the transistor 461 is electrically connected to the node 466. The gate electrode of the transistor 461 is electrically connected to the wiring 535_*g*. The wiring 536_*h* supplies a video signal. The transistor 461 has a function of controlling writing of a video signal to the node 466.

One of a pair of electrodes of the capacitor 463 is electrically connected to a wiring to which a particular potential is supplied (hereinafter referred to as a capacitor line CL), and the other is electrically connected to the node 466. The potential of the capacitor line CL is set in accordance with the specifications of the pixel circuit 534 as appropriate. The capacitor 463 has a function as a storage capacitor for storing data written to the node 466.

For example, in the display device 500 including the pixel circuit 534 in FIG. 35C, the pixel circuits 534 are sequentially selected row by row by the driver circuit 521*a* and/or the driver circuit 521*b*, so that the transistors 461 are turned on and a video signal is written to the node 466.

The pixel circuit 534 in which the video signal has been written to the node 466 is brought into a holding state when the transistor 461 is turned off. This operation is sequentially performed row by row; thus, an image can be displayed on the display region 531.

Figure 36B:
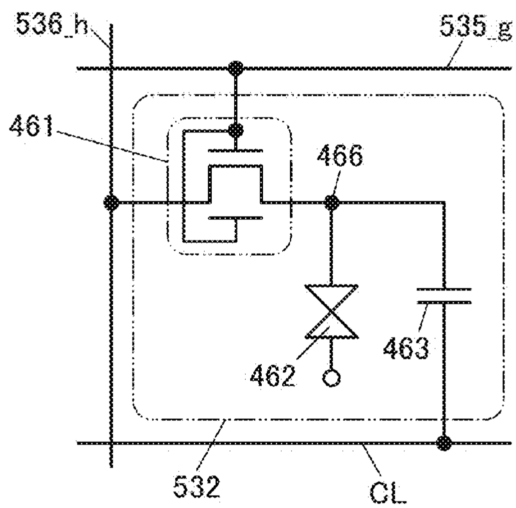

As shown in FIG. 36B, the transistor 461 may be a transistor with a back gate. In the transistor 461 in FIG. 36B, the gate is electrically connected to the back gate. Thus, the gate and the back gate always have the same potential.

[Structure Example of Peripheral Circuit]

Figure 37A:
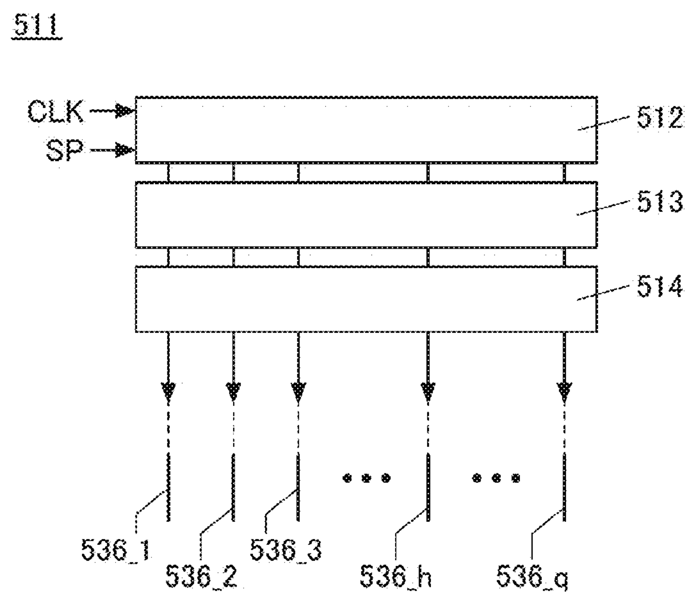
FIGS. 37A and 37B each illustrate a configuration example of a driver circuit.
Figure 37B:
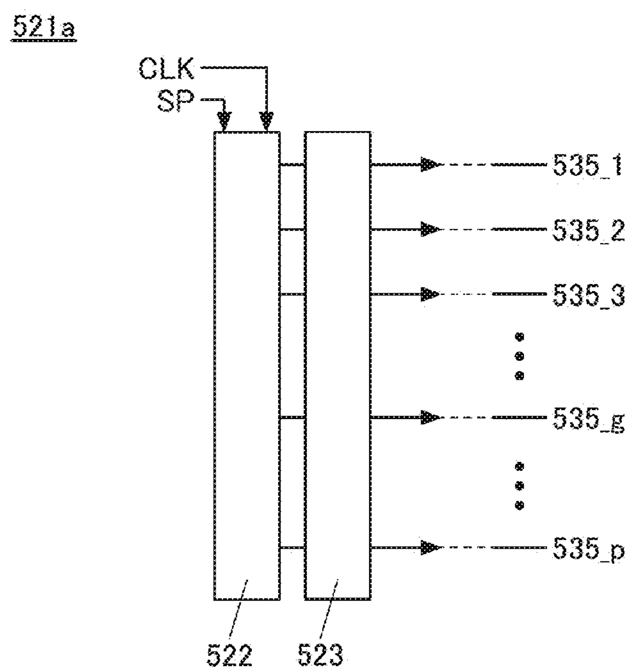

FIG. 37A shows a structure example of the driver circuit 511. The driver circuit 511 includes a shift register 512, a latch circuit 513, and a buffer 514. FIG. 37B shows a structure example of the driver circuit 521*a*. The driver circuit 521*a* includes a shift register 522 and a buffer 523. The structure of the driver circuit 521*b* can be similar to that of the driver circuit 521*a*.

A start pulse SP, a clock signal CLK, and the like are input to the shift register 512 and the shift register 522.

[Structure Example of Display Device]

With use of any of the transistors described in the above embodiments, some or all of driver circuits which include shift registers can be formed over a substrate where a pixel portion is formed, whereby a system-on-panel can be obtained.

Figure 38A:
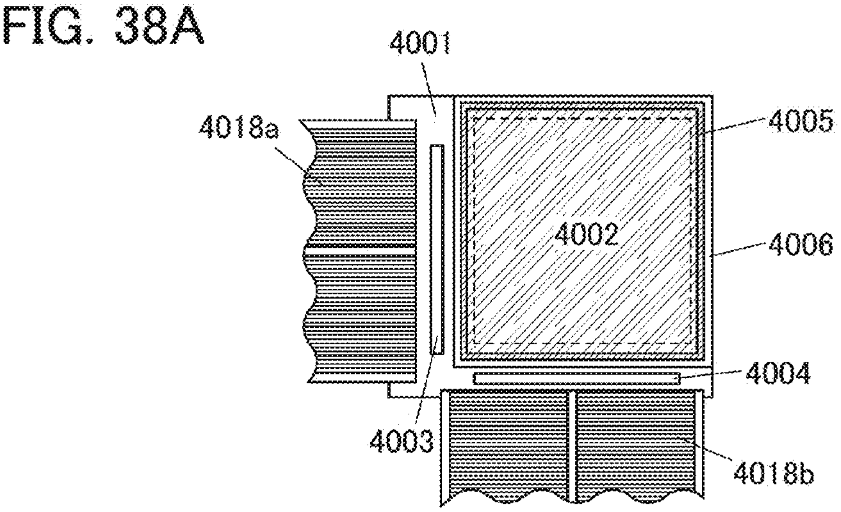
FIGS. 38A to 38C illustrate examples of a display device.

In this embodiment, a structure example of a display device including a liquid crystal element and a structure example of a display device including an EL element are described. In FIG. 38A, a sealant 4005 is provided so as to surround a pixel portion 4002 provided over a first substrate 4001, and the pixel portion 4002 is sealed with a second substrate 4006. In FIG. 38A, a signal line driver circuit 4003 and a scan line driver circuit 4004 each are formed using a single crystal semiconductor or a polycrystalline semiconductor over another substrate, and mounted in a region different from the region surrounded by the sealant 4005 over the first substrate 4001. Various signals and potentials are supplied to the signal line driver circuit 4003, the scan line driver circuit 4004, and the pixel portion 4002 from flexible printed circuits (FPCs) 4018*a* and 4018*b*.

Figure 38B:
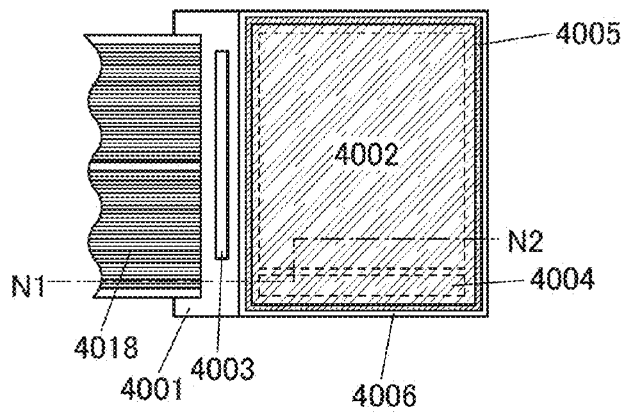
Figure 38C:
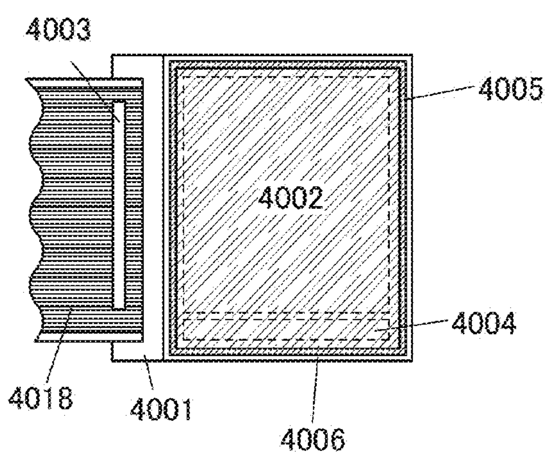

In FIGS. 38B and 38C, the sealant 4005 is provided so as to surround the pixel portion 4002 and the scan line driver circuit 4004 that are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. Furthermore, in FIGS. 38B and 38C, the signal line driver circuit 4003 that is formed using a single crystal semiconductor or a polycrystalline semiconductor over another substrate is mounted in a region that is different from the region surrounded by the sealant 4005 over the first substrate 4001. In FIGS. 38B and 38C, various signals and potentials are supplied to the signal line driver circuit 4003, the scan line driver circuit 4004, and the pixel portion 4002 through an FPC 4018.

Although FIGS. 38B and 38C each illustrate an example in which the signal line driver circuit 4003 is formed separately and mounted on the first substrate 4001, one embodiment of the present invention is not limited to this structure. The scan line driver circuit may be separately formed and then mounted, or only part of the signal line driver circuit or part of the scan line driver circuit may be separately formed and then mounted.

The connection method of a separately formed driver circuit is not particularly limited; wire bonding, a chip on glass (COG), a tape carrier package (TCP), a chip on film (COF), or the like can be used. FIG. 38A illustrates an example in which the signal line driver circuit 4003 and the scan line driver circuit 4004 are mounted by a COG. FIG. 38B illustrates an example in which the signal line driver circuit 4003 is mounted by a COG. FIG. 38C illustrates an example in which the signal line driver circuit 4003 is mounted by a TCP.

In some cases, the display device encompasses a panel in which a display element is sealed, and a module in which an IC or the like including a controller is mounted on the panel.

The pixel portion and the scan line driver circuit provided over the first substrate include a plurality of transistors and any of the transistors which are described in the above embodiments can be applied thereto.

Figure 39A:
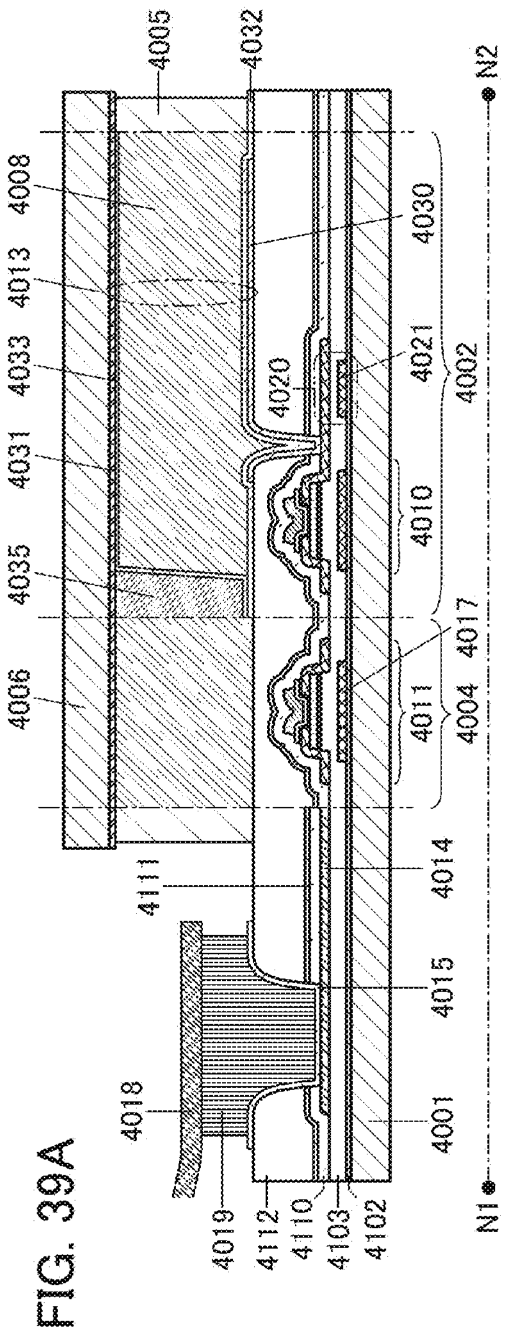
FIGS. 39A and 39B each illustrate an example of a display device.
Figure 39B:
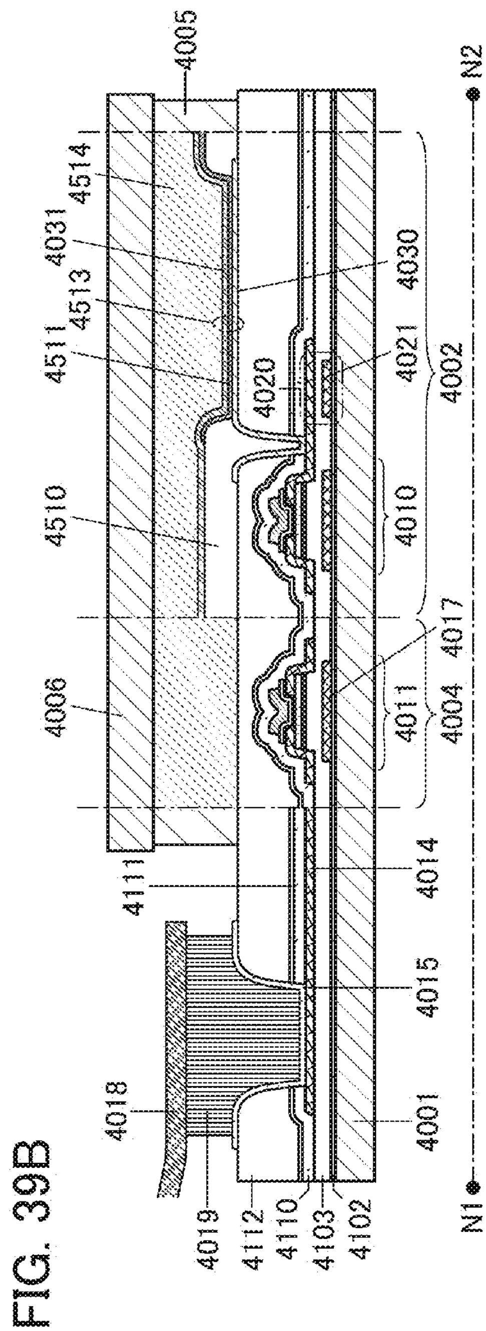

FIGS. 39A and 39B correspond to cross-sectional views taken along chain line N1-N2 in FIG. 38B. As shown in FIGS. 39A and 39B, the display device has an electrode 4015, and the electrode 4015 is electrically connected to a terminal included in the FPC 4018 through an anisotropic conductive layer 4019. The electrode 4015 is electrically connected to a wiring 4014 in an opening formed in insulating layers 4112, 4111, and 4110.

The electrode 4015 is formed of the same conductive layer as a first electrode layer 4030, and the wiring 4014 is formed of the same conductive layer as a source and drain electrodes of transistors 4010 and 4011.

The pixel portion 4002 and the scan line driver circuit 4004 provided over the first substrate 4001 include a plurality of transistors. In FIGS. 39A and 39B, the transistor 4010 included in the pixel portion 4002 and the transistor 4011 included in the scan line driver circuit 4004 are shown as an example. The insulating layers 4112, 4111, and 4110 are provided over the transistors 4010 and 4011 in FIG. 39A, and a bank 4510 is further provided over the insulating layer 4112 in FIG. 39B.

The transistors 4010 and 4011 are provided over an insulating layer 4102. The transistors 4010 and 4011 each include an electrode 4017 over the insulating layer 4102. An insulating layer 4103 is formed over the electrode 4017. The electrode 4017 can serve as a back gate electrode.

The transistor described in the above embodiment can be applied to the transistors 4010 and 4011. A change in the electric characteristics of the transistor described in the above embodiment is suppressed, and thus the transistor is electrically stable. Accordingly, the display devices of this embodiment illustrated in FIGS. 39A and 39B can be highly reliable display devices.

FIGS. 39A and 39B illustrate the case where a transistor having a structure similar to that of the transistor 452 described in the above embodiment is used as each of the transistors 4010 and 4011.

The display devices illustrated in FIGS. 39A and 39B each include a capacitor 4020. The capacitor 4020 includes a region where part of a source electrode or part of a drain electrode of the transistor 4010 overlaps with an electrode 4021 with the insulating layer 4103 interposed therebetween. The electrode 4021 is formed using the same conductive layer as the electrode 4017.

In general, the capacitance of a capacitor provided in a display device is set in consideration of leakage current or the like of transistors provided in a pixel portion so that charges can be held for a predetermined period. The capacitance of the capacitor may be set considering off-state current of the transistor or the like.

For example, when an OS transistor is used in a pixel portion of a liquid crystal display device, the capacitance of the capacitor can be one-third or less, or one-fifth or less, of the capacitance of a liquid crystal. Using an OS transistor can omit the formation of a capacitor.

The transistor 4010 included in the pixel portion 4002 is electrically connected to the display element. An example of a liquid crystal display device using a liquid crystal element as a display element is illustrated in FIG. 39A. In FIG. 39A, a liquid crystal element 4013 that is the display element includes the first electrode layer 4030, a second electrode layer 4031, and a liquid crystal layer 4008. Note that an insulating layer 4032 and an insulating layer 4033 functioning as alignment films are provided so that the liquid crystal layer 4008 is provided therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control the distance between the first electrode layer 4030 and the second electrode layer 4031 (a cell gap). Alternatively, a spherical spacer may be used.

OS transistors are preferably used as the transistors 4010 and 4011. In the OS transistor used, the current in an off state (the off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In the OS transistor, relatively high field-effect mobility can be obtained, whereby high-speed operation is possible. Consequently, when the above transistor is used in a driver circuit portion or a pixel portion of a display device, high-quality images can be obtained. Since the driver circuit portion and the pixel portion can be formed over one substrate with use of the above transistor, the number of components of the display device can be reduced.

In the display device, a black matrix (a light-blocking layer), an optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a sidelight, or the like may be used as a light source.

As the display element included in the display device, a light-emitting element utilizing electroluminescence (also referred to as an "EL element") can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer, so that a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The electrons and holes (i.e., carriers) are recombined; thus, the light-emitting organic compound becomes in an excited state. The light-emitting organic compound returns to a ground state from the excited state, thereby emitting light. Based on such a mechanism, such a light-emitting element is referred to as a current-excitation type light-emitting element.

In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron-transport property and a hole-transport property), and the like.

The EL layer can be formed by an evaporation method (including a vacuum evaporation method), a transfer method, a printing method, an inkjet method, a coating method, or the like.

Inorganic EL elements are classified as a dispersed inorganic EL element and a thin-film inorganic EL element depending on their element structures. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is given here using an organic EL element as a light-emitting element.

In order to extract light emitted from the light-emitting element, it is acceptable as long as at least one of a pair of electrodes is transparent. The light-emitting element can have a top emission structure in which light emission is extracted from the side opposite to the substrate; a bottom emission structure in which light emission is extracted from the substrate side; or a dual emission structure in which light emission is extracted from both the side opposite to the substrate and the substrate side.

FIG. 39B illustrates an example of a light-emitting display device (also referred to as an "EL display device") using a light-emitting element as a display element. A light-emitting element 4513 which is the display element is electrically connected to the transistor 4010 provided in the pixel portion 4002. The structure of the light-emitting element 4513 is the stacked-layer structure including the first electrode layer 4030, a light-emitting layer 4511, and the second electrode layer 4031; however, this embodiment is not limited to this structure. The structure of the light-emitting element 4513 can be changed as appropriate depending on a direction in which light is extracted from the light-emitting element 4513, or the like.

The bank 4510 is formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space which is enclosed by the first substrate 4001, the second substrate 4006, and the sealant 4005, a filler 4514 is provided for sealing. It is preferable that, in this manner, the display device be packaged (sealed) with a protective film (such as a laminate film or an ultraviolet curable resin film) or a cover member with high air-tightness and little degasification so that the display device is not exposed to the outside air.

As the filler 4514, an ultraviolet curable resin or a thermosetting resin can be used as well as an inert gas such as nitrogen or argon; for example, polyvinyl chloride (PVC), an acrylic resin, polyimide, an epoxy resin, a silicone resin, polyvinyl butyral (PVB), ethylene vinyl acetate (EVA), or the like can be used. A drying agent may be contained in the filler 4514.

A glass material such as a glass frit, or a resin that is curable at room temperature such as a two-component-mixture-type resin, a light curable resin, a thermosetting resin, and the like can be used for the sealant 4005. A drying agent may be contained in the sealant 4005.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (also called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 each can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also called conductive polymer) can be used for the first electrode layer 4030 and the second electrode layer 4031. As the conductive high molecule, a so-called π-electron conjugated conductive high molecule can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken due to static electricity or the like, a protection circuit for protecting the driver circuit is preferably provided. The protection circuit is preferably formed using a nonlinear element.

With use of the shift registers described in the above embodiment, a highly reliable display device can be provided. With use of any of the transistors described in the above embodiments, a highly reliable display device can be provided. With use of any of the transistors described in the above embodiments, a display device that has a high resolution, a large size, and high display quality can be provided. Furthermore, a display device with low power consumption can be provided.

[Display Module]

Figure 40:
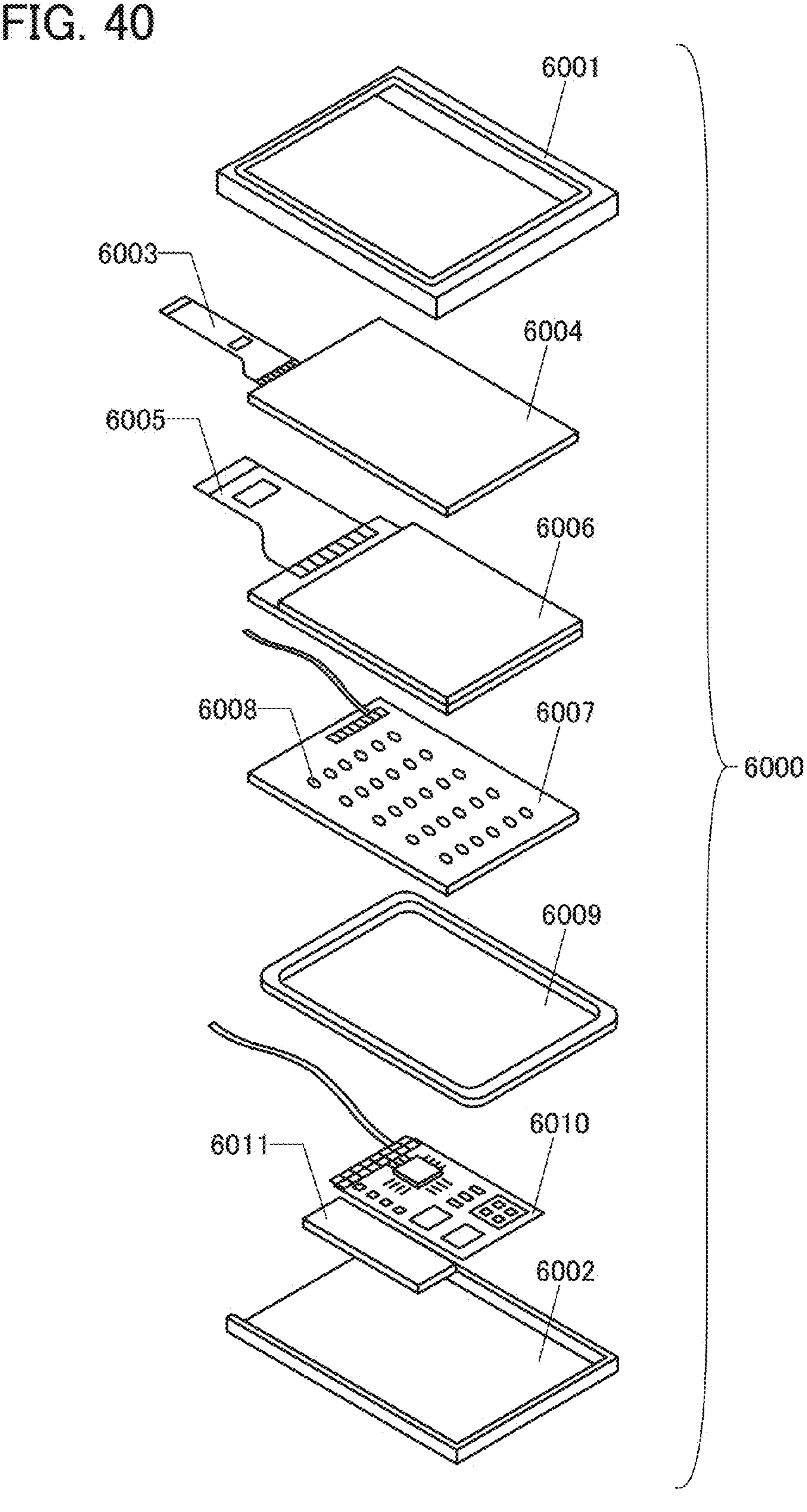
FIG. 40 illustrates an example of a display module.

A display module is described as an example of a semiconductor device using the above-described transistor. In a display module 6000 in FIG. 40, a touch sensor 6004 connected to an FPC 6003, a display panel 6006 connected to an FPC 6005, a backlight unit 6007, a frame 6009, a printed circuit board 6010, and a battery 6011 are provided between an upper cover 6001 and a lower cover 6002. Note that the backlight unit 6007, the battery 6011, the touch sensor 6004, and the like are not provided in some cases.

The semiconductor device of one embodiment of the present invention can be used for, for example, the touch sensor 6004, the display panel 6006, an integrated circuit mounted on a printed circuit board 6010, and the like. For example, the above-described display device can be used in the display panel 6006.

The shapes and sizes of the upper cover 6001 and the lower cover 6002 can be changed as appropriate in accordance with the sizes of the touch sensor 6004, the display panel 6006, and the like.

The touch sensor 6004 can be a resistive touch sensor or a capacitive touch sensor and may be formed to overlap with the display panel 6006. The display panel 6006 can have a touch sensor function. For example, an electrode for a touch sensor may be provided in each pixel of the display panel 6006 so that a capacitive touch panel function is added. Alternatively, a photosensor may be provided in each pixel of the display panel 6006 so that an optical touch sensor function is added. In the case where the touch sensor 6004 is not necessarily provided, the touch sensor 6004 can be omitted.

The backlight unit 6007 includes a light source 6008. The light source 6008 may be provided at an end portion of the backlight unit 6007 and a light diffusing plate may be used. When a light-emitting display device or the like is used for the display panel 6006, the backlight unit 6007 can be omitted.

The frame 6009 protects the display panel 6006 and also functions as an electromagnetic shield for blocking electromagnetic waves generated from the printed circuit board 6010 side. The frame 6009 may function as a radiator plate.

The printed circuit board 6010 has a power supply circuit, a signal processing circuit for outputting a video signal and a clock signal, and the like. As a power source for supplying power to the power supply circuit, the battery 6011 or a commercial power source may be used. Note that the battery 6011 can be omitted in the case where a commercial power source is used as the power source.

The display module 6000 can be additionally provided with a member such as a polarizing plate, a retardation plate, or a prism sheet.

This embodiment can be implemented in appropriate combination with any of the structures described in the other embodiments and the like.

Embodiment 4

Figure 41:
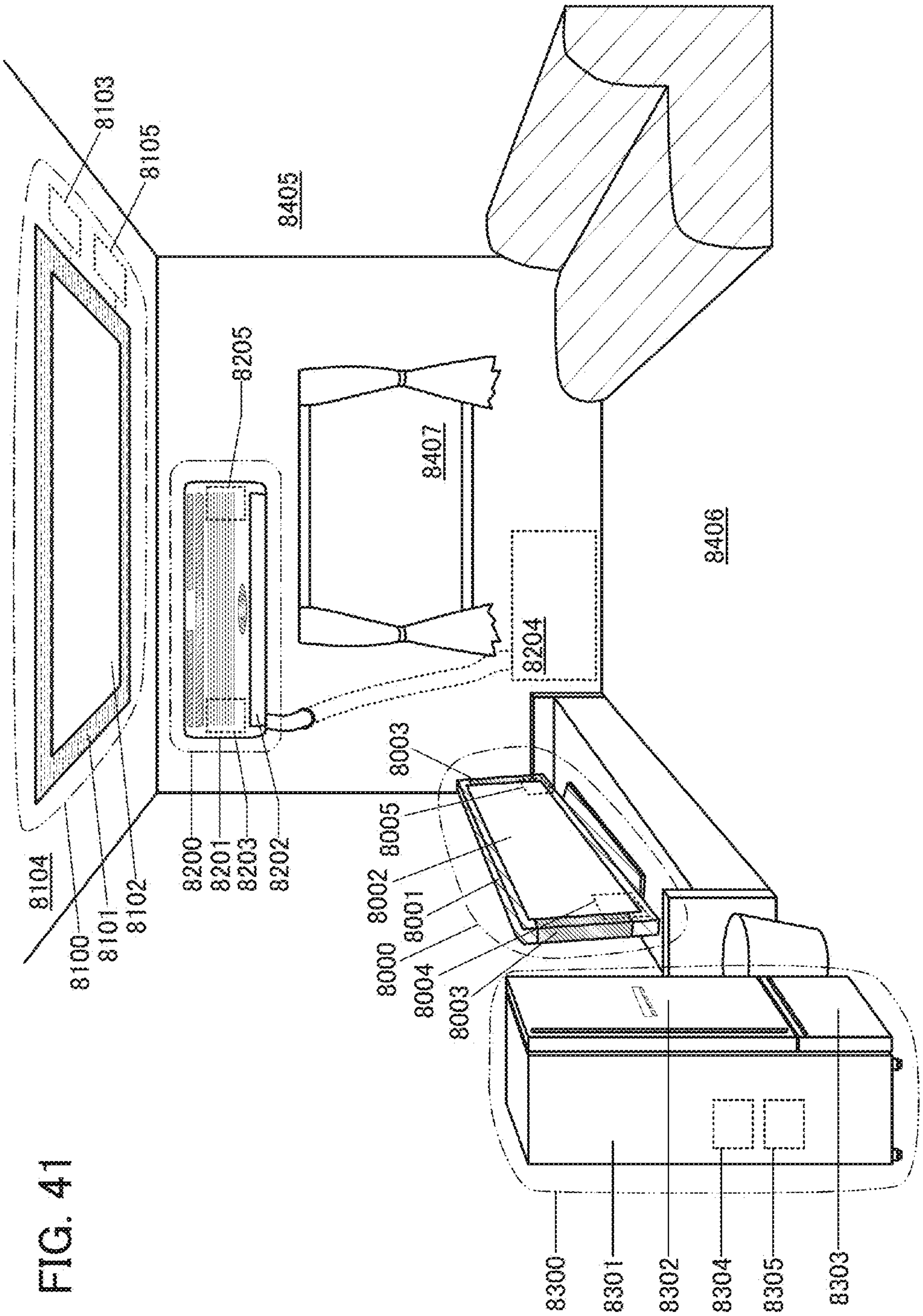
FIG. 41 illustrates electronic devices of one embodiment of the present invention.

A semiconductor device of one embodiment of the present invention can be used in a variety of electronic devices. FIG. 41 illustrates specific examples of the electronic devices using a semiconductor device of one embodiment of the present invention.

Examples of the electronic device including the semiconductor device in one embodiment of the present invention are as follows: display devices of televisions, monitors, and the like; lighting devices; desktop personal computers and laptop personal computers; word processors; image reproduction devices which reproduce still images and moving images stored in recording media such as digital versatile discs (DVD); portable CD players; portable radios; tape recorders; headphone stereos; stereos; table clocks; wall clocks; cordless phone handsets; transceivers; mobile phones; car phones; portable game machines; tablet terminals; large-sized game machines such as pachinko machines; calculators; portable information terminals; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as a chain saw; smoke detectors; and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid.

In addition, moving objects driven by electric motors using power from a power storage device are also included in the category of electronic devices. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

FIG. 41 illustrates examples of electronic devices. In FIG. 41, a display device 8000 is an example of an electronic device including a semiconductor device 8004 in one embodiment of the present invention. Specifically, the display device 8000 corresponds to a display device for TV broadcast reception and includes a housing 8001, a display portion 8002, speaker portions 8003, the semiconductor device 8004, a power storage device 8005, and the like. The semiconductor device 8004 in one embodiment of the present invention is provided in the housing 8001. The semiconductor device 8004 can hold control data, a control program, or the like. The display device 8000 can receive power from a commercial power source. Alternatively, the display device 8000 can use power stored in the power storage device 8005.

A display device such as a liquid crystal display device, a light-emitting display device in which a light-emitting element such as an organic EL element is provided in each pixel, an electrophoretic display device, a digital micromirror device (DMD), a plasma display panel (PDP), or a field emission display (FED) can be used for the display portion 8002.

Note that the display device includes, in its category, all of information display devices for personal computers, advertisement displays, and the like, in addition to TV broadcast reception.

In FIG. 41, an installation lighting device 8100 is an example of an electronic device including a semiconductor device 8103 in one embodiment of the present invention. Specifically, the lighting device 8100 includes a housing 8101, a light source 8102, the semiconductor device 8103, a power storage device 8105, and the like. Although FIG. 41 illustrates the case where the semiconductor device 8103 is provided in a ceiling 8104 on which the housing 8101 and the light source 8102 are installed, the semiconductor device 8103 may be provided in the housing 8101. The semiconductor device 8103 can store data such as emission luminance of the light source 8102, a control program, or the like. The lighting device 8100 can also receive power from a commercial power source. Alternatively, the lighting device 8100 can use power stored in the power storage device.

Although FIG. 41 illustrates the installation lighting device 8100 provided in the ceiling 8104, the semiconductor device in one embodiment of the present invention can be used in an installation lighting device provided in, for example, a wall 8405, a floor 8406, or a window 8407 other than the ceiling 8104. Alternatively, the semiconductor device in one embodiment of the present invention can be used in a tabletop lighting device or the like.

As the light source 8102, an artificial light source which emits light artificially by using power can be used. Specifically, an incandescent lamp, a discharge lamp such as a fluorescent lamp, and light-emitting elements such as an LED and an organic EL element are given as examples of the artificial light source.

In FIG. 41, an air conditioner including an indoor unit 8200 and an outdoor unit 8204 is an example of an electronic device including a semiconductor device 8203 in one embodiment of the present invention. Specifically, the indoor unit 8200 includes a housing 8201, an air outlet 8202, the semiconductor device 8203, a power storage device 8205, and the like. Although FIG. 41 illustrates the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can hold control operation of the air conditioner and a control program. The air conditioner can receive power from a commercial power source. Alternatively, the air conditioner can use power stored in the power storage device 8205.

Note that although the split-type air conditioner including the indoor unit and the outdoor unit is illustrated in FIG. 41, the semiconductor device in one embodiment of the present invention can be used in an air conditioner in which the functions of an indoor unit and an outdoor unit are integrated in one housing.

In FIG. 41, an electric refrigerator-freezer 8300 is an example of an electronic device including a semiconductor device 8304 in one embodiment of the present invention. Specifically, the electric refrigerator-freezer 8300 includes a housing 8301, a refrigerator door 8302, a freezer door 8303, the semiconductor device 8304, a power storage device 8305, and the like. In FIG. 41, the power storage device 8305 is provided in the housing 8301. The semiconductor device 8304 can hold control data, a control program, or the like of the electric refrigerator-freezer 8300. The electric refrigerator-freezer 8300 can receive power from a commercial power source. Alternatively, the electric refrigerator-freezer 8300 can use power stored in the power storage device 8305.

Figure 42A:
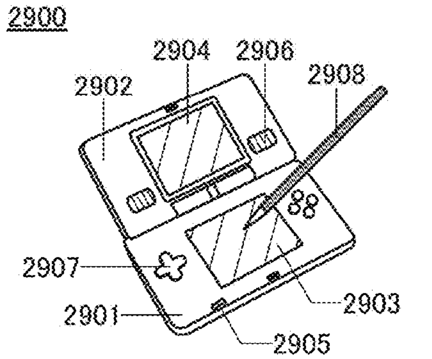
FIGS. 42A to 42G illustrate electronic devices of one embodiment of the present invention.

A portable game machine 2900 illustrated in FIG. 42A includes a housing 2901, a housing 2902, a display portion 2903, a display portion 2904, a microphone 2905, a speaker 2906, an operation switch 2907, and the like. In addition, the portable game machine 2900 includes an antenna, a battery, and the like inside the housing 2901. Although the portable game machine in FIG. 42A has the two display portions 2903 and 2904, the number of display portions included in a portable game machine is not limited to this. The display portion 2903 is provided with a touch screen as an input device, which can be handled with a stylus 2908 or the like.

Figure 42B:
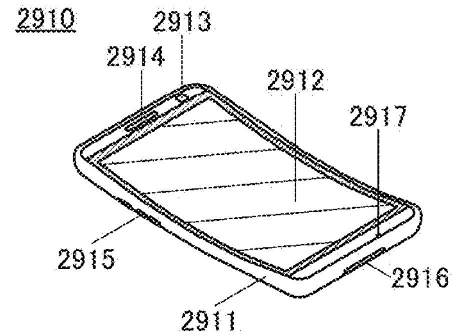

An information terminal 2910 illustrated in FIG. 42B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. In addition, the information terminal 2910 includes an antenna, a battery, and the like inside the housing 2911. The information terminal 2910 can be used as, for example, a smartphone, a mobile phone, a tablet information terminal, a tablet personal computer, or an e-book reader.

Figure 42C:
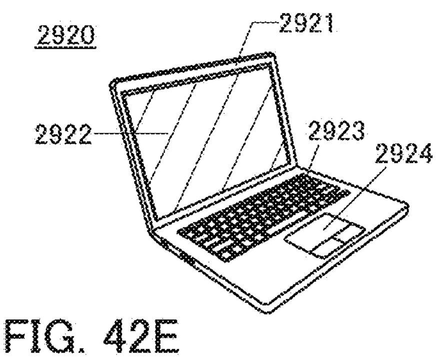

A notebook personal computer 2920 illustrated in FIG. 42C includes a housing 2921, a display portion 2922, a keyboard 2923, a pointing device 2924, and the like. In addition, the notebook personal computer 2920 includes an antenna, a battery, and the like inside the housing 2921.

Figure 42D:
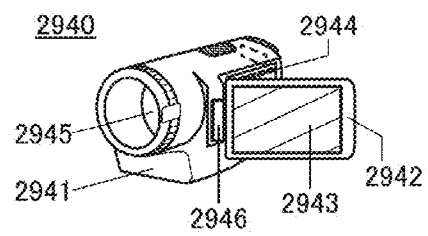

A video camera 2940 in FIG. 42D includes a housing 2941, a housing 2942, a display portion 2943, operation switches 2944, a lens 2945, a joint 2946, and the like. The operation switches 2944 and the lens 2945 are provided in the housing 2941, and the display portion 2943 is provided in the housing 2942. In addition, the video camera 2940 includes an antenna, a battery, and the like inside the housing 2941. The housings 2941 and 2942 are connected to each other with the joint 2946, and the angle between the housings 2941 and 2942 can be changed with the joint 2946. The direction of an image on the display portion 2943 may be changed and display and non-display of an image may be switched depending on the angle between the housings 2941 and 2942.

Figure 42E:
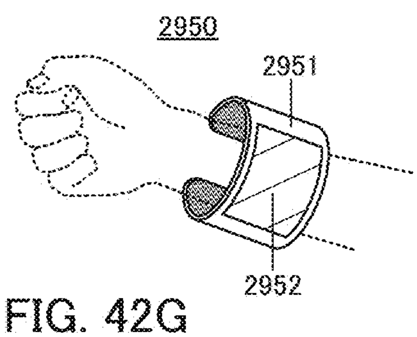

FIG. 42E illustrates an example of a bangle-type information terminal. An information terminal 2950 includes a housing 2951, a display portion 2952, and the like. In addition, the information terminal 2950 includes an antenna, a battery, and the like inside the housing 2951. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 42F:
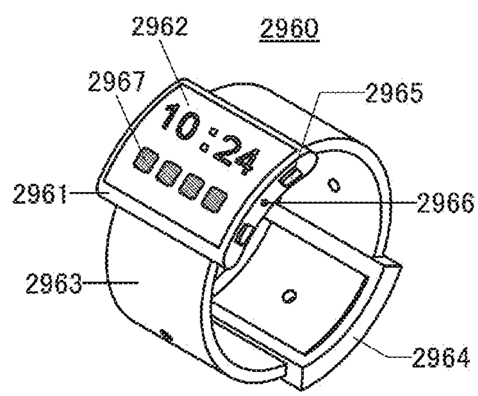

FIG. 42F illustrates an example of a watch-type information terminal. An information terminal 2960 includes a housing 2961, a display portion 2962, a band 2963, a buckle 2964, an operation switch 2965, an input/output terminal 2966, and the like. In addition, the information terminal 2960 includes an antenna, a battery, and the like inside the housing 2961. The information terminal 2960 is capable of executing a variety of applications such as mobile phone calls, e-mailing, viewing and editing texts, music reproduction, Internet communication, and computer games.

The display surface of the display portion 2962 is bent, and images can be displayed on the bent display surface. Further, the display portion 2962 includes a touch sensor, and operation can be performed by touching the screen with a finger, a stylus, or the like. For example, by touching an icon 2967 displayed on the display portion 2962, an application can be started. With the operation switch 2965, a variety of functions such as time setting, ON/OFF of the power, ON/OFF of wireless communication, setting and cancellation of a silent mode, and setting and cancellation of a power saving mode can be performed. For example, the functions of the operation switch 2965 can be set by setting the operating system incorporated in the information terminal 2960.

The information terminal 2960 can employ near field communication that is a communication method based on an existing communication standard. In that case, for example, mutual communication between the portable information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is possible. Note that the charging operation may be performed by wireless power feeding without using the input/output terminal 2966.

Figure 42G:
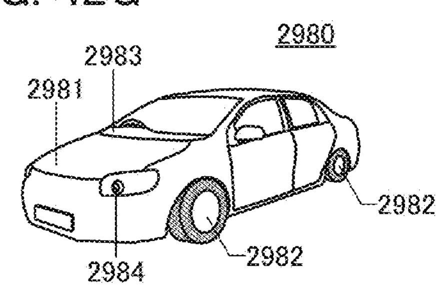

FIG. 42G is an external view illustrating a structure example of a motor vehicle. A motor vehicle 2980 includes a car body 2981, wheels 2982, a dashboard 2983, lights 2984, and the like. The motor vehicle 2980 includes an antenna, a battery, and the like.

The semiconductor device of one embodiment of the present invention can hold control data, a control program, or the like of the above electronic device. With the use of the semiconductor device of one embodiment of the present invention, a highly reliable electronic device can be provided.

This embodiment can be implemented in an appropriate combination with any of the structures described in the other embodiments, examples, or the like.

Embodiment 5

In this embodiment, the structure of an oxide semiconductor will be described.

Oxide semiconductors are classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, oxide semiconductors are classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is an oxide semiconductor having a plurality of c-axis aligned crystal parts (also referred to as pellets).

Figure 45A:
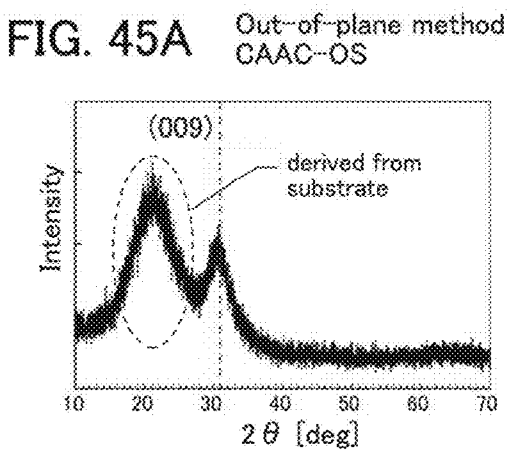
FIGS. 45A to 45E show structural analysis of a CAAC-OS and a single crystal oxide semiconductor by XRD and selected-area electron diffraction patterns of a CAAC-OS.

Analysis of a CAAC-OS by X-ray diffraction (XRD) will be described. For example, when the structure of a CAAC-OS including an $InGaZnO_4$ crystal that is classified as the space group R-3m is analyzed by an out-of-plane method, a peak appears at a diffraction angle (2θ) of around 31° as shown in FIG. 45A. This peak is derived from the (009) plane of the $InGaZnO_4$ crystal, which indicates that crystals in the CAAC-OS have c-axis alignment, and that the c-axes are aligned in the direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°.

The peak at a 2θ of around 36° is derived from a crystal structure that is classified into the space group Fd-3m; thus, this peak is preferably not exhibited in a CAAC-OS.

Figure 45B:
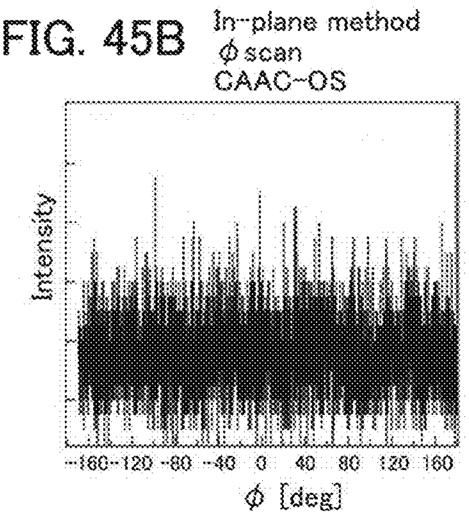
Figure 45C:
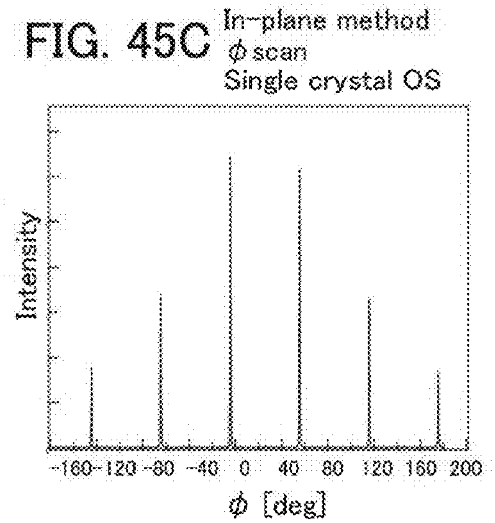

On the other hand, in structural analysis of the CAAC-OS by an in-plane method in which an X-ray is incident on the CAAC-OS in the direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), a peak is not clearly observed as shown in FIG. 45B. In contrast, in the case where single crystal $InGaZnO_4$ is subjected to φ scan with 2θ fixed at around 56°, six peaks which are derived from crystal planes equivalent to the (110) plane are observed as shown in FIG. 45C. Accordingly, the structural analysis using XRD shows that the directions of a-axes and b-axes are irregularly oriented in the CAAC-OS.

Figure 45D:
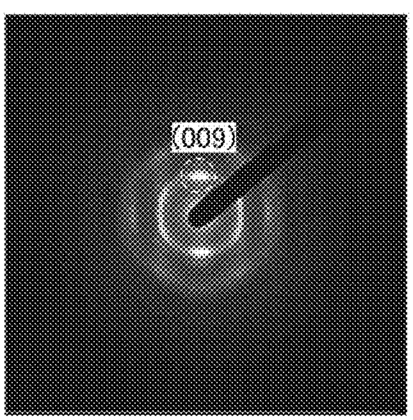
Figure 45E:
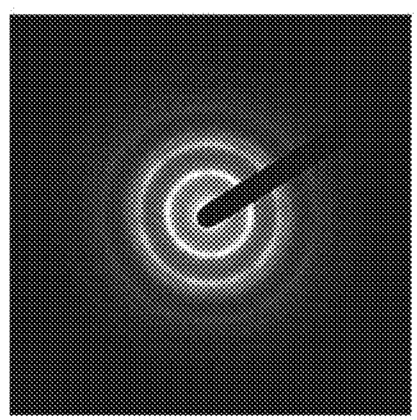

Next, a CAAC-OS analyzed by electron diffraction will be described. For example, when an electron beam with a probe diameter of 300 nm is incident on a CAAC-OS including an $InGaZnO_4$ crystal in the direction parallel to the formation surface of the CAAC-OS, such a diffraction pattern (also referred to as a selected-area transmission electron diffraction pattern) as is shown in FIG. 45D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 45E shows a diffraction pattern obtained in such a manner that an electron beam with a probe diameter of 300 nm is incident on the same sample in the direction perpendicular to the sample surface. As shown in FIG. 45E, a ring-like diffraction pattern is observed. Thus, the electron diffraction using an electron beam with a probe diameter of 300 nm also indicates that the a-axes and b-axes of the pellets included in the CAAC-OS do not have regular alignment. The first ring in FIG. 45E is considered to be derived from the (010) plane, the (100) plane, and the like of the $InGaZnO_4$ crystal. The second ring in FIG. 45E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 46A:
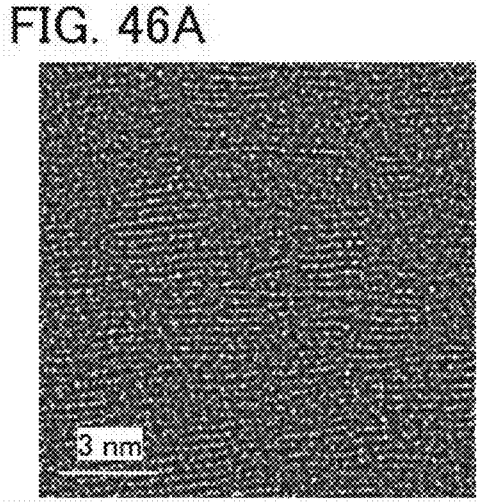
FIGS. 46A to 46E show a cross-sectional TEM image and plan-view TEM images of a CAAC-OS and images obtained through analysis thereof.

FIG. 46A shows a high-resolution TEM image of a cross section of the CAAC-OS observed from the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 46A shows pellets in which metal atoms are arranged in a layered manner. FIG. 46A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 46B:
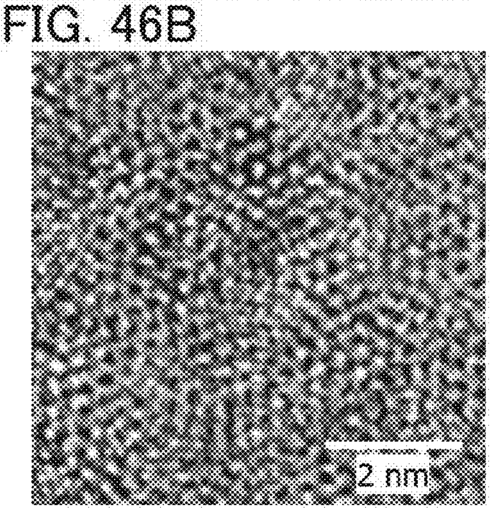
Figure 46C:
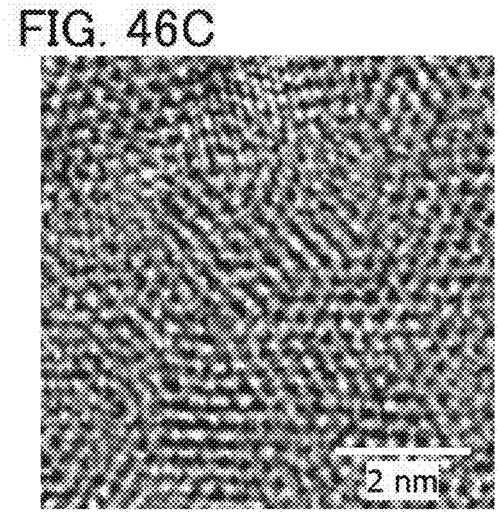
Figure 46D:
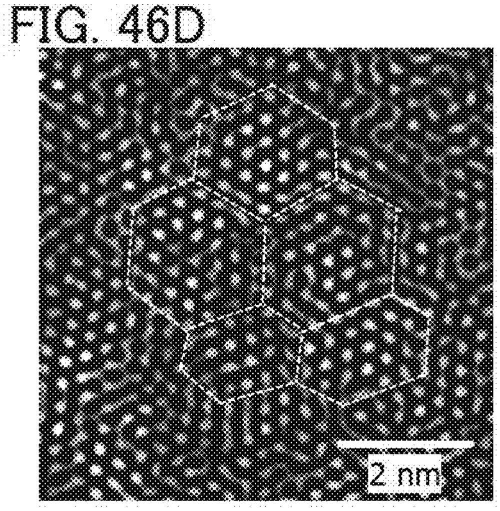
Figure 46E:
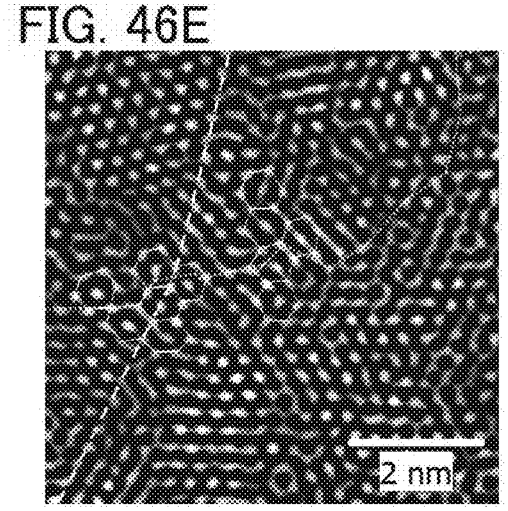

FIGS. 46B and 46C show Cs-corrected high-resolution TEM images of a plane of the CAAC-OS observed from the direction substantially perpendicular to the sample surface. FIGS. 46D and 46E are images obtained through image processing of FIGS. 46B and 46C. The method of image processing is as follows. The image in FIG. 46B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 46D, a portion where a lattice arrangement is broken is shown by dashed lines. A region surrounded by dashed lines is one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 46E, a dotted line denotes a portion where the direction of a lattice arrangement changes between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of arrangement of oxygen atoms in the a-b plane direction, an interatomic bond distance changed by substitution of a metal element, and the like.

As described above, the CAAC-OS has c-axis alignment, its pellets (nanocrystals) are connected in the a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS will be described.

Analysis of an nc-OS by XRD will be described. When the structure of an nc-OS is analyzed by an out-of-plane method, a peak indicating orientation does not appear. That is, a crystal of an nc-OS does not have orientation.

Figure 47A:
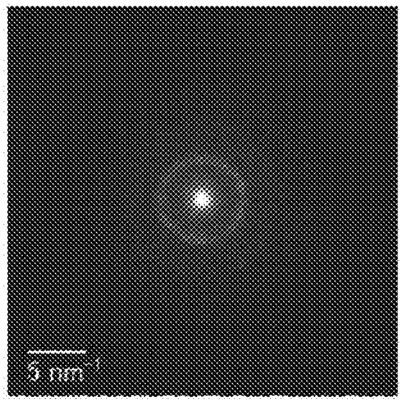
FIGS. 47A to 47D show electron diffraction patterns and a cross-sectional TEM image of an nc-OS.
Figure 47B:
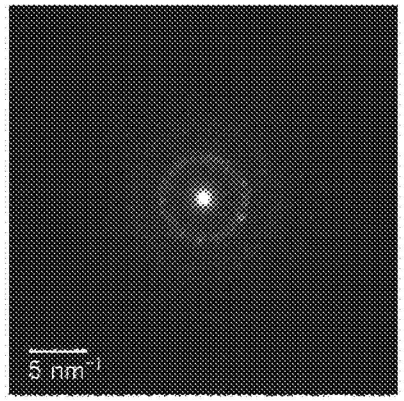

For example, when an electron beam with a probe diameter of 50 nm is incident on a 34-nm-thick region of thinned nc-OS including an $InGaZnO_4$ crystal in the direction parallel to the formation surface, a ring-shaped diffraction pattern (a nanobeam electron diffraction pattern) shown in FIG. 47A is observed. FIG. 47B shows a diffraction pattern obtained when an electron beam with a probe diameter of 1 nm is incident on the same sample. As shown in FIG. 47B, a plurality of spots are observed in a ring-like region. In other words, ordering in an nc-OS is not observed with an electron beam with a probe diameter of 50 nm but is observed with an electron beam with a probe diameter of 1 nm.

Figure 47C:
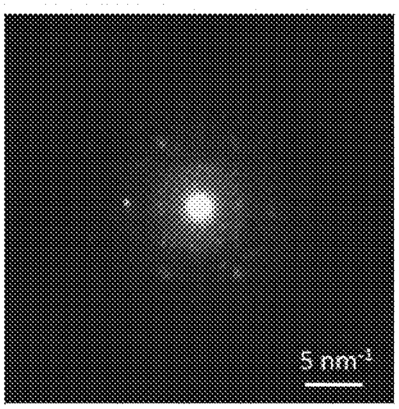

Furthermore, an electron diffraction pattern in which spots are arranged in an approximately regular hexagonal shape is observed in some cases as shown in FIG. 47C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 47D:
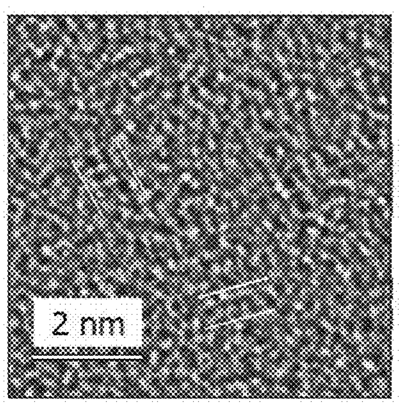

FIG. 47D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 47D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. An oxide semiconductor including a crystal part whose size is greater than 10 nm and less than or equal to 100 nm can be referred to as a microcrystalline oxide semiconductor (fine microcrystalline oxide semiconductor). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure between those of the nc-OS and the amorphous oxide semiconductor.

Figure 48A:
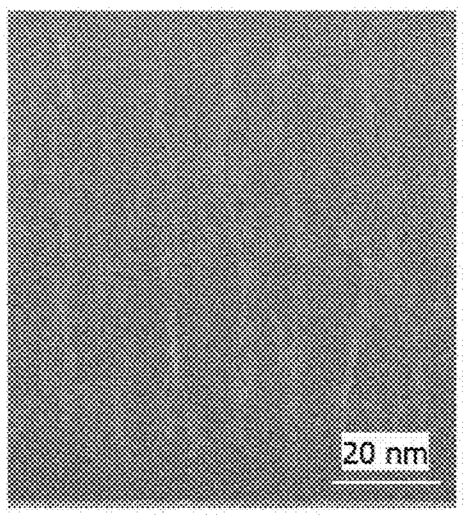
FIGS. 48A and 48B are cross-sectional TEM images of an a-like OS.
Figure 48B:
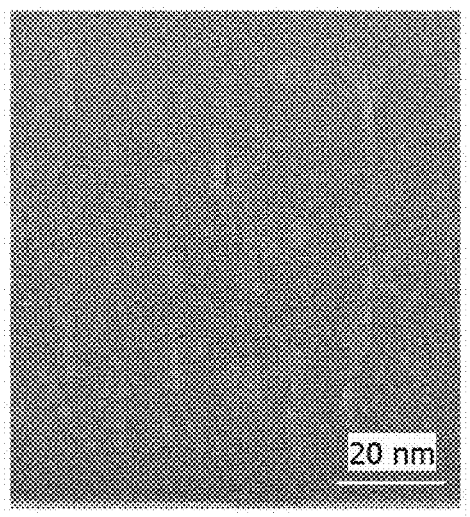

FIGS. 48A and 48B are high-resolution cross-sectional TEM images of an a-like OS. FIG. 48A is the high-resolution cross-sectional TEM image of the a-like OS at the start of the electron irradiation. FIG. 48B is the high-resolution cross-sectional TEM image of the a-like OS after the electron ($e^-$) irradiation at $4.3\times10^8$ $e^-/nm^2$. FIGS. 48A and 48B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 49:
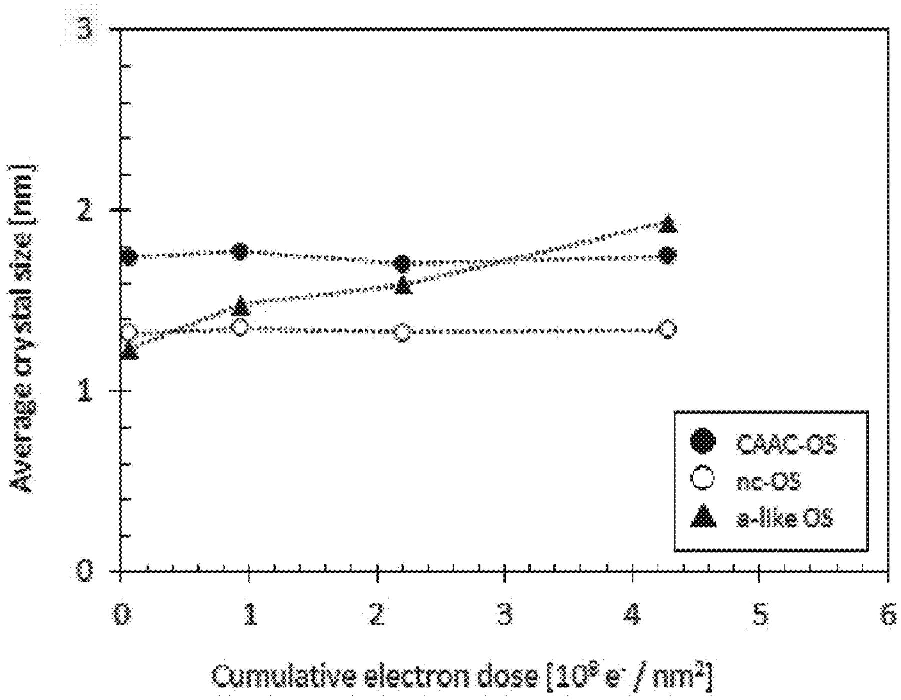
FIG. 49 shows a change in crystal part of an In—Ga—Zn oxide induced by electron irradiation.

FIG. 49 shows change in the average size of crystal parts (at 22 points to 30 points) in each sample. Note that the crystal part size corresponds to the length of a lattice fringe. FIG. 49 indicates that the crystal part size in the a-like OS increases with an increase in the cumulative electron dose in obtaining TEM images, for example. As shown in FIG. 49, a crystal part of approximately 1.2 nm (also referred to as an initial nucleus) at the start of TEM observation grows to a size of approximately 1.9 nm at a cumulative electron ($e^-$) dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. As shown in FIG. 49, the average size of crystal parts in an nc-OS and a CAAC-OS are approximately 1.3 nm and approximately 1.8 nm, respectively, regardless of the cumulative electron dose. For observation of electron beam irradiation and TEM, a Hitachi H-9000NAR transmission electron microscope was used. The conditions of electron beam irradiations are as follows: the accelerating voltage is 300 kV; the current density is $6.7\times10^5$ $e^-/(nm^2\cdot s)$; and the diameter of irradiation region is 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stack including two or more of an amorphous oxide semiconductor, an a-like OS, an nc-OS, and a CAAC-OS, for example.

<Carrier Density of Oxide Semiconductor>

The carrier density of an oxide semiconductor will be described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8\times10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1\times10^{5}$ cm$^{-3}$ and lower than $1\times10^{18}$ cm$^{-3}$, further preferably higher than or equal to $1\times10^{7}$ cm$^{-3}$ and lower than or equal to $1\times10^{17}$ cm$^{-3}$, still further preferably higher than or equal to $1\times10^{9}$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

<Reliability of OS Transistor>

Figure 50:
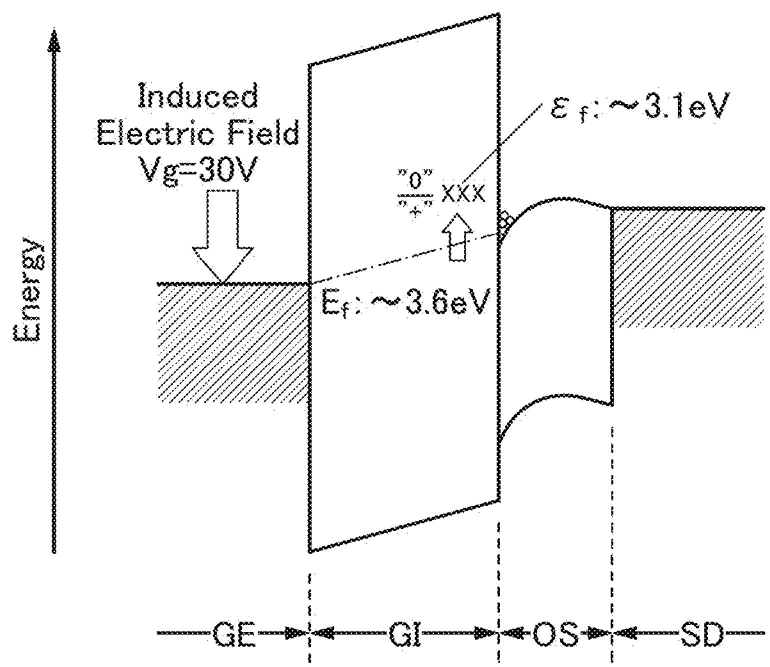
FIG. 50 illustrates an energy band structure.

The use of the substantially intrinsic oxide semiconductor may improve the reliability of a transistor. Here, the reason for the improvement in the reliability of a transistor including an oxide semiconductor in a semiconductor layer in which a channel is formed is described with reference to FIG. 50. FIG. 50 is an energy band structure diagram of a transistor including an oxide semiconductor in a semiconductor layer in which a channel is formed.

In FIG. 50, GE, GI, OS, and SD refer to a gate electrode, a gate insulating layer, an oxide semiconductor layer, and a source/drain electrode, respectively. In other words, FIG. 50 shows an example of energy bands of the gate electrode, the gate insulating layer, the oxide semiconductor layer, and the source/drain electrode in contact with the oxide semiconductor layer.

In FIG. 50, a silicon oxide and an In—Ga—Zn oxide are used as the gate insulating film and the oxide semiconductor layer, respectively. The transition level ($\in_f$) of a defect that might be formed in the gate insulating layer (silicon oxide) is assumed to be formed at a position approximately 3.1 eV away from the conduction band minimum of the gate insulating layer. Furthermore, the Fermi level ($E_f$) of the gate insulating layer at the interface between the oxide semiconductor layer and the gate insulating layer when the gate voltage ($V_g$) is 30 V is assumed to be formed at a position approximately 3.6 eV away from the conduction band minimum of the gate insulating layer. Note that the Fermi level of the gate insulating layer changes depending on the gate voltage. For example, the Fermi level ($E_f$) of the gate insulating layer at the interface between the oxide semiconductor layer and the gate insulating layer is lowered as the gate voltage is increased. A white circle and x in FIG. 50 represent an electron (carrier) and a defect state in the gate insulating layer, respectively.

As shown in FIG. 50, when thermal excitation of carriers occurs during the application of a gate voltage, the carriers are trapped by the defect states (x in the diagram) and the charge state of the defect states is changed from positive ("+") to neutral ("0"). In other words, when the value obtained by adding the thermal excitation energy to the Fermi level ($E_f$) of the gate insulating layer becomes greater than the transition level ($\in_f$) of the defect, the charge state of the defect states in the gate insulating layer is changed from positive to neutral, so that the threshold voltage of the transistor shifts in the positive direction.

When an oxide semiconductor layer with a different electron affinity is used, the Fermi level of the interface between the gate insulating layer and the oxide semiconductor layer might be changed. When an oxide semiconductor layer with a higher electron affinity is used, the conduction band minimum of the gate insulating layer becomes relatively high at the interface between the gate insulating layer and the oxide semiconductor layer or in the vicinity of the interface. In that case, the defect state (x in FIG. 50) which might be formed in the gate insulating layer also becomes relatively high, so that the energy difference between the Fermi level of the gate insulating layer and the Fermi level of the oxide semiconductor layer is increased. The increase in energy difference leads to a reduction in the amount of charge trapped in the gate insulating layer. For example, a change in the charge state of the defect states which might be formed in the gate insulating layer becomes smaller, so that a change in the threshold voltage of the transistor by gate bias temperature (GBT) stress can be reduced.

This embodiment can be implemented in an appropriate combination with any of the structures described in the other embodiments, examples, or the like.

Example 1

A top-gate OS transistor including a back gate electrode was manufactured, and the relationship between a voltage applied to the back gate electrode of the OS transistor (also referred to as the "back gate voltage" or "$V_{bg}$") and its $I_d$-$V_g$ characteristics was examined.

Figure 51A:
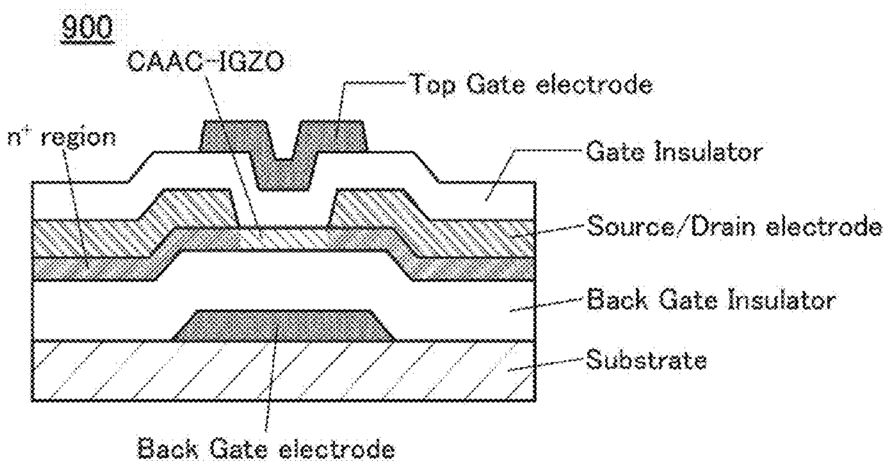
FIGS. 51A and 51B illustrate Example 1.

FIG. 51A shows a schematic cross-sectional view in the channel length direction of a transistor 900 used for the examination. Here, the outline of the manufacturing process of the transistor 900 is described below. First, a base insulating layer (not illustrated) was formed over a Si substrate, and a back gate electrode was formed thereover. Tungsten was used for the back gate electrode. Next, a stack of an aluminum oxide layer and a silicon oxide layer was formed as a back gate insulating layer over the back gate electrode. Specifically, a 20-nm-thick aluminum oxide layer was formed by an ALD method, and a 30-nm-thick silicon oxide layer was formed by a PECVD method. Next, a CAAC-IGZO (In—Ga—Zn oxide) layer was formed by a sputtering method as a semiconductor layer in which a channel was formed. Next, a source electrode, a drain electrode, a gate insulating layer, and a gate electrode (also referred to as a "top gate electrode") were formed, and a passivation layer (not illustrated) was formed lastly. The manufactured transistor 900 had a channel length L of 52 nm and a channel length W of 69 nm.

Figure 51B:
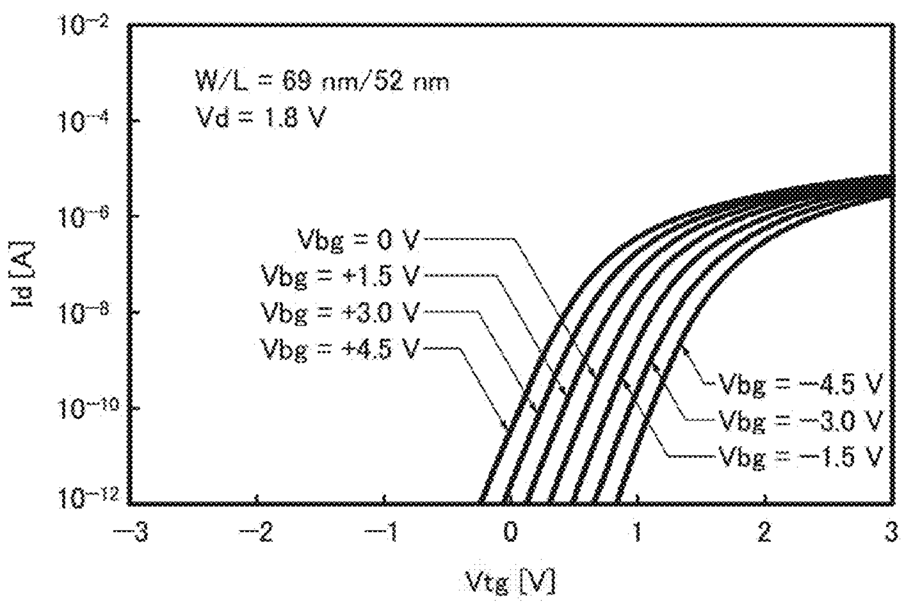

FIG. 51B shows $I_d$-$V_g$ characteristics of the transistor 900 in the case where the $V_d$ is 1.8 V. Note that "$V_d$" indicates a voltage applied to the drain electrode. The horizontal axis of FIG. 51B indicates a voltage applied to the top gate electrode (also referred to as a "top gate voltage" or "$V_{tg}$"). The vertical axis of FIG. 51B indicates a current that flows to the drain electrode (also referred to as a "drain current" or "$I_d$").

Hereinafter, as for the gate voltage $V_g$, the top gate voltage ($V_{tg}$) and the back gate voltage ($V_{bg}$) are distinguished from each other.

FIG. 51B shows that the $I_d$-$V_{tg}$ characteristics of the transistor 900 shift depending on $V_{bg}$. In the case where $V_{bg}$ is negatively biased, the $I_d$-$V_{tg}$ characteristics shift in the positive direction. In the case where $V_{bg}$ is positively biased, the $I_d$-$V_{tg}$ characteristics shift in the negative direction. Thus, it is found that $V_{th}$ of the transistor 900 can be controlled by the voltage applied to the back gate electrode.

Note that in this example, evaluation with an indicator $V_{sh}$ instead of $V_{th}$ was performed. $V_{sh}$ indicates $V_g$ at the time when $I_d$ is 1 pA. Both $V_{th}$ and $V_{sh}$ can be used to detect the shift in $I_d$-$V_g$ characteristics. With $V_{sh}$, especially the shift of the $I_d$-$V_{tg}$ characteristics in a subthreshold region can be detected. Thus, $V_{sh}$ is preferably used to evaluate a transistor included in a device which is required to have extremely small off-state current. Note that $V_{sh}$ is the abbreviation of "shift voltage".

Figure 52A:
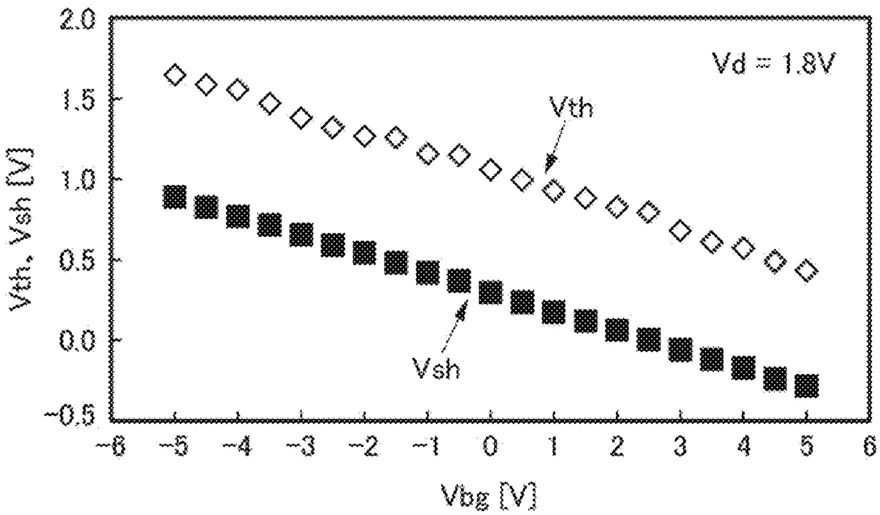
FIGS. 52A and 52B illustrate Example 1.

FIG. 52A shows $V_{bg}$ dependence of $V_{th}$ and $V_{sh}$. Both $V_{th}$ and $V_{sh}$ are negatively proportional to $V_{bg}$.

Next, the reliability evaluation was performed while a voltage was applied to the back gate electrode. OS transistors in each of which a channel was formed in a CAAC-IGZO semiconductor layer were used for the measurement. The channel width W of each of the OS transistors was 290 nm and the channel length L was 240 nm. The reliability evaluation was performed on two kinds of OS transistors: one including a back gate insulating layer (BG-GI) with an equivalent oxide thickness (EOT) of 12 nm and the other including a BG-GI with an EOT of 48 nm.

First, an initial measurement was performed on the two kinds of OS transistors to obtain reference $I_d$-$V_{tg}$ characteristics. Specifically, in an atmosphere at 125° C., $V_{bg}$ of the OS transistor with an EOT of 12 nm was set to −5 V and $V_{bg}$ of the OS transistor with the EOT of 48 nm was set to −11 V, and their $I_d$-$V_{tg}$ characteristics were measured. In the $I_d$-$V_{tg}$ characteristics measurement, $V_d$ was set to 3.3 V.

Next, the top gate electrodes, the source electrodes, and the drain electrodes were set to 0 V, and the voltages were held for 12 hours in the atmosphere at 125° C. while the $V_{bg}$ was applied. The $I_d$-$V_{tg}$ characteristics were measured every given time interval while the $V_{bg}$ was applied.

Figure 52B:
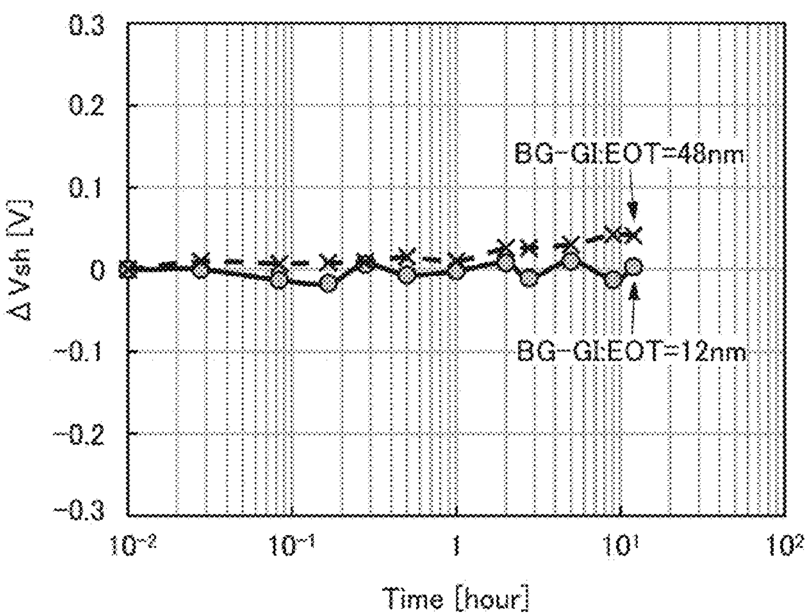

FIG. 52B shows $\Delta V_{sh}$ which is the amount of change in $V_{sh}$ measured every given period with $V_{sh}$ at an initial measurement used as a reference. After 12 hours, $\Delta V_{sh}$ of the OS transistor with the EOT of 12 nm was 0.003 V and that of the OS transistor with the EOT of 48 nm was 0.04 V. $\Delta V_{sh}$ of each of the OS transistors was small, which indicates that an OS transistor has stable electrical characteristics even when a back gate voltage is continuously applied.

The above results show that $V_{th}$ of a transistor can be controlled by $V_{bg}$.

Example 2

The following experiment was performed: a charge trap layer (also referred to as a "CT layer") serving as electron traps was formed on a back gate electrode side of a transistor and $V_{th}$ was controlled by charge injection into the CT layer.

$V_{th}$ can be controlled by the CT layer as follows: a negative electric field is generated by an electron trapped in the CT layer and the negative electric field exert an influence on a channel formation region. Thus, $V_{th}$ is shifted in the positive direction. Note that the CT layer may be provided on a back gate side or a top gate side. Furthermore, $V_{th}$ control using the CT layer does not require a power source for controlling $V_{th}$ in principle except when electrons are trapped in the CT layer.

Figure 53A:
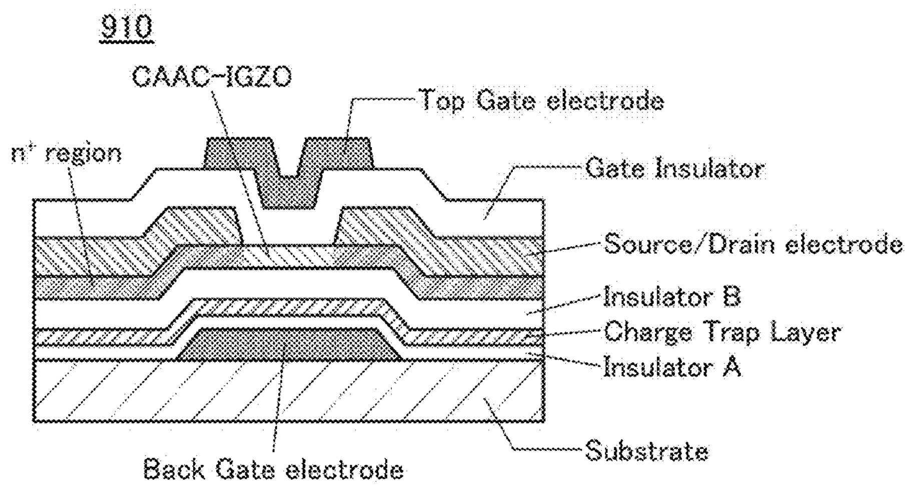
FIGS. 53A and 53B illustrate Example 2.

FIG. 53A shows a schematic cross-sectional view of a transistor 910 used for the experiment in the channel length direction. The transistor 910 includes a CT layer in an insulating layer between a back gate electrode and a CAAC-IGZO layer.

Here, the outline of the manufacturing process of the transistor 910 is described below. First, a base insulating layer (not illustrated) was formed over a Si substrate, and a back gate electrode was formed thereover. Tungsten was used for the back gate electrode. Next, a 10-nm-thick silicon oxide layer was formed over the back gate electrode as an insulating layer A by a PECVD method. Next, a 20-nm-thick HfOx layer to be a CT layer was formed over the insulating layer A by an ALD method, and a 30-nm-thick silicon oxide layer was formed over the CT layer as an insulating layer B by a PECVD method. Next, a CAAC-IGZO layer was formed by a sputtering method as a semiconductor layer in which a channel was formed. Next, a source electrode, a drain electrode, a gate insulating layer, and a top gate electrode were formed, and a passivation layer (not illustrated) was formed lastly. The manufactured transistor 910 had a channel length L of 0.19 μm and a channel length W of 0.26 μm.

Figure 53B:
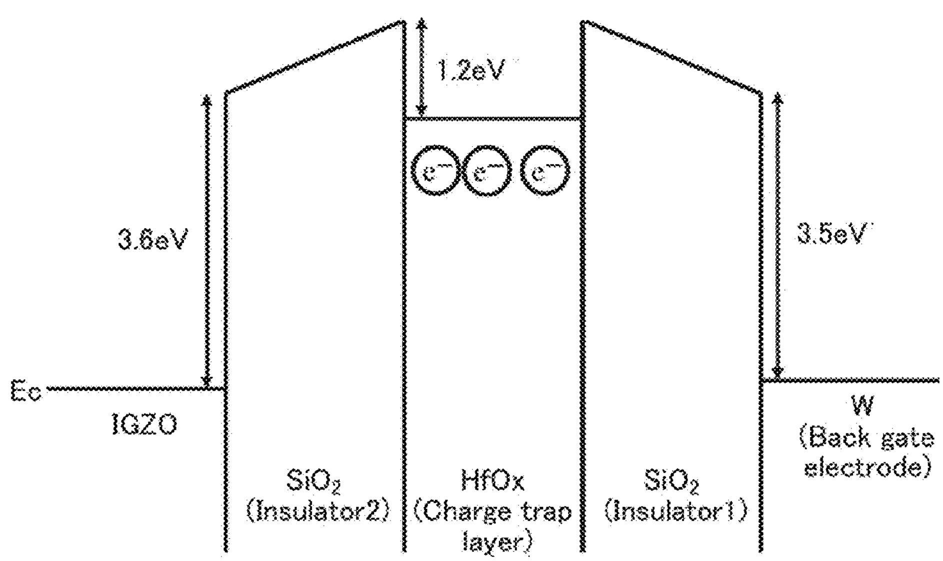

To trap electrons in the CT layer, materials need to be selected so that the valence band ($E_c$) of the CT layer is lower than the valence bands of the insulating layers over and under the CT layer. FIG. 53B shows a band diagram between the back gate electrode and the CAAC-IGZO layer. In this example, the HfOx layer was used as the CT layer. In addition, the oxide silicon layers were used as the insulating layer A over the CT layer and the insulating layer B under the CT layer. Accordingly, the difference between $E_c$s is 1.2 eV. Because of this difference between $E_c$s, electrons injected into the CT layer can be held stably. Note that the injection conditions of charge into the CT layer can be changed by changing the thicknesses of the two insulating layers (the insulating layers A and B) between which the CT layer is positioned or a material which is used for the CT layer.

Figure 54A:
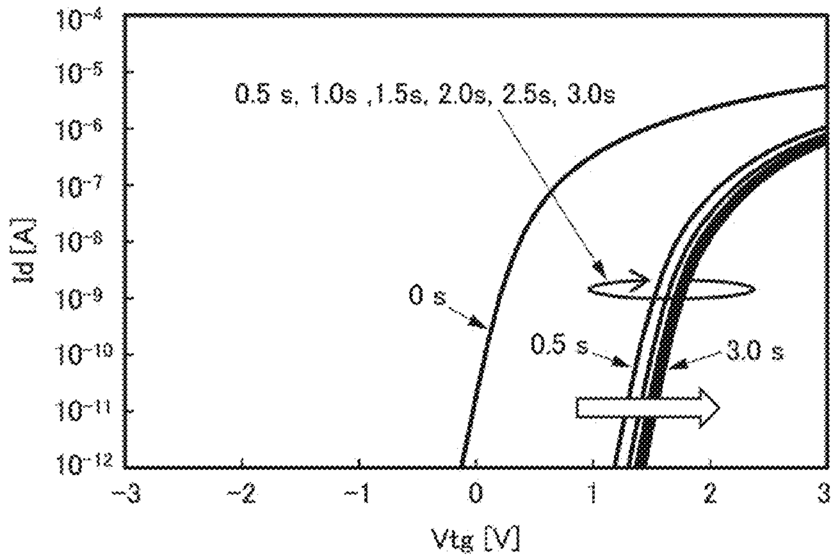
FIGS. 54A and 54B illustrate Example 2.

The dependence of the $I_d$-$V_{tg}$ characteristics of the transistor 910 on the time for injecting charge to the CT layer is shown in FIG. 54A. Charge was injected to the CT layer under a room temperature at $V_{bg}$ of +38 V. The $I_d$-$V_{tg}$ characteristics were measured every 0.5 seconds until the accumulation of the electron injection time became 3 seconds. FIG. 54A shows that the $I_d$-$V_{tg}$ characteristics of the transistor 910 shift in the positive direction because of the charge injection.

Figure 54B:
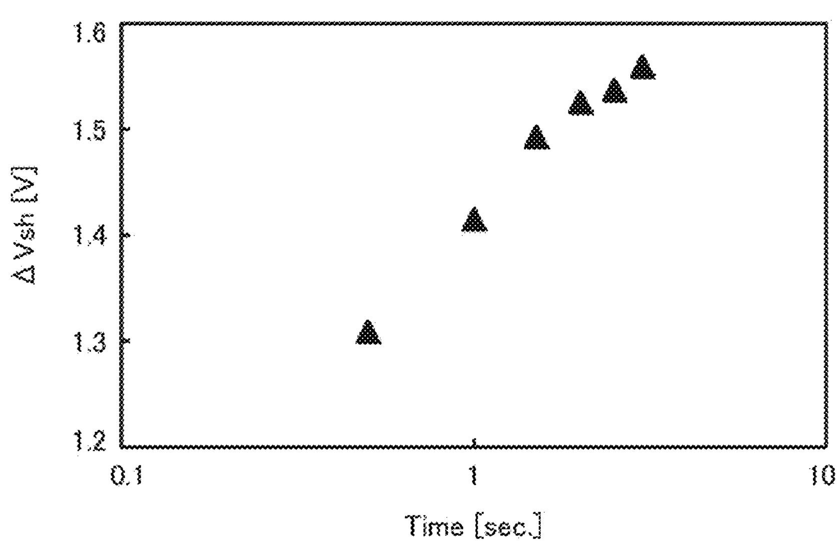

FIG. 54B shows the charge injection time dependence of the amount of change in $V_{sh}$ ($\Delta V_{sh}$) in FIG. 54A. Here, $V_{sh}$ represents $V_{tg}$ at the time when $I_d$ reaches 1 pA. It is found from FIG. 54B that $\Delta V_{sh}$ is proportional to a logarithm of the charge injection time. Hence, the amount of charge injected to the CT layer is probably proportional to the logarithm of the injection time.

Next, the variation in $V_{th}$ control in the case where charge was injected to the CT layers of a plurality of the transistors 910 under the same condition was examined. Charge was injected at a room temperature under the conditions where $V_{bg}$ was +38 V and the charge injection time was 3 seconds. The measurement was performed on 56 transistors 910.

Figure 55A:
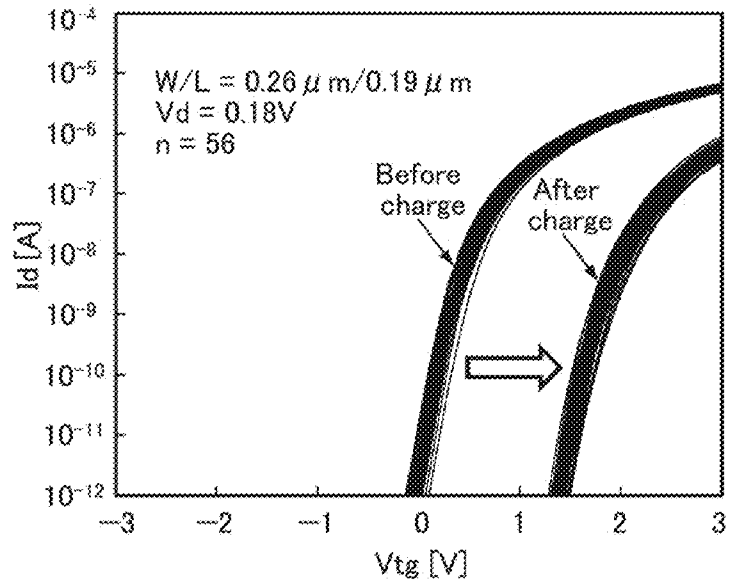
FIGS. 55A and 55B illustrate Example 2.

FIG. 55A shows $I_d$-$V_{tg}$ characteristics of the 56 transistors 910 before and after the charge injection. The variation in $I_d$-$V_{tg}$ characteristics before the charge injection is not largely different from that after the charge injection.

Figure 55B:
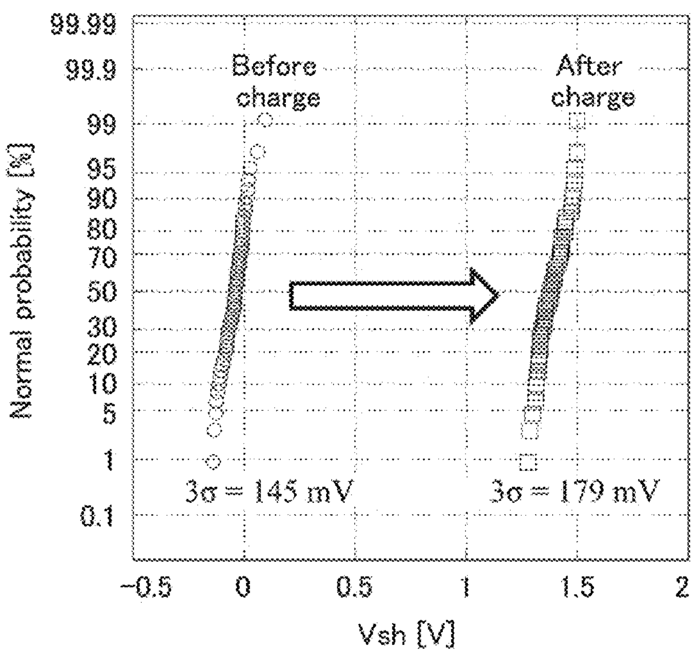
Figure 56:
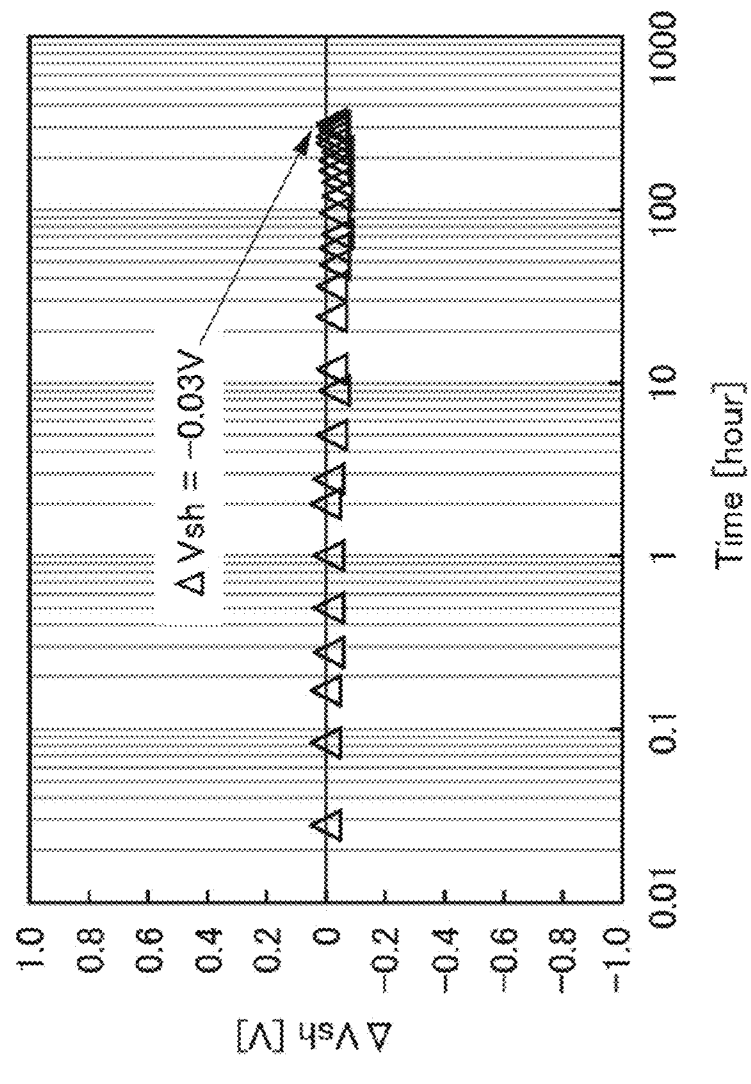
FIG. 56 illustrates Example 2.

FIG. 55B shows the normal probability distribution of $V_{sh}$ of the 56 transistors 910 before and after the charge injection. The variation in $V_{sh}$ before the charge injection is not largely different from that after the charge injection. Note that 3σ of $V_{sh}$ before the charge injection was 145 mV, and 3σ of $V_{sh}$ after the charge injection was 179 mV Next, the temperature stability of $V_{sh}$ after the charge injection was evaluated. Specifically, variation in $V_{sh}$ with time in the case where the temperature of the substrate on which the transistor 910 was provided was 150° C. was evaluated. FIG. 56 shows variation in $\Delta V_{sh}$ with time.

Hereinafter, the description of the measurement procedure is described. First, at a room temperature, +40 V was applied as $V_{bg}$ of the transistor 910 for 0.2 seconds to inject charge to the CT layer. In this transistor, the $V_{sh}$ was shifted from 0 V to 1.3 V because of the charge injection to the CT layer.

Next, a stage on which the sample (the substrate on which the transistor 910 was provided) was placed was heated so that the temperature rise of the sample became 150° C. It took approximately 5 minutes until the temperature rise of the sample was stabilized at 150° C.

Next, the $I_d$-$V_{tg}$ characteristics were measured as an initial measurement while the sample temperature was kept at 150° C. The $I_d$-$V_{tg}$ characteristics were measured at $V_d$ of 1.8 V while $V_{tg}$ was swept from −3 V to 3 V. $V_{sh}$ at the initial measurement was 0.82 V. The vertical axis of FIG. 56 indicates the amount of variation in $V_{sh}$ from 0.82 V.

Next, the $I_d$-$V_g$ characteristics were measured every given period while the sample temperature was kept at 150° C. The $I_d$-$V_g$ measurement at regular intervals was performed under the same conditions as those of the initial measurement. In a period where the $I_d$-$V_g$ measurement was not performed (a period in which only heating is performed), all of $V_{tg}$, $V_{bg}$, $V_d$, and $V_s$ (a voltage applied to the source electrode) were set to 0 V.

After the sample temperature was kept at 150° C. for 300 hours, $\Delta V_{sh}$ was −0.03 V. It is thus found that the charge injected to the CT layer was able to be held stably.

It was also found that the temperature stability of $V_{sh}$ controlled by the charge injection to the CT layer was very favorable. The above results reveal that $V_{th}$ of a transistor can be controlled by the charge injection to the CT layer.

This application is based on Japanese Patent Application serial no. 2015-257590 filed with Japan Patent Office on Dec. 29, 2015, and Japanese Patent Application serial no. 2016-200053 filed with Japan Patent Office on Oct. 11, 2016, the entire contents of which are hereby incorporated by reference.

What is claimed is:

1. A semiconductor device comprising:

a potential generating portion;

a memory portion electrically connected to the potential generating portion, the memory portion comprising:

a transistor comprising a first gate and a second gate; and a capacitor electrically connected to the transistor;

a potential comparing portion electrically connected to the memory portion;

a level shifter electrically connected to the potential generating portion and the memory portion through a first node, and the potential generating portion and the potential comparing portion through a second node; and a control portion electrically connected to the potential comparing portion, wherein the potential generating portion is configured to supply a potential to the second gate, wherein the potential comparing portion is configured to compare a potential of the second gate and a reference potential, and wherein the control portion is configured to control the potential supplied by the potential generating portion in accordance with a signal output from the potential comparing portion.

2. The semiconductor device according to claim 1, wherein the reference potential is supplied by the potential generating portion.

3. The semiconductor device according to claim 1, wherein the memory portion is configured to turn on the transistor and hold charge of the capacitor.

4. The semiconductor device according to claim 1, wherein the first gate and the second gate overlap with each other with a semiconductor layer therebetween.

5. The semiconductor device according to claim 4, wherein the semiconductor layer comprises an oxide semiconductor.

6. The semiconductor device according to claim 1, further comprising:

a potential hold portion between the potential generating portion and the memory portion; and a back gate control signal generating portion electrically connected to the control portion, wherein the level shifter is electrically connected to the back gate control signal generating portion.

7. The semiconductor device according to claim 1, wherein the potential is configured to be supplied by the potential generating portion when an increase of the potential of the second gate is detected by the potential comparing portion.

8. A semiconductor device comprising:

a potential generating portion;

a memory portion electrically connected to the potential generating portion, the memory portion comprising a transistor comprising a first gate and a second gate;

a potential comparing portion electrically connected to the memory portion; and a level shifter electrically connected to the potential generating portion and the memory portion through a first node, and the potential generating portion and the potential comparing portion through a second node, wherein the potential generating portion is configured to supply a potential to the second gate, wherein the potential comparing portion is configured to compare a potential of the second gate and a reference potential, and wherein the semiconductor device is configured to control the potential supplied by the potential generating portion in accordance with the comparison result.

9. The semiconductor device according to claim 8, wherein the reference potential is supplied by the potential generating portion.

10. The semiconductor device according to claim 8, wherein the first gate and the second gate overlap with each other with a semiconductor layer therebetween.

11. The semiconductor device according to claim 10, wherein the semiconductor layer comprises an oxide semiconductor.

12. The semiconductor device according to claim 8, further comprising a potential hold portion between the potential generating portion and the memory portion.

13. The semiconductor device according to claim 8, wherein the potential is configured to be supplied by the potential generating portion when an increase of the potential of the second gate is detected by the potential comparing portion.

14. A semiconductor device comprising:

a first circuit;

a memory portion electrically connected to the first circuit, the memory portion comprising a transistor comprising a first gate and a second gate;

a second circuit electrically connected to the memory portion; and a level shifter electrically connected to the first circuit and the memory portion through a first node, and the first circuit and the second circuit through a second node, wherein the first circuit is configured to supply a potential to the second gate, wherein the second circuit is configured to compare a potential of the second gate and a reference potential, and wherein the semiconductor device is configured to control the potential supplied by the first circuit in accordance with the comparison result.

15. The semiconductor device according to claim 14, wherein the reference potential is supplied by the first circuit.

16. The semiconductor device according to claim 14, wherein the first gate and the second gate overlap with each other with a semiconductor layer therebetween.

17. The semiconductor device according to claim 16, wherein the semiconductor layer comprises an oxide semiconductor.

18. The semiconductor device according to claim 14, further comprising a potential hold portion between the first circuit and the memory portion.

19. The semiconductor device according to claim 14, wherein the potential is configured to be supplied by the first circuit when an increase of the potential of the second gate is detected by the second circuit.

* * * * *